United States Patent [19]
Takemae et al.

[11] Patent Number: 6,009,039
[45] Date of Patent: *Dec. 28, 1999

[54] SEMICONDUCTOR DEVICE

[75] Inventors: Yoshihiro Takemae; Masao Taguchi; Yukinori Kodama; Makoto Yanagisawa; Takaaki Suzuki; Junji Ogawa; Atsushi Hatakeyama; Hirohiko Mochizuki; Hideaki Kawai, all of Kawasaki, Japan

[73] Assignee: Fujitsu Limited, Kawasaki, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 09/014,976

[22] Filed: Jan. 28, 1998

Related U.S. Application Data

[62] Division of application No. 08/892,066, Jul. 14, 1997, Pat. No. 5,767,712, which is a continuation of application No. 08/768,534, Dec. 18, 1996, abandoned, which is a continuation of application No. 08/385,704, Feb. 8, 1995, abandoned.

[30] Foreign Application Priority Data

| Feb. 17, 1994 | [JP] | Japan | 6-020173 |
| Feb. 24, 1994 | [JP] | Japan | 6-025808 |
| Mar. 7, 1994 | [JP] | Japan | 6-035131 |
| Mar. 18, 1994 | [JP] | Japan | 6-049569 |
| May 25, 1994 | [JP] | Japan | 6-110638 |

[51] Int. Cl.$^6$ .............. G11C 8/00; G11C 16/04
[52] U.S. Cl. .............. 365/233; 365/230.08; 365/189.05; 365/189.08
[58] Field of Search .................. 365/233, 233.5, 365/230.08, 189.05, 189.08, 203

[56] References Cited

U.S. PATENT DOCUMENTS

| 3,024,417 | 1/1962 | Secretan | 327/153 |
| 4,604,582 | 8/1986 | Strenkowski et al. | 327/147 |
| 4,613,773 | 9/1986 | Koike | 327/298 |
| 4,623,805 | 11/1986 | Flora et al. | 327/152 |
| 4,637,018 | 1/1987 | Flora et al. | 327/152 |
| 5,086,236 | 2/1992 | Feemster | 327/144 |
| 5,157,276 | 10/1992 | Metz | 327/152 |
| 5,389,830 | 2/1995 | Buckingham et al. | 327/291 |
| 5,740,115 | 4/1998 | Ishibashi et al. | 365/203 |
| 5,767,712 | 6/1998 | Takemae et al. | 327/152 |

*Primary Examiner*—Trong Phan
*Attorney, Agent, or Firm*—Armstrong, Westeman, Hattori, McLeland

[57] ABSTRACT

A semiconductor device includes a one-shot pulse generating circuit that generates a one-shot pulse having a predetermined pulse width at a rise or fall timing of a first clock signal, a cycle time measuring circuit that measures a cycle time of the first clock signal from the one-shot pulse output from the one-shot pulse generating circuit, an internal clock generating circuit that generates a second clock signal based on the cycle time measured by the cycle time measuring circuit and the one-shot pulse output from the one-shot pulse generating circuit. The second clock signal has a cycle time identical to the first clock signal and has a rise or fall timing which is advanced by a specific time than that of the first clock signal, and the specific time is obtained by subtracting the cycle time of the first clock signal from a predetermined time, and a data output circuit that outputs data after a predetermined delay time from the rise or fall timing of the second clock signal.

9 Claims, 51 Drawing Sheets

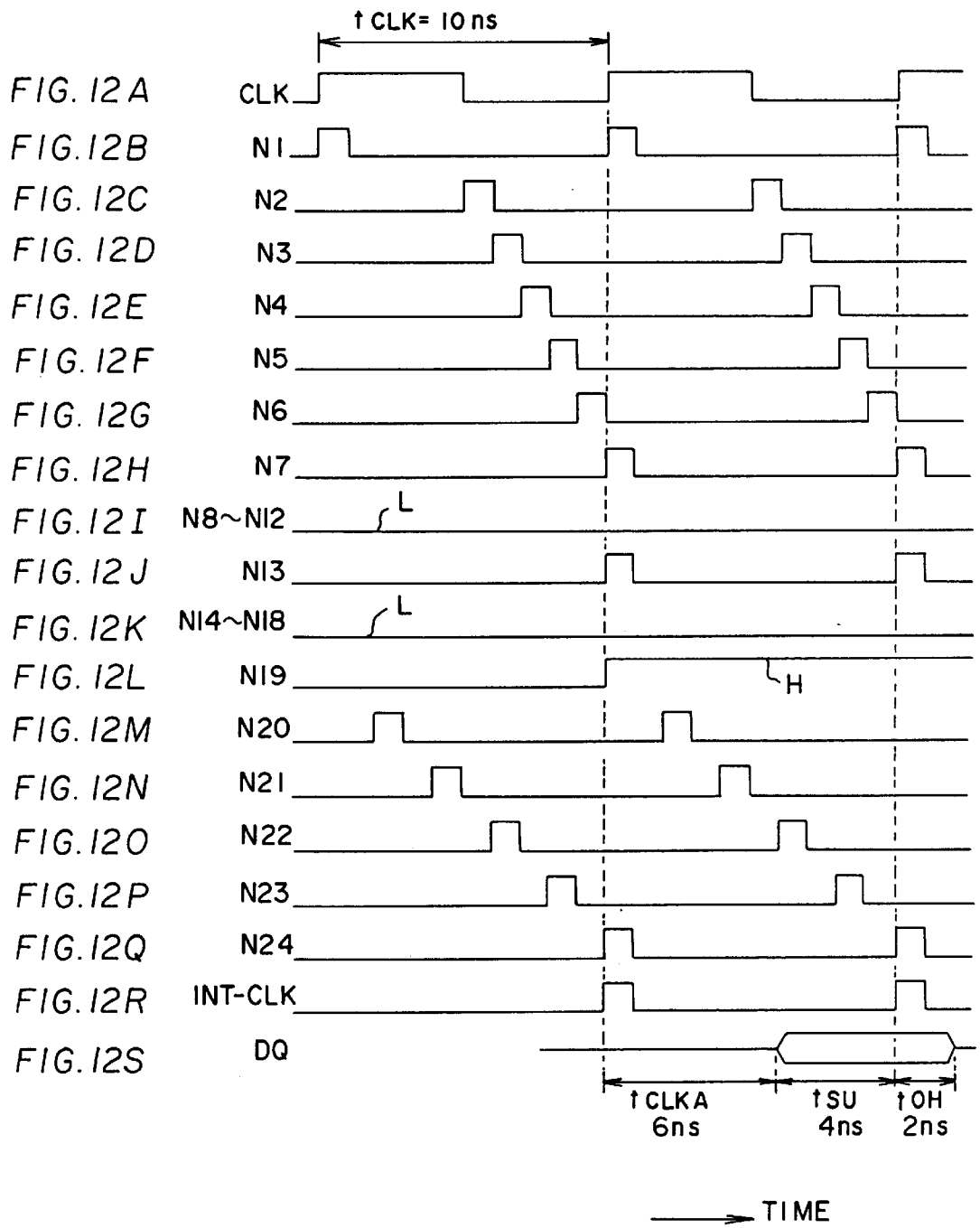

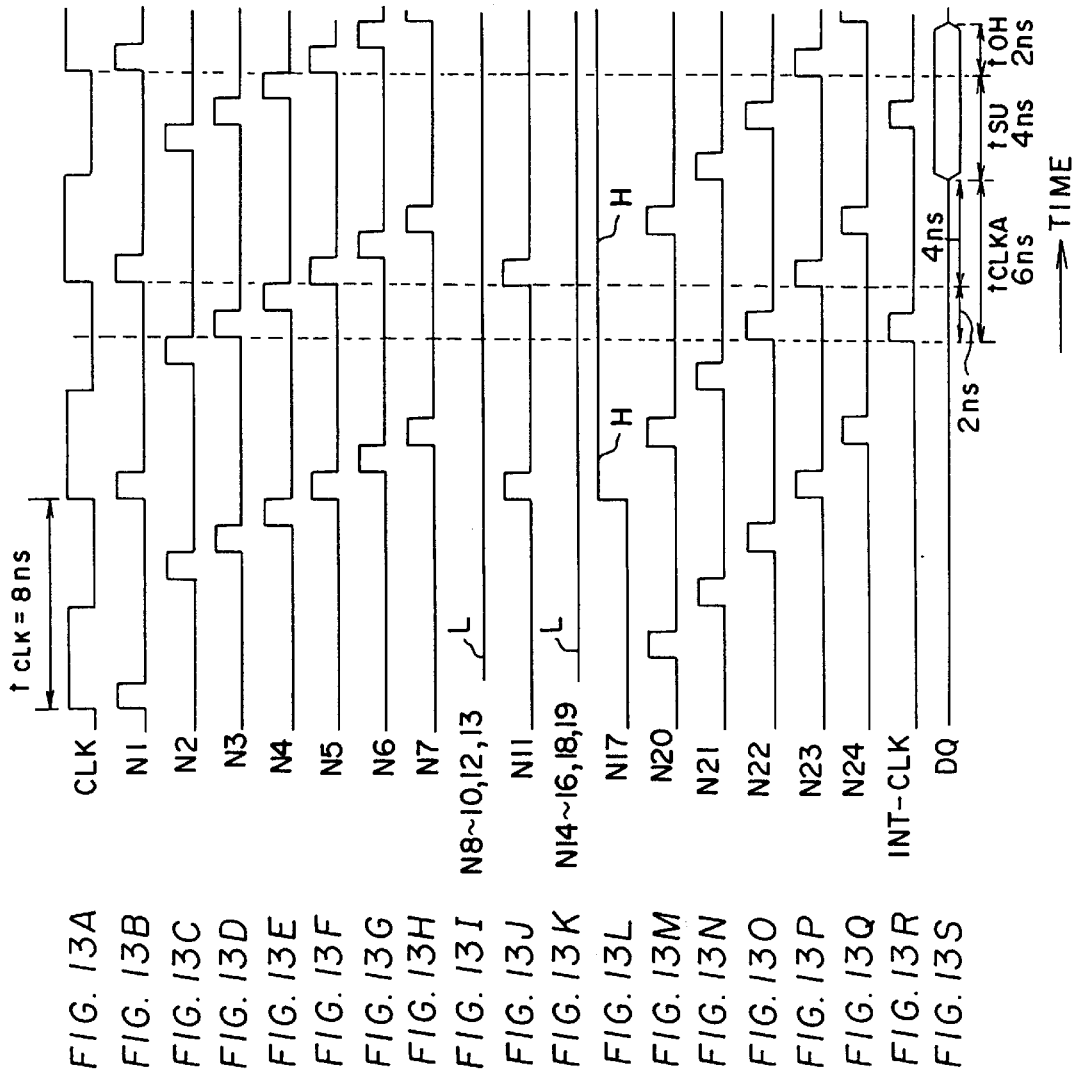

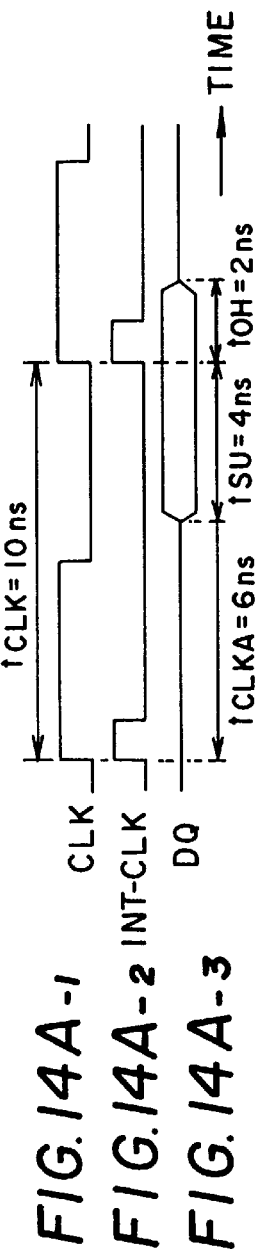
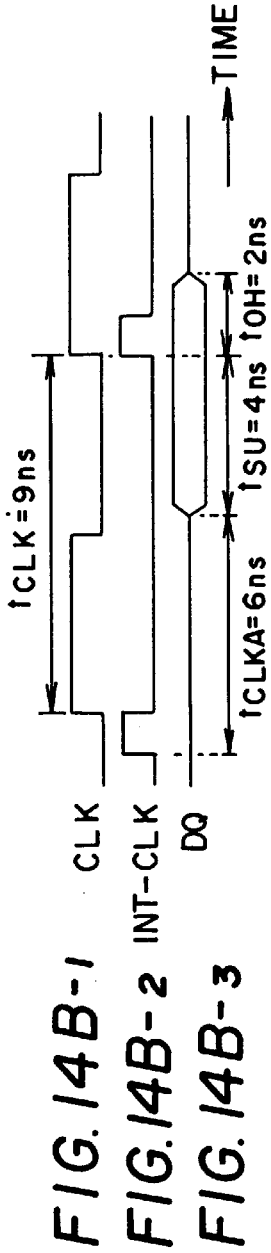
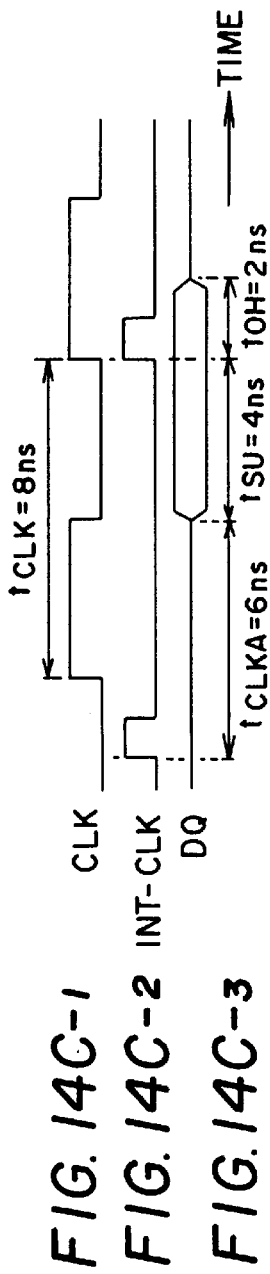

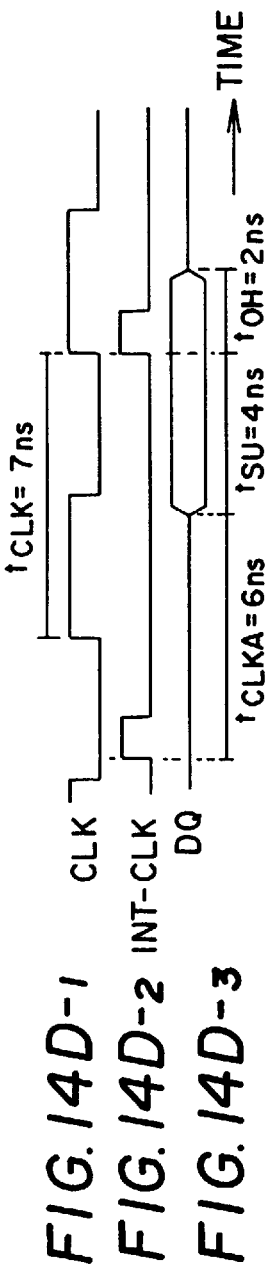
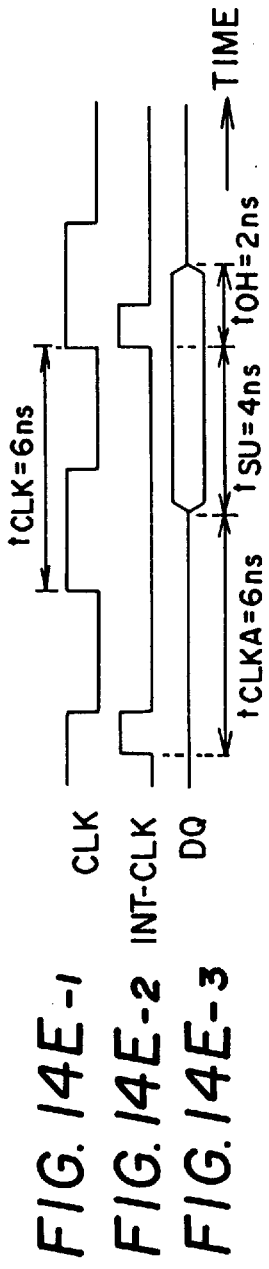
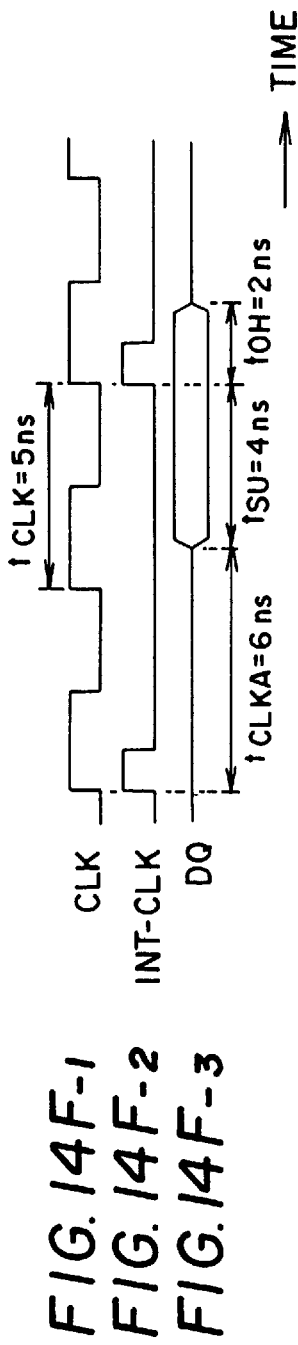
FIG. 14D-1, FIG. 14D-2, FIG. 14D-3
FIG. 14E-1, FIG. 14E-2, FIG. 14E-3
FIG. 14F-1, FIG. 14F-2, FIG. 14F-3

FIG. 31A CLK
FIG. 31B CS
FIG. 31C RAS, CAS, WE, DQM, An~A1

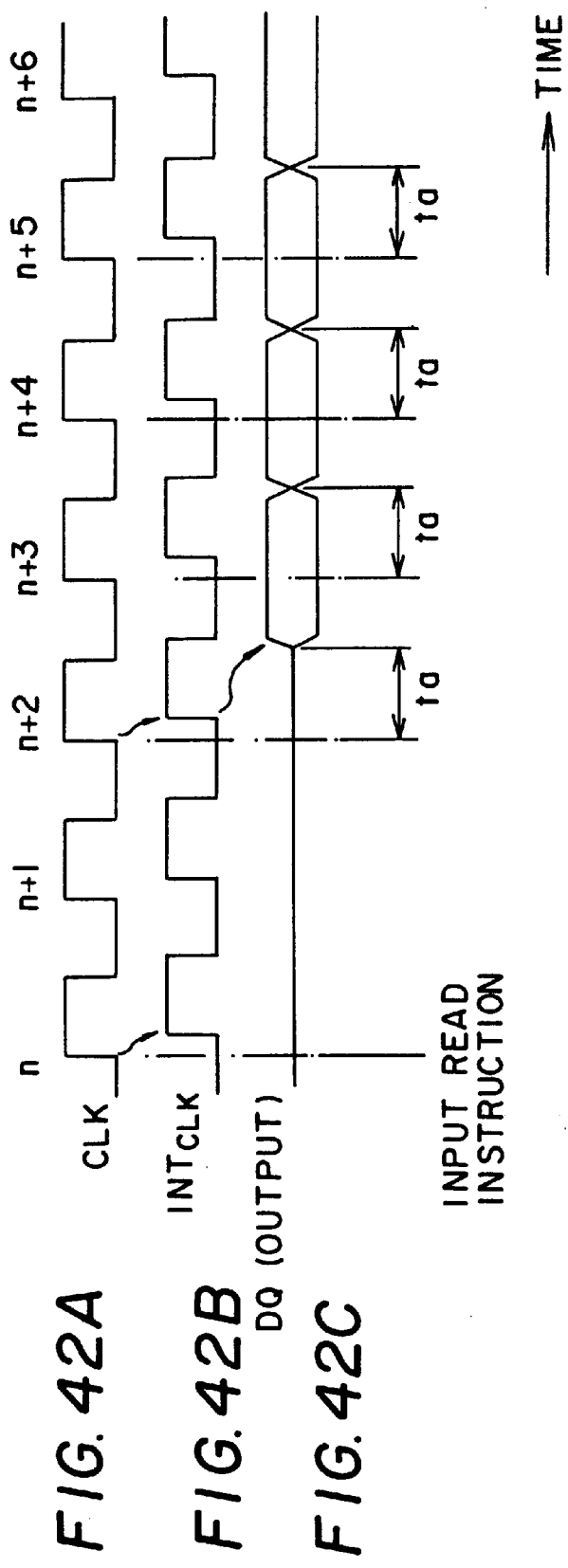

SEMICONDUCTOR DEVICE

This application is a Divisional application of U.S. Ser. No. 08/892,066, filed Jul. 14, 1997, now U.S. Pat. No. 5,767,712, which is a Continuation application of U.S. Ser. No. 08/768,534, filed Dec. 18, 1996, now abandoned, which is in turn a Continuation application of U.S. Ser. No. 08/385,704, filed Feb. 8, 1995, now abandoned.

BACKGROUND OF THE INVENTION

The present invention generally relates to semiconductor devices, and more particularly to a semiconductor device such as a synchronous semiconductor device which operates in synchronism with a clock signal that is supplied from the outside.

Conventionally, as known semiconductor devices which operate in synchronism with a clock signal that is supplied from the outside, there are microprocessor units (MPUs) and synchronous dynamic random access memories (SDRAMs).

FIG. 1 shows a part of an electronic equipment using a MPU and a SDRAM. A MPU 1 and a SDRAM 2 are coupled via a clock signal supply line 3 and a data bus 4. The clock signal supply line 3 supplies a clock signal CLK to the MPU 1 and the SDRAM 2. The data bus 4 forms a transmission line for a data DQ. The MPU 1 has a clock signal input terminal 5 and a data input/output terminal 7. The SDRAM 2 has a clock signal input terminal 6 and a data input/output terminal 8.

FIG. 2 is a timing chart for explaining the operation of the electronic equipment shown in FIG. 1 when the SDRAM 2 outputs data. In FIG. 2, the clock signal CLK has a cycle time $t_{CLK}$ of 10 ns, and the data DQ is the data that is output from the SDRAM 2.

This SDRAM 2 has a clock signal access time $t_{CLKA}$ of 6 ns, and an output hold time $t_{OH}$ of 2 ns. The clock signal access time $t_{CLKA}$ is a delay time from a rise of the clock signal CLK rises to a time when the data DQ is output. On the other hand, the output hold time $t_{OH}$ is a time from a rise of the clock signal CLK to a time when holding of the output data DQ ends.

Accordingly, in this case, the cycle time $t_{CLK}$ of the clock signal CLK is 10 ns and the data transfer speed is 100 MHz, but a set up time $t_{SU}$ can be set to 4 ns. This set up time $t_{SU}$ is a time in which the data DQ is settled in advance before the rise of the clock signal CLK.

However, according to the SDRAM 2 described above, the set up time $t_{SU}$ becomes short if the cycle time $t_{CLK}$ of the clock signal CLK is made shorter than 10 ns. Further, in some cases, it becomes impossible to secure a sufficiently long set up time $t_{SU}$.

For example, FIG. 20 is a timing chart showing a case where the cycle time $t_{CLK}$ of the clock signal CLK is set to 6 ns and the data transfer speed is 167 MHz. In this case, the set up time $t_{SU}$ cannot be secured at all. Hence, at the receiving end such as the MPU 1 shown in FIG. 1, for example, it becomes impossible to input the data DQ output from the SDRAM 2.

In this case, it is conceivable to provide a built-in phase locked loop (PLL) circuit so that the same time can be secured as the set up time $t_{SU}$ for the output data even if the cycle times $t_{CLK}$ of the clock signals CLK differ when controlling the output timing of the data DQ, as long as the difference in the cycle times $t_{CLK}$ of the clock signals CLK is within a predetermined range.

However, since the power consumption of the PLL circuit is large, the PLL circuit is unsuited for use for a semiconductor device such as the SDRAM 2 which requires the power consumption to be minimized.

SUMMARY OF THE INVENTION

Accordingly, it is a general object of the present invention to provide a novel and useful semiconductor device in which the problems described above are eliminated.

Another and more specific object of the present invention is to provide a semiconductor device comprising a one-shot pulse generating circuit generating a one-shot pulse having a predetermined pulse width at a rise or fall timing of a first clock signal, a cycle time measuring circuit, coupled to the one-shot pulse generating circuit, measuring a cycle time of the first clock signal from the one-shot pulse output from the one-shot pulse generating circuit, an internal clock generating circuit, coupled to the cycle time measuring circuit, generating a second clock signal based on the cycle time measured by the cycle time measuring circuit and the one-shot pulse output from the one-shot pulse generating circuit, where the second clock signal has a cycle time identical to the first clock signal and has a rise or fall timing which is advanced by a specific time than that of the first clock signal, and the specific time is obtained by subtracting the cycle time of the first clock signal from a predetermined time, and a data output circuit, coupled to the internal clock generating circuit, outputting data after a predetermined delay time from the rise or fall timing of the second clock signal. According to the semiconductor device of the present invention, a cycle time of an external clock signal is measured using delay circuits. In addition, an internal clock signal having the same cycle time as the external clock signal and having a rise or fall timing that is (a predetermined time)−(cycle time of the external clock signal) advanced compared to the external clock signal is supplied to a data output circuit. As a result, even if the cycle time of the external clock signals differ, it is possible to secure the same set up time as long as the difference of the cycle time is within a predetermined range. Therefore, it is possible to apply the present invention to electronic equipments having different data transfer speeds, and the circuit design flexibility is improved.

Still another object of the present invention is to provide a synchronous semiconductor memory device which inputs an address signal and control signals in synchronism with a clock signal, comprising a plurality of input circuits respectively having a differential amplifier circuit so that differential amplifier circuits of the input circuits are respectively provided with respect to the control signals other than a chip select and to each of bits of the address signal, where each of the differential amplifier circuits are controlled to one of active and inactive states in response to an activation signal, and an activation circuit, coupled to the input circuits, outputting to the differential amplifier circuits the activation signal that undergoes a level change depending on a level change of the chip select signal and makes a transition to an active level when the chip select signal undergoes a transition to an active level. According to the synchronous semiconductor memory device of the present invention, the input circuits which are provided with respect to the signals other than the chip select signal become active only for a predetermined delay time from a time when the level of the chip select signal becomes high after a predetermined delay time elapses from a time when the level of the chip select signal becomes low. In other words, the input circuits which are provided with respect to signals other than the chip select signal become active only during a time which is equal to or is approximately the same as the time in which the chip select signal is active. The input circuits which are provided with respect to the signals other than the chip select signal are inactive during other times. As a result, because the input circuits which are provided with respect to the signals other than the chip select signal are not constantly active, it is possible to effectively reduce the power consumption of the input circuit part.

A further object of the present invention is to provide a synchronous semiconductor memory device which inputs an address signal and control signals in synchronism with a clock signal, comprising a plurality of input circuits respectively having a differential amplifier circuit so that differential amplifier circuits of the input circuits are respectively provided with respect to the control signals other than a chip select and to each of bits of the address signal, where each of the differential amplifier circuits are controlled to one of active and inactive states in response to an activation signal, and an activation circuit, coupled to the input circuits, outputting to the differential amplifier circuits the activation signal that undergoes a level change depending on a level change of the chip select signal and makes a transition to an active level when the chip select signal undergoes a transition to an active level or, outputting to the differential amplifier circuits the activation signal that has the active level. According to the synchronous semiconductor memory device of the present invention, the input circuits which are provided with respect to the signals other than the chip select signal become active only for a predetermined delay time from a time when the level of the chip select signal becomes high after a predetermined delay time elapses from a time when the level of the chip select signal becomes low. In other words, the input circuits which are provided with respect to signals other than the chip select signal become active only during a time which is equal to or is approximately the same as the time in which the chip select signal is active. The input circuits which are provided with respect to the signals other than the chip select signal are inactive during other times. As a result, because the input circuits which are provided with respect to the signals other than the chip select signal are not constantly active, it is possible to effectively reduce the power consumption of the input circuit part.

Another object of the present invention is to provide a synchronous semiconductor memory device which inputs an address signal and control signals in synchronism with a clock signal, comprising a plurality of input circuits respectively having a differential amplifier circuit so that differential amplifier circuits of the input circuits are respectively provided with respect to the control signals other than a chip select and to each of bits of the address signal, where each of the differential amplifier circuits are controlled to one of active and inactive states in response to an activation signal, and an activation circuit, coupled to the input circuits, outputting to the differential amplifier circuits the activation signal that undergoes a level change depending on a level change of the chip select signal and makes a transition to an active level when the chip select signal undergoes a transition to an active level until an active command instructing activation of a memory cell region is input, where the activation signal outputs to the differential amplifier circuits the activation signal having the active level until a precharge command instructing precharge of the memory region is input after the active command is input. According to the synchronous semiconductor memory device of the present invention, the differential amplifier circuits forming the initial stage circuits of the input circuits which are provided with respect to signals other than the chip select signal become active only for a time from the time when the chip select signal undergoes a transition to the low level to a time when the precharge command is input, when inputting the active command. The differential amplifier circuits forming the initial stage circuits of the input circuits which are provided with respect to the signals other than the chip select signal are inactive during other times. As a result, because the differential amplifier circuits forming the initial stage circuits of the input circuits which are provided with respect to the signals other than the chip select signal are not constantly active, it is possible to effectively reduce the power consumption of the input circuit part.

Still another object of the present invention is to provide a semiconductor integrated circuit comprising a first input circuit amplifying a clock signal, a second input circuit amplifying an information signal, and a latch circuit, coupled to the first and second input circuits, latching the information signal output from the second input circuit at a rise or fall timing of the clock signal output from the first input circuit, where the first input circuit comprises a first threshold logic circuit supplied with the clock signal, a second threshold logic circuit supplied with the clock signal and having a high-level threshold value higher than that of the first threshold logic circuit and a low-level threshold value lower than that of the first threshold logic circuit, the second threshold logic circuit being inactive during a normal operation of the semiconductor integrated circuit and being active during a burn-in test, and a first selection circuit selectively outputting the clock signal from the first threshold logic circuit to the latch circuit during the normal operation, and selectively outputting the clock signal output from the second threshold logic circuit to the latch circuit during the burn-in test. According to the semiconductor integrated circuit of the present invention, even if the noise is mixed into the rising or falling waveform of the clock signal during the burn-in test, this embodiment can prevent an erroneous operation and carry out the burn-in test is a normal manner. Furthermore, in this embodiment, the input circuits which are provided with respect to information signals such as the chip select signal has the same circuit construction as the input circuit which is provided with respect to the clock signal. For this reason, it is possible to prevent an erroneous operation and carry out the burn-in test in the normal manner even if noise is mixed into such information signals.

A further object of the present invention is to provide a synchronous semiconductor memory device comprising a clock input circuit inputting a system clock signal and outputting an internal clock signal by shaping the system clock signal, a data output circuit, coupled to the clock input circuit, carrying out an operation of outputting a data in synchronism with a rise or fall timing of the internal clock signal output from the clock input circuit, and a constant voltage generating circuit, coupled to the clock input circuit, generating a constant voltage having a voltage value for suppressing a change in operating speeds of transistors with respect to a temperature change, and supplying the constant voltage to the clock input circuit as a power supply voltage. According to the synchronous semiconductor memory device of the present invention, the data is also output with a delay corresponding to the access time from the system clock signal. However, the clock input circuit is supplied with the constant voltage having the voltage value for suppressing the change in the operation speeds of the transistors with respect to the temperature change. For this reason, it is possible to suppress the change in the delay time of the clock input circuit caused by the change in the power supply voltage supplied from the outside and the temperature change. In addition, the constant voltage may be supplied as the power supply voltage to the circuit parts of the data output circuit excluding the level shift circuit and the output transistor circuit which is made up of the output transistors. Hence, it is possible to suppress the change in the delay time of the data output circuit caused by the change in the power supply voltage which is supplied from the outside and the temperature change. Furthermore, it is possible to input the correct data at the destination of the data transfer because it is possible to suppress the change in the access time from the system clock signal caused by the change in the power supply voltage which is supplied from the outside and the temperature change.

Another object of the present invention is to provide a semiconductor integrated circuit comprising a current mirror circuit having three pairs of current input and output ends, a differential amplifier circuit comprising a first constant current source having a current input end and a current output end, and first and second field effect transistors having first ends coupled to one of the current input and output ends of the first constant current source and second ends respectively coupled to first and second ends of the current mirror circuit, the first and second ends of the current mirror circuit being two input ends or two output ends of the current mirror circuit, the second field effect transistor having a gate supplied with a reference potential, and an input stage circuit comprising a second constant current source having a current input end and a current output end, and a third field effect transistor having a first end coupled to one of the current input and output ends of the second constant current source and a second end coupled to a third end of the current mirror circuit, the third end being the input end or the output end of the current mirror circuit other than the first and second ends of the current mirror circuit, where an output signal corresponding to an amplified signal of an input signal supplied to a gate of the third field effect transistor is output from the second end of one of the first and second field effect transistors. According to the semiconductor integrated circuit of the present invention, it is possible to reduce the signal propagation delay time by merely adding field effect transistors, and it is possible to suppress the chip area from increasing.

Still another object of the present invention is to provide a semiconductor integrated circuit comprising a current mirror circuit having two pairs of current input and output ends, a differential amplifier circuit comprising a first constant current source having a current input end and a current output end, and first and second field effect transistors having first ends coupled to one of the current input and output ends of the first constant current source and second ends respectively coupled to first and second ends of the current mirror circuit, the first and second ends of the current mirror circuit being two input ends or two output ends of the current mirror circuit, the second field effect transistor having a gate supplied with a reference potential, and an input stage circuit comprising a second constant current source having a current input end and a current output end, a load field effect transistor, and a third field effect transistor having a first end coupled to one of the current input and output ends of the second constant current source and a second end coupled to one end of the load field effect transistor and a gate of the first field effect transistor, the load field effect transistor having the other end coupled to a power supply line, where an output signal corresponding to an amplified signal of an input signal supplied to a gate of the third field effect transistor is output from the second end of one of the first and second field effect transistors. According to the semiconductor integrated circuit of the present invention, it is possible to reduce the signal propagation delay time by merely adding field effect transistors, and it is possible to suppress the chip area from increasing.

Other objects and further features of the present invention will be apparent from the following detailed description when read in conjunction with the accompanying drawings.

BRIEF DESCRIPTION OF THE DRAWINGS

FIG. 12 is a timing chart for explaining the operation of the first embodiment when outputting data;

FIG. 13 is a timing chart for explaining the operation of the first embodiment when outputting the data;

FIGS. 14A, 14B, 14C, 14D 14E and 14F respectively are timing charts for explaining the operation of the first embodiment when outputting the data;

FIG. 42 is a timing chart for explaining the read operation of the conceivable SDRAM shown in FIG. 41;

DESCRIPTION OF THE PREFERRED EMBODIMENTS

First, a description will be given of a first embodiment of a semiconductor device according to the present invention, by referring to FIGS. 4 through 14.

Figure 4:
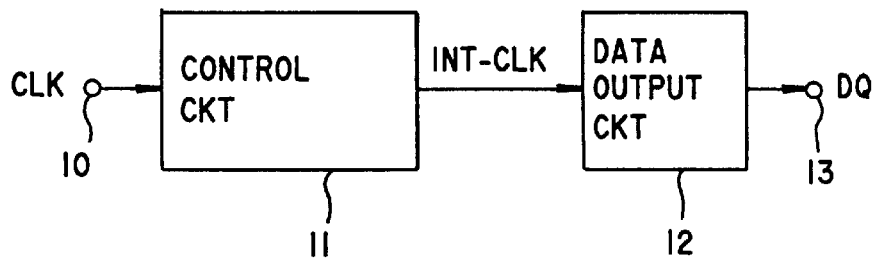
FIG. 4 is a system block diagram showing an important part of a first embodiment of a semiconductor device according to the present invention.

FIG. 4 shows an important part of the first embodiment. A semiconductor device shown in FIG. 4 includes a data output circuit control circuit 11, and a data output circuit 12. A clock signal CLK is input to a clock signal input terminal 10 from the outside, and the data output circuit control circuit 11 generates an internal clock signal INT-CLK based on the clock signal CLK. The data output circuit control circuit 11 controls the data output circuit 12. The data output circuit 12 starts an operation of outputting a data DQ in synchronism with a rise timing of the internal clock signal INT-CLK that is supplied from the data output circuit control circuit 11. The data DQ is output via a data output terminal 13.

Figure 5:
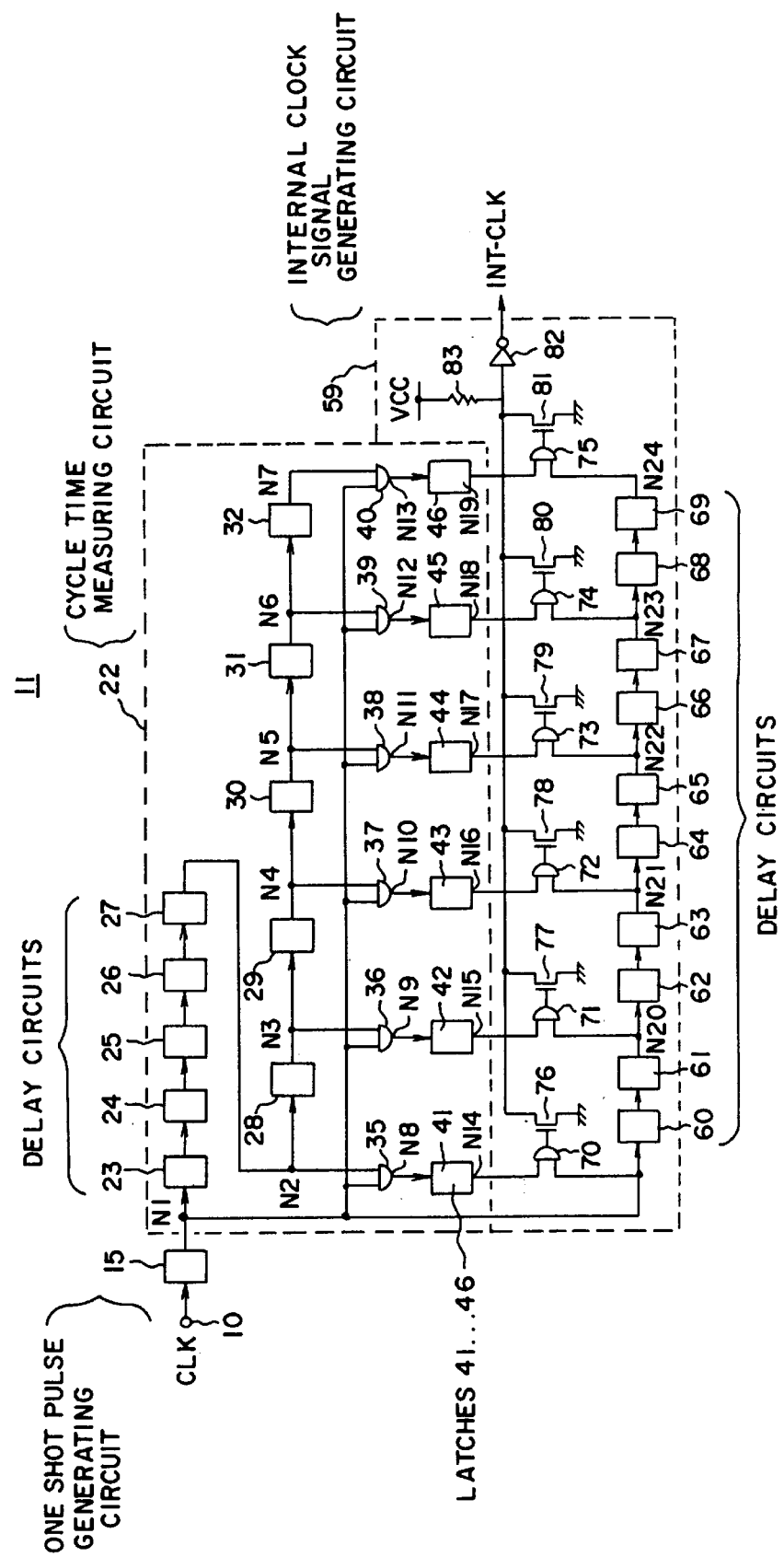
FIG. 5 is a circuit diagram showing a data output circuit control circuit of the first embodiment.

In this embodiment, the data output circuit control circuit 11 has the construction shown in FIG. 5. In FIG. 5, the data output circuit control circuit 11 includes a one-shot pulse generating circuit 15, a cycle time measuring circuit 22 and an internal clock signal generating circuit 59. The one-shot pulse generating circuit 15 generates a one-shot pulse having a pulse width of 1 ns.

Figure 6:
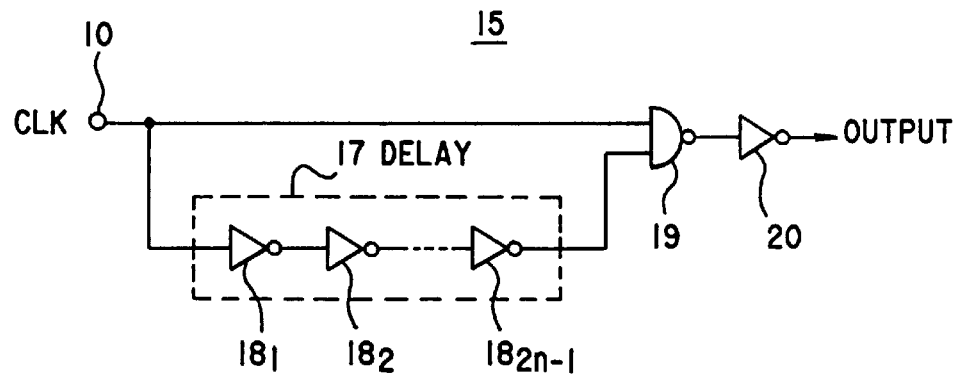
FIG. 6 is a circuit diagram showing a one-shot pulse generating circuit.

FIG. 6 shows the construction of the one-shot pulse generating circuit 15. In FIG. 6, the one-shot pulse generating circuit 15 includes a delay circuit 17, a NAND circuit 19 and an inverter 20. The delay circuit 17 includes inverters $18_1$ through $18_{2m-1}$, where m is an integer, and delays the clock signal CLK. The NAND circuit 19 obtains a NAND between the clock signal and an output of the delay circuit 17, and the inverter 20 inverts an output of the NAND circuit 19.

In FIG. 5, the cycle time measuring circuit 22 measures a cycle time of the clock signal CLK via the one-shot pulse that is output from the one-shot pulse generating circuit 15. The cycle time measuring circuit 22 includes delay circuits 23 through 32, AND circuits 35 through 40, and latch circuits 41 through 46 which are connected as shown.

Figure 7:
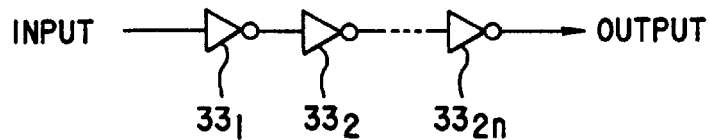
FIG. 7 is a circuit diagram showing a delay circuit.

The delay circuits 23 through 32 respectively have a delay time of 1 ns. The delay circuits 23 through 32 may have the same circuit construction. For example, the delay circuit 23 has the construction shown in FIG. 7. In FIG. 7, the delay circuit 23 includes inverters $33_1$ through $33_{2n}$, where n is an integer.

In FIG. 5, the AND circuits 35 through 40 respectively obtain ANDs of the clock signal CLK and a corresponding one of the outputs of the delay circuits 27 through 32.

Figure 8:
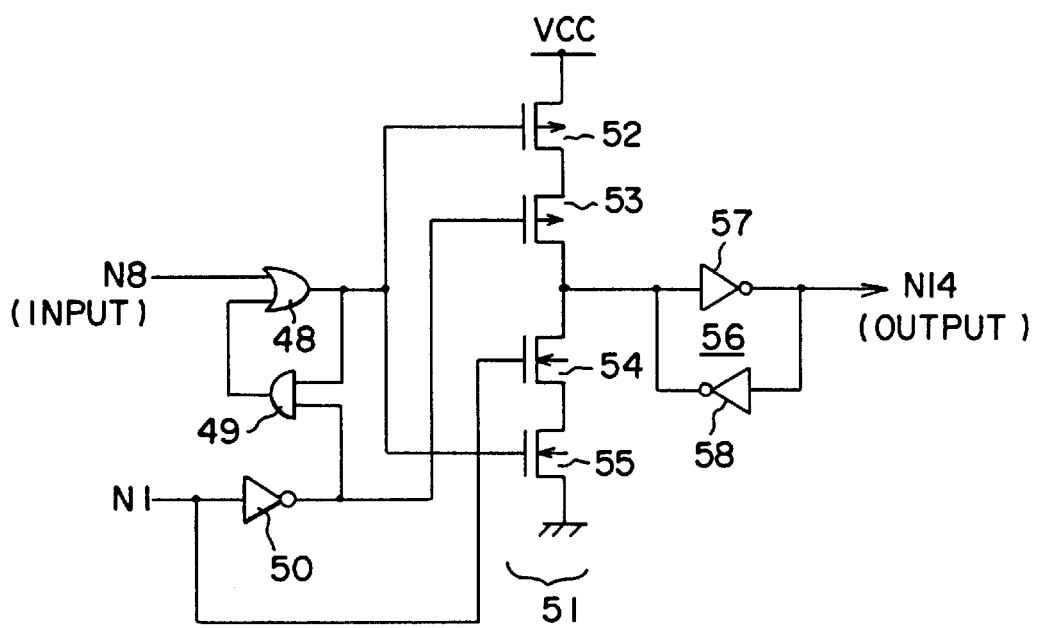
FIG. 8 is a circuit diagram showing a latch circuit.

In addition, the latch circuits 41 through 46 form a cycle time storage circuit for storing the measured result, that is, the cycle time of the clock signal CLK. The latch circuits 41 through 46 may have the same circuit construction. For example, the latch circuit 41 has the construction shown in FIG. 8. In FIG. 8, the latch circuit 41 includes an OR circuit 48, an AND circuit 49, an inverter 50, a clock signaled inverter 51, and a latch circuit 56 which are connected as shown. The clock signaled inverter 51 includes enhancement type p-channel metal oxide semiconductor transistors (pMOS transistors) 52 and 53, and enhancement type n-channel MOS transistors (nMOS transistors) 54 and 55. The latch circuit 56 latches an output of the clock signaled inverter 51, and includes inverters 57 and 58.

In FIG. 5, the internal clock signal generating circuit 59 generates the internal clock signal INT-CLK based on outputs of the latch circuits 41 through 46 which store the cycle time of the clock signal and the one-shot pulse output from the one-shot pulse generating circuit 15. The internal clock signal generating circuit 59 shown in FIG. 5 includes delay circuits 60 through 69, AND circuits 70 through 75, enhancement type nMOS transistors 76 through 81, an inverter 82, and a resistor 83 which are connected as shown. The delay circuits 60 through 69 respectively have a delay time of 1 ns, and may have the same circuit construction as the delay circuits 23 through 32. The ON/OFF states of the enhancement type nMOS transistors 76 through 81 are controlled by outputs of the corresponding AND circuits 70 through 75.

Figure 9:
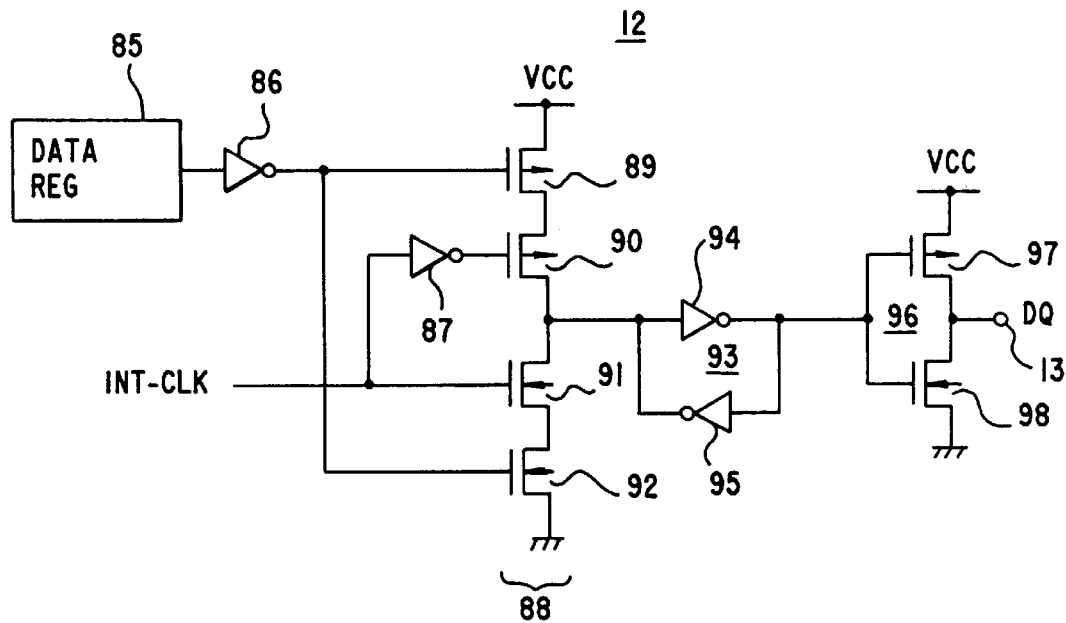
FIG. 9 is a circuit diagram showing a data output circuit.

In this embodiment, the data output circuit 12 shown in FIG. 4 has a clock signal access time $t_{CLKA}$ of 6 ns, and has the construction shown in FIG. 9. In FIG. 9, the data output circuit 12 includes a data register 85, inverters 86 and 87, a a clock signaled inverter 88, a latch circuit 93, and an output circuit part 96 which are connected as shown.

The data register 85 stores the data DQ that is to be output. The inverter 86 inverts an output of the data register 85, and the inverter 87 inverts the internal clock signal INT-CLK. The clock signaled inverter 88 includes enhancement type pMOS transistors 89 and 90, and enhancement type nMOS transistors 91 and 92. The latch circuit 93 latches an output of the clock signaled inverter 88, and includes inverters 94 and 95. The output circuit part 96 includes an enhancement type pMOS transistor 97 forming a pull-up element, and an enhancement type nMOS transistor 98 forming a pull-down element.

Figure 10:
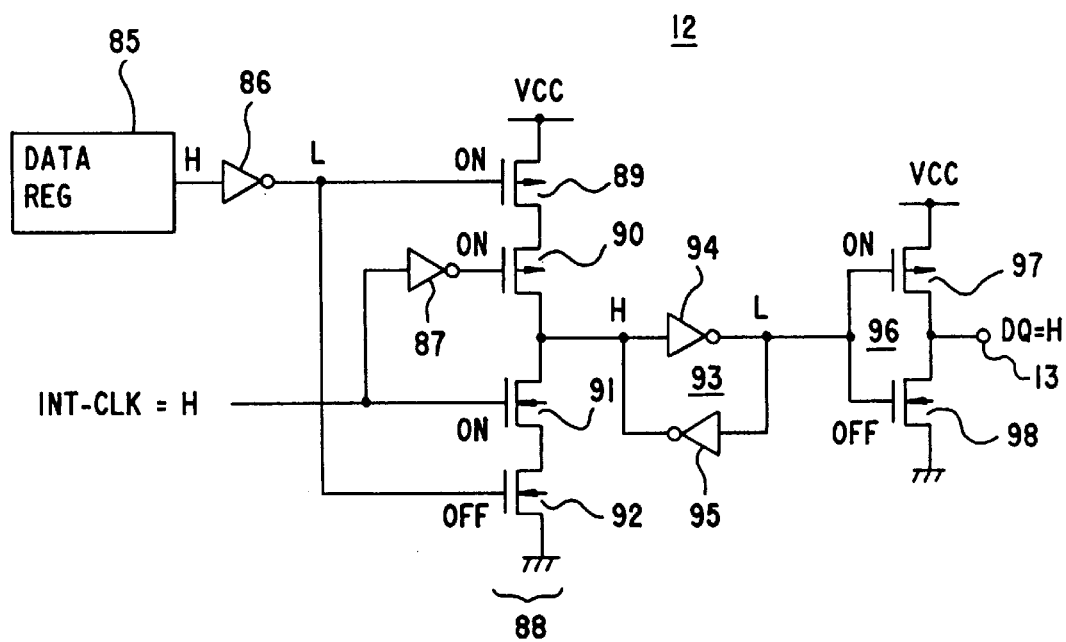
FIG. 10 is a circuit diagram for explaining the operation of the data output circuit.

In the data output circuit 12, the pMOS transistor 89 and the nMOS transistor 91 turn ON when the internal clock signal INT-CLK has a high level, as shown in FIG. 10. In FIG. 10 and the subsequent drawings, "H" denotes a high level of a signal, and "L" denotes a low level of a signal. When the output of the data register 85 has a high level, the output level of the inverter 86 becomes low, the pMOS transistor 89 turns ON, and the nMOS transistor 92 turns OFF. As a result, the output level of the clock signaled inverter 88 becomes low, the pMOS transistor 97 turns ON, the nMOS transistor 98 turns OFF, and the level of the output data DQ becomes high.

Figure 11:
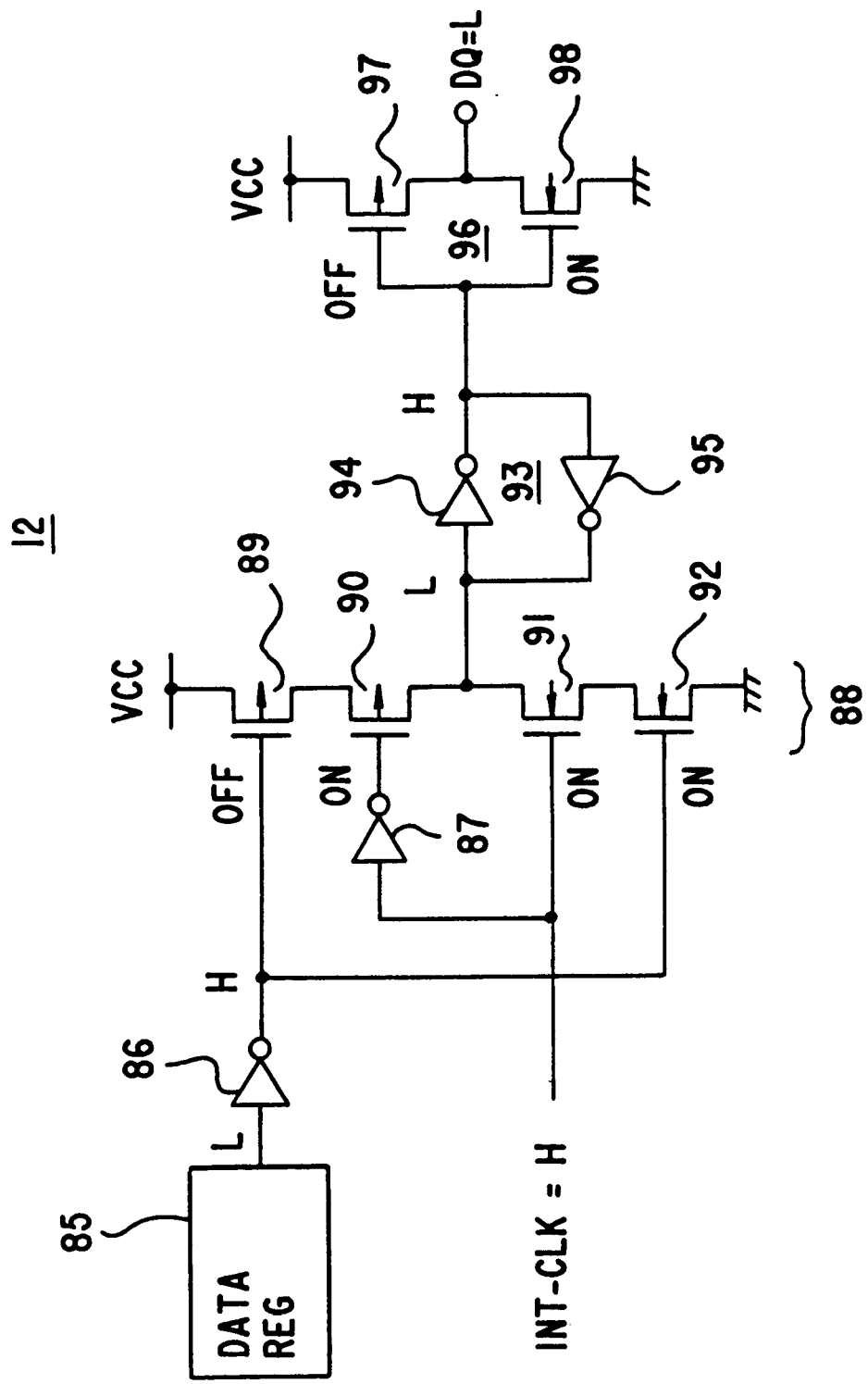
FIG. 11 is a circuit diagram for explaining the operation of the data output circuit.

On the other hand, when the output level of the data register 85 is low as shown in FIG. 11, the output level of the inverter 86 becomes high, the pMOS transistor 89 turns OFF, and the nMOS transistor 92 turns ON. As a result, the output level of the clock signaled inverter 88 becomes low, the output level of the latch circuit 93 becomes high, the pMOS transistor 97 turns OFF, the nMOS transistor 98 turns ON, and the level of the output data DQ becomes low.

In addition, when the level of the internal clock signal INT-CLK is low, the pMOS transistor 90 and the nMOS transistor 91 turn OFF, the output state of the clock signaled inverter 88 assumes a high impedance state, and the latch circuit 93 maintains the data DQ of the previous cycle.

FIG. 12 is a timing chart for explaining the operation of this embodiment when outputting data in a case where a cycle time $t_{CLK}$ of the clock signal CLK is 10 ns and the data transfer speed is 100 MHz. FIG. 12 shows timings of the clock signal CLK, signals or potentials at nodes N1 through N24, the internal clock signal INT-CLK, and the data DQ.

The one-shot pulse generating circuit 15 detects the timing of the rise of the clock signal CLK, and generates a pulse having a pulse width of 1 ns. Hence, the output of the one-shot pulse generating circuit 15, that is, the potential at the node N1 shown in FIG. 5, becomes as indicated by N1 in FIG. 12.

The delay circuits 23 through 32 respectively have a delay time of 1 ns. Hence, the outputs of the delay circuits 23 through 32, that is, the potentials at the nodes N2 through N7 shown in FIG. 5, respectively become as indicated by N2 through N7 in FIG. 12.

As a result, the outputs of the AND circuits 35 through 39, that is, the potentials at the nodes N8 through N12 shown in FIG. 5, always become low as indicated by N8~N12 in FIG. 12. Hence, the output of the AND circuit 40, that is, the potential at the node N13 shown in FIG. 5, change similarly to the potential at the node N7, as indicated by N13 in FIG. 12.

The latch circuits 41 through 45 latch the low-level outputs of the corresponding AND circuits 35 through 39. Hence, the outputs of the latch circuits 41 through 45, that is, the potentials at the nodes N14 through N18 shown in FIG. 5, always have a low level as indicated by N14~N18 in FIG. 12.

On the other hand, the latch circuit 46 latches the high-level output of the AND circuit 40. Thus, the output of the latch circuit 46, that is, the potential at the node N19 shown in FIG. 5, always has a high level as indicated by N19 in FIG. 12.

The delay circuits 60 through 69 respectively have a delay time of 1 ns. Hence the outputs of the delay circuits 61, 63, 65, 67 and 69, that is, the potentials at the nodes N20 through N24 shown in FIG. 5, respectively become as indicated by N20 through N24 in FIG. 12.

As a result, the outputs of the AND circuits 70 through 74 always have a low level, and the nMOS transistors 76 through 80 are always OFF.

On the other hand, the output of the AND circuit 75 changes similarly to the output of the delay circuit 69. Hence, the nMOS transistor 81 repeats the ON/OFF states in synchronism with the output of the AND circuit 75.

Accordingly, when the cycle time $t_{CLK}$ of the clock signal CLK is 10 ns, a signal similar to the output of the delay circuit 69 is output as the internal clock signal INT-CLK as shown in FIG. 12. This internal clock signal INT-CLK has the same cycle time as the clock signal CLK. In addition, this internal clock signal INT-CLK has a rise timing that is (a predetermined time of 10 ns)–(cycle time $t_{CLK}$ =10 ns of the clock signal CLK)=0 ns advanced compared to the clock signal CLK. In other words, the rise timing of the internal clock signal INT-CLK is the same as that of the clock signal CLK.

Because the clock signal access time $t_{CLKA}$ of the data output circuit 12 is 6 ns, 4 ns can be secured as a set up time $t_{SU}$.

FIG. 13 is a timing chart for explaining the operation of this embodiment when outputting data in a case where a cycle time $t_{CLK}$ of the clock signal CLK is 8 ns and the data transfer speed is 125 MHz. FIG. 13 shows timings of the clock signal CLK, signals or potentials at the nodes N1 through N24, the internal clock signal INT-CLK, and the data DQ.

The one-shot pulse generating circuit 15 detects the timing of the rise of the clock signal CLK, and generates a pulse having a pulse width of 1 ns. Hence, the output of the one-shot pulse generating circuit 15, that is, the potential at the node N1 shown in FIG. 5, becomes as indicated by N1 in FIG. 13.

The delay circuits 23 through 32 respectively have a delay time of 1 ns. Hence, the outputs of the delay circuits 23 through 32, that is, the potentials at the nodes N2 through N7 shown in FIG. 5, respectively become as indicated by N2 through N7 in FIG. 13.

As a result, the outputs of the AND circuits 35 through 37, 39 and 40, that is, the potentials at the nodes N8 through N10, N12 and N13 shown in FIG. 5, always become low as indicated by N8~N10,12,13 in FIG. 13. Hence, the output of the AND circuit 38, that is, the potential at the node N11 shown in FIG. 5, change similarly to the potential at the node N5, as indicated by N11 in FIG. 13.

The latch circuits 41 through 43, 45 and 46 latch the low-level outputs of the corresponding AND circuits 35 through 37, 39 and 40. Hence, the outputs of the latch circuits 41 through 43, 45 and 46, that is, the potentials at the nodes N14 through N16, N18 and N19 shown in FIG. 5, always have a low level as indicated by N14~N16,18,19 in FIG. 13.

On the other hand, the latch circuit 44 latches the high-level output of the AND circuit 38. Thus, the output of the latch circuit 44, that is, the potential at the node N17 shown in FIG. 5, always has a high level as indicated by N17 in FIG. 13.

The delay circuits 60 through 69 respectively have a delay time of 1 ns. Hence the outputs of the delay circuits 61, 63, 65, 66 and 69, that is, the potentials at the nodes N20 through N24 shown in FIG. 5, respectively become as indicated by N20 through N24 in FIG. 13.

As a result, the outputs of the AND circuits 70 through 72, 74 and 75 always have a low level, and the nMOS transistors 76 through 78, 80 and 81 are always OFF.

On the other hand, the output of the AND circuit 73 changes similarly to the output of the delay circuit 65. Hence, the nMOS transistor 79 repeats the ON/OFF states in synchronism with the output of the AND circuit 73.

Accordingly, when the cycle time $t_{CLK}$ of the clock signal CLK is 8 ns, a signal similar to the output of the delay circuit 65 is output as the internal clock signal INT-CLK as shown in FIG. 13. This internal clock signal INT-CLK has the same cycle time as the clock signal CLK. In addition, this internal clock signal INT-CLK has a rise timing that is (a predetermined time of 10 ns)–(cycle time $t_{CLK}$=8 ns of the clock signal CLK)=2 ns advanced compared to the clock signal CLK.

Because the clock signal access time $t_{CLKA}$ of the data output circuit 12 is 6 ns, 4 ns can be secured as a set up time $t_{SU}$.

FIGS. 14A, 14B, 14C, 14D, 14E and 14F respectively are timing charts showing the relationships of the clock signal CLK, the internal clock signal INT-CLK and the output data DQ for cases where the cycle time $t_{CLK}$ of the clock signal CLK is 10 as, 9 ns, 8 ns, 7 ns, 6 ns and 5 ns.

Therefore, according to the first embodiment, the data output circuit 12 outputs the data DQ after the clock signal access time $t_{CLKA}$ of 6 ns from the rise timing of the internal clock signal INT-CLK. However, the internal clock signal INT-CLK has the same cycle time as the clock signal CLK, and the rise timing of the internal clock signal INT-CLK is (a predetermined time of 10 ns)–(cycle time $t_{CLK}$ of the clock signal CLK) advanced compared to the clock signal CLK.

As a result, the timings at which the data DQ is output from the data output circuit 12 when the cycle time $t_{CLK}$ of the clock signal CLK is 10 ns, 9 ns, 8 ns, 7 ns, 6 ns and 5 ns become the same when viewed from the rise of the next clock signal CLK, and it is possible to secure a set up time $t_{SU}$ of 4 ns.

Thus, the first embodiment can be applied to electronic equipments having data transfer speeds of 100 MHz, 111 MHz, 125 MHz, 143 MHz, 167 MHz and 200 MHz, and the circuit design flexibility is improved.

Next, a description will be given of a second embodiment of the semiconductor device according to the present invention, by referring to FIGS. 15 through 18.

Figure 15:
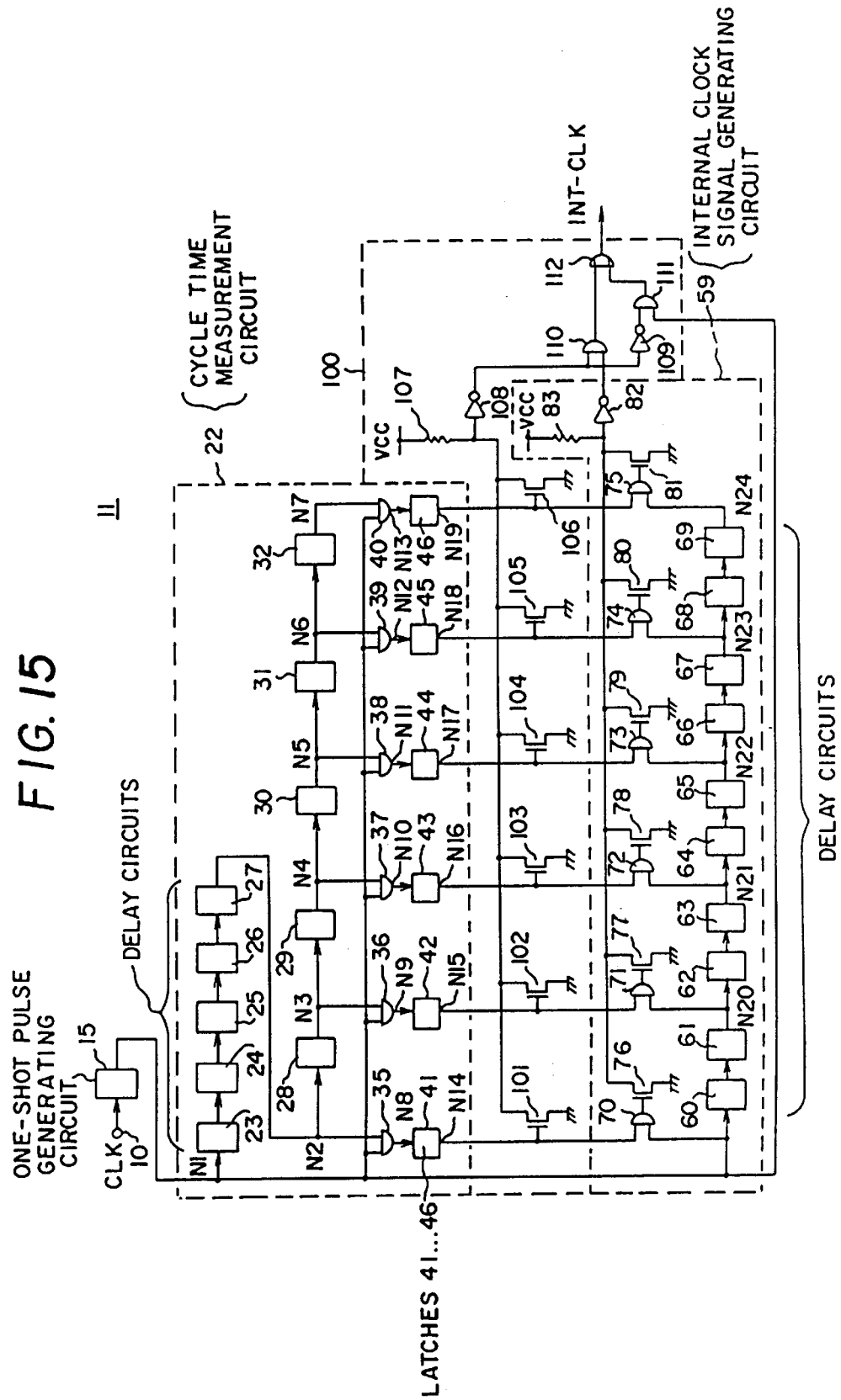
FIG. 15 is a circuit diagram showing a data output circuit control circuit of a second embodiment of the semiconductor device according to the present invention.

FIG. 15 shows an important part of the second embodiment. More particularly, FIG. 15 shows the data output circuit control circuit of the second embodiment.

This second embodiment uses the data output circuit control circuit 11 shown in FIG. 15 in place of the data output circuit control circuit 11 shown in FIG. 5. Otherwise, this second embodiment is basically the same as the first embodiment described above.

The data output circuit control circuit 11 shown in FIG. 15 is provided with a switching circuit 100. Otherwise, the data output circuit control circuit 11 shown in FIG. 15 is basically the same as the data output circuit control circuit 11 shown in FIG. 5. In FIG. 15, those parts which are the same as those corresponding parts in FIG. 5 are designated by the same reference numerals, and a description thereof will be omitted.

In FIG. 15, the switching circuit 100 includes enhancement type nMOS transistors 101 through 106, a resistor 107, inverters 108 and 109, AND circuits 110 and 111, and an OR circuit 112.

In this second embodiment, the level of one of the outputs of the latch circuits 41 through 46 becomes high when the cycle time $t_{CLK}$ of the clock signal CLK is any one of 10 ns, 9 ns, 8 ns, 7 ns, 6 ns and 5 ns.

Figure 16:
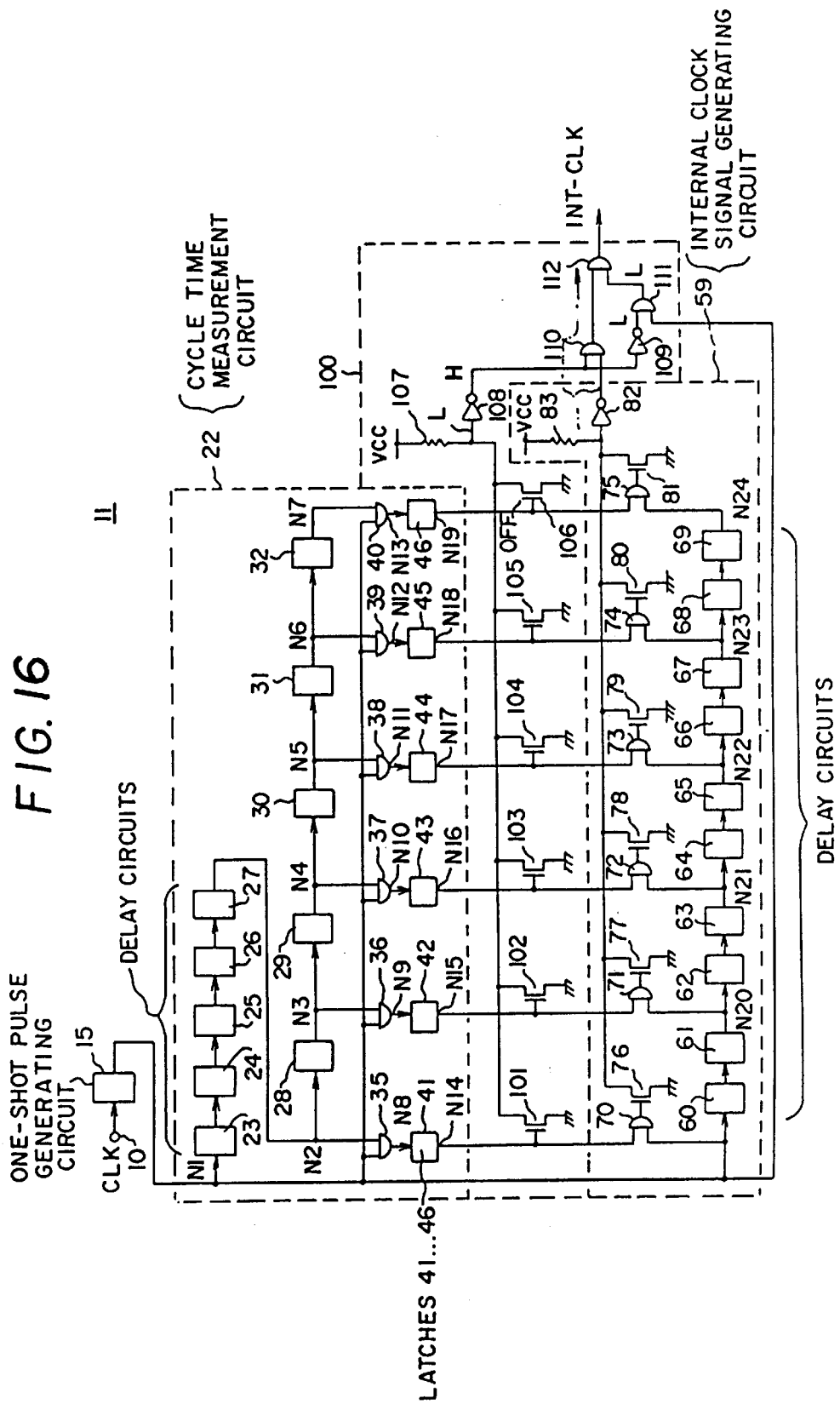
FIG. 16 is a circuit diagram showing the data output circuit control circuit for explaining the operation of the second embodiment.

As a result, as shown in FIG. 16, the input level of the inverter 108 becomes low, the output level of the inverter 108 becomes high, the output level of the inverter 109 becomes low, and the output level of the AND circuit 111 becomes fixed to the low level.

Accordingly, in this case, the AND circuit 110 operates as a non-inverting circuit with respect to the output of the inverter 82, and the OR circuit 112 operates as a non-inverting circuit with respect to the output of the AND circuit 110. Hence, the internal clock signal INT-CLK that is generated from the internal clock signal generating circuit 59 is supplied to the data output circuit 12.

Figure 17:
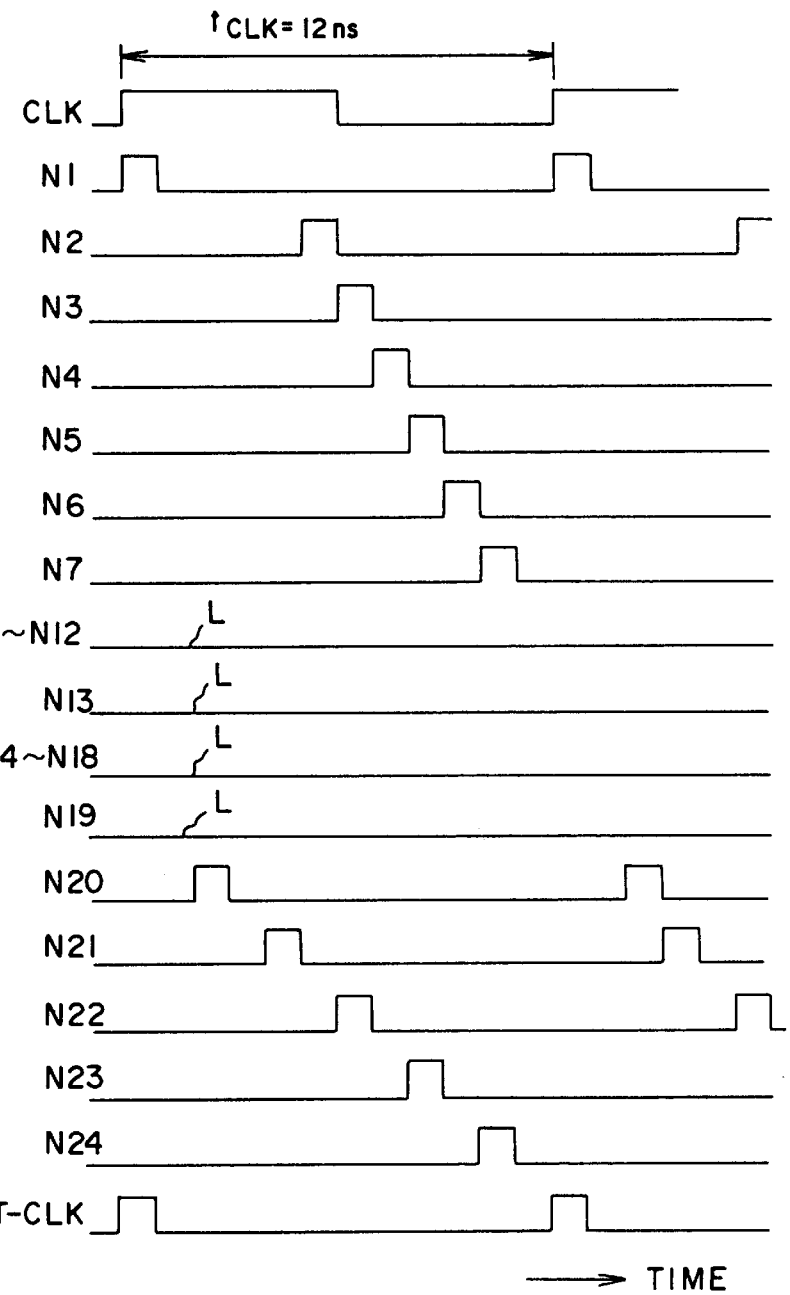
FIG. 17 is a timing chart for explaining the operation of the second embodiment when outputting data.

On the other hand, when the cycle time $t_{CLK}$ of the clock signal CLK is longer than 10 ns, that is, is 12 ns for example, the output levels of the latch circuits 41 through 46 all become low. In other words, the potentials at the nodes N14 through N19 all become low as indicated by N14~N18 and N19 in FIG. 17. FIG. 17 is a timing chart for explaining the operation of this embodiment when outputting data in the case where a cycle time $t_{CLK}$ of the clock signal CLK is 12 ns. FIG. 17 shows timings of the clock signal CLK, signals or potentials at the nodes N1 through N24, and the internal clock signal INT-CLK.

Figure 18:
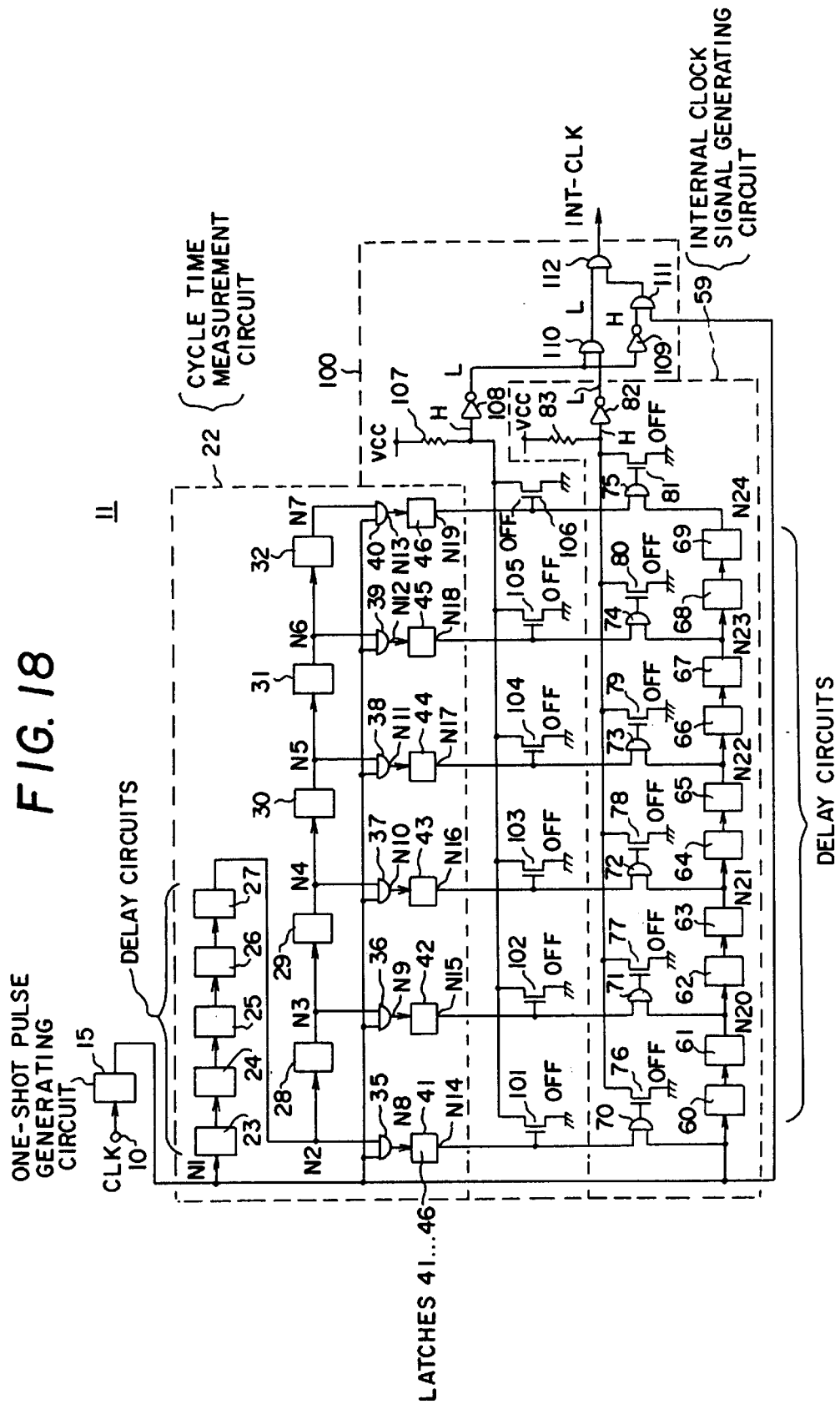
FIG. 18 is a circuit diagram showing the data output circuit control circuit for explaining the operation of the second embodiment.

As a result, as shown in FIG. 18, the nMOS transistors 76 through 81 turn OFF, the nMOS transistors 101 through 106 turn OFF, the input level of the inverter 82 becomes high, the output level of the inverter 82 becomes low, the input level of the inverter 108 becomes high, the output level of the inverter 108 becomes low, and the output level of the inverter 109 becomes high.

Accordingly, the output of the AND circuit 110 is fixed to the low level, the AND circuit 111 operates as a non-inverting circuit with respect to the one-shot pulse output from the one-shot pulse generating circuit 15, and the OR circuit 112 operates as a non-inverting circuit with respect to the output of the AND circuit 111.

As a result, In this case, the one-shot pulse output from the one-shot pulse generating circuit 15, that is, the signal having the same cycle time and rise timing as the clock signal CLK, is supplied to the data output circuit 12.

Thus, the second embodiment can be applied to electronic equipments having data transfer speeds of 100 MHz, 111 MHz, 125 MHz, 143 MHz, 167 MHz, 200 MHz, and less than 100 MHz, and the circuit design flexibility is improved.

Next, a description will be given of a third embodiment of the semiconductor device according to the present invention, by referring to FIGS. 19 and 20.

Figure 19:
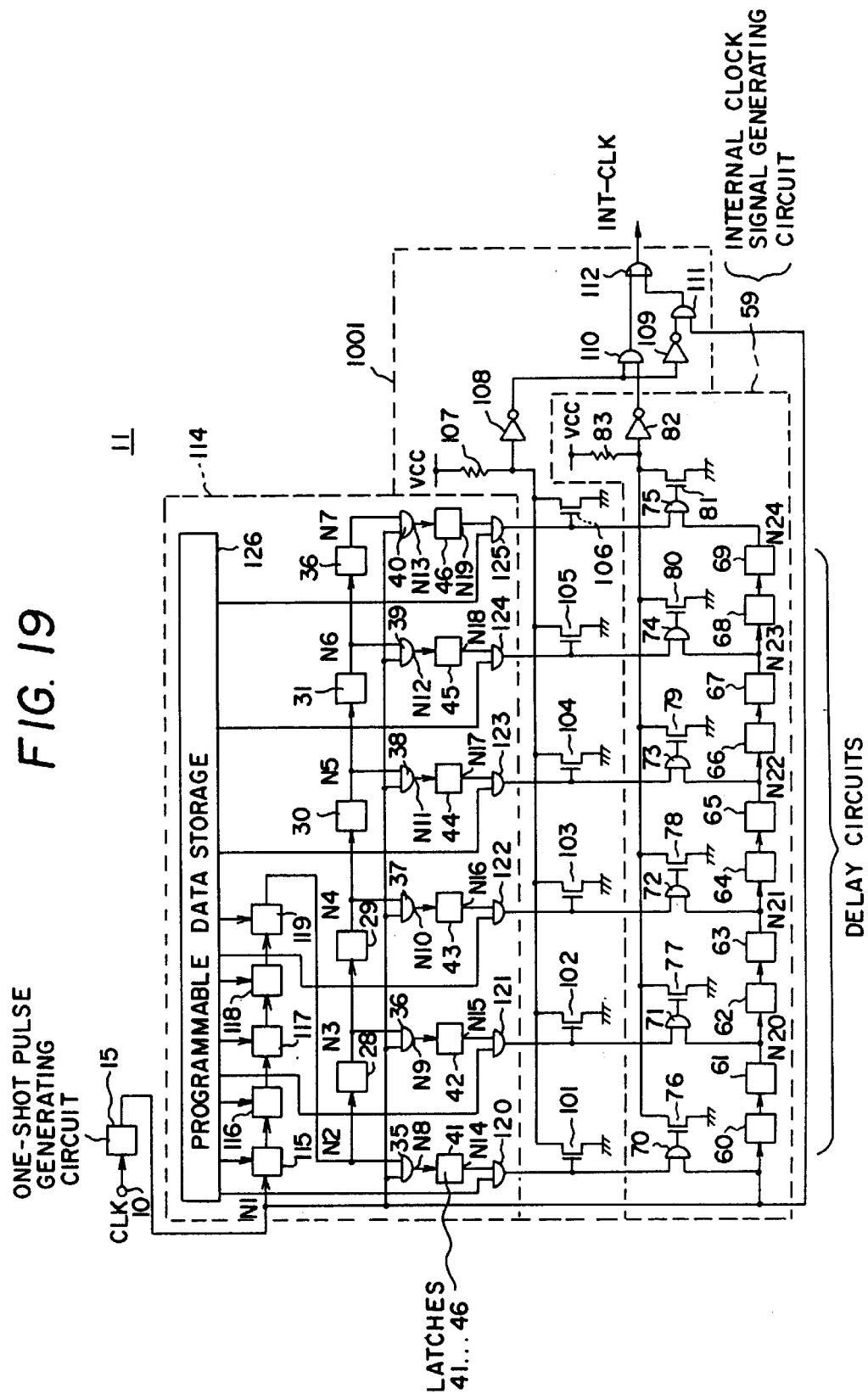
FIG. 19 is a circuit diagram showing a data output circuit control circuit of a third embodiment of the semiconductor device according to the present invention.
Figure 20:
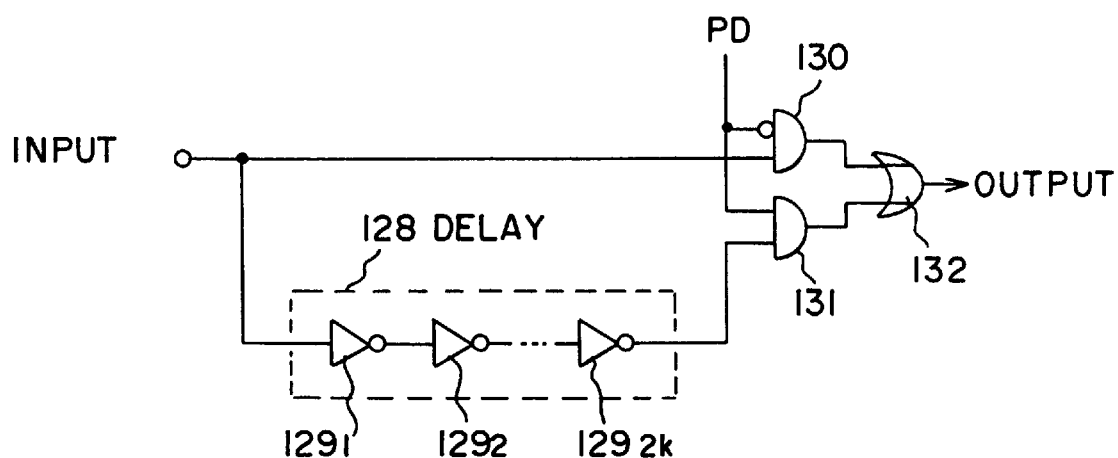
FIG. 20 is a circuit diagram showing a delay circuit.

FIG. 19 shows an important part of the third embodiment. More particularly, FIG. 19 shows the data output circuit control circuit of the third embodiment.

This third embodiment uses the data output circuit control circuit 11 shown in FIG. 19 in place of the data output circuit control circuit 11 shown in FIG. 15. Otherwise, this third embodiment is basically the same as the second embodiment described above.

The data output circuit control circuit 11 shown in FIG. 19 is provided with a cycle time measuring circuit 114 having the construction shown in place of the cycle time measuring circuit 22. Otherwise, the data output circuit control circuit 11 shown in FIG. 19 is basically the same as the data output circuit control circuit 11 shown in FIG. 15. In FIG. 19, those parts which are the same as those corresponding parts in FIG. 15 are designated by the same reference numerals, and a description thereof will be omitted.

The cycle time measuring circuit 114 is provided with delay circuits 115 through 119 having a circuit construction different from that of the delay circuits 23 through 27 of the cycle time measuring circuit 22 shown in FIG. 15, in place of the delay circuits 23 through 27. In addition, the cycle time measuring circuit 114 is provided with AND circuits 120 through 125, and a programmable data storage 126 for controlling the delay circuits 115 through 119 and the AND circuits 120 through 125.

The delay circuits 115 through 119 may have the same circuit construction. For example, the delay circuit 115 has the construction shown in FIG. 20. The delay circuit 115 shown in FIG. 20 includes a delay circuit 128, AND circuits 130 and 131, and an OR circuit 132. The delay circuit 128 includes inverters $129_1$ through $129_{2k}$, where k is an integer. A programmable data PD is supplied to the AND circuits 130 and 131 from the programmable data storage 126 shown in FIG. 19.

When the programmable data PD has a high level, the output of the AND circuit 130 is fixed to the low level, the AND circuit 131 operates as a non-inverting circuit with respect to the output of the delay circuit 128, and in this case, the output of the delay circuit 128 is supplied to a circuit in the next stage.

On the other hand, when the programmable data PD has a low level, the output of the AND circuit 131 is fixed to the low level, the AND circuit 130 operates as a non-inverting circuit with respect to the input signal of the AND circuit 130, and in this case, the input signal is supplied as it is to the circuit in the next stage.

Hence, in this third embodiment, the delay times of the delay circuits 115 through 119 are measured by a test that is carried out at the wafer stage, that is, a so-called wafer probing test, so as to select the delay circuits that are to be used and to fix the outputs of the necessary ones of the AND circuits 120 through 125 to a low level.

Thus, the third embodiment can be applied to electronic equipments having data transfer speeds of 100 MHz, 111 MHz, 125 MHz, 143 MHz, 167 MHz, 200 MHz, and less than 100 MHz, and the circuit design flexibility is further improved from the first embodiment. In addition, it is possible to carry out a trimming with respect to the delay circuits 115 through 119.

According to the first through third embodiments described above, a cycle time of an external clock signal is measured using delay circuits. In addition, an internal clock signal having the same cycle time as the external clock signal and having a rise or fall timing that is (a predetermined time)–(cycle time of the external clock signal) advanced compared to the external clock signal is supplied to a data output circuit. As a result, even if the cycle time of the external clock signals differ, it is possible to secure the same set up time as long as the difference of the cycle time is within a predetermined range. Therefore, it is possible to apply the present invention to electronic equipments having different data transfer speeds, and the circuit design flexibility is improved.

Figure 1:
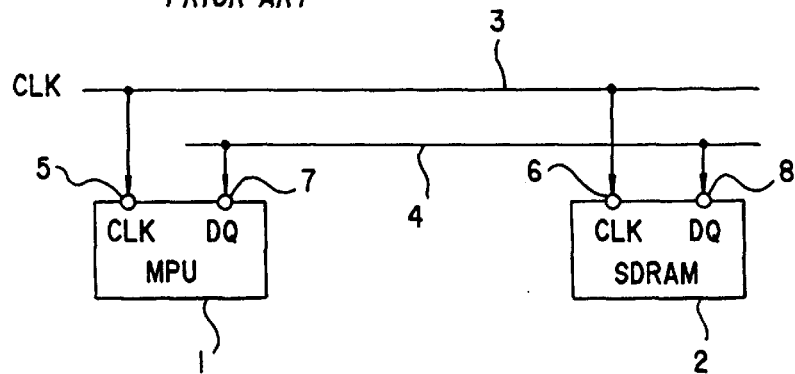
FIG. 1 is a system block diagram showing a part of an example of a conventional electronic equipment.
Figure 2:
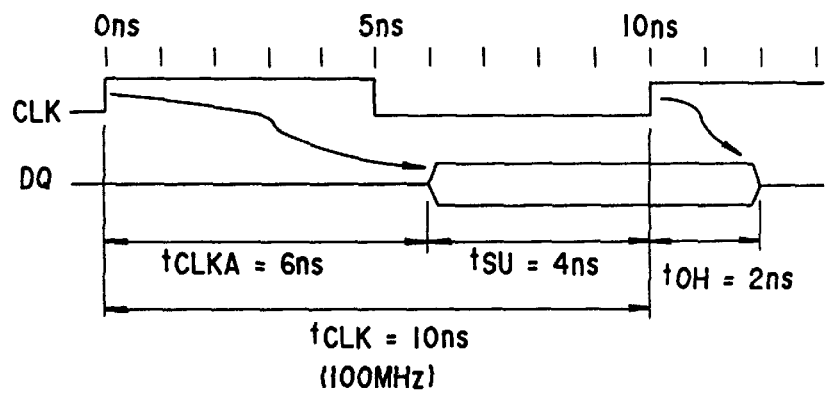
FIG. 2 is a timing chart for explaining the operation of the operation of the electronic equipment when a SDRAM outputs data.
Figure 3:
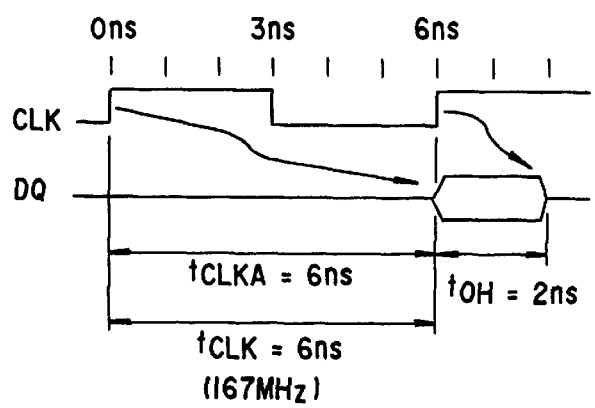
FIG. 3 is a timing chart for explaining the operation of the operation of the electronic equipment when a cycle time of a clock signal is short and the SDRAM outputs data.
Figure 21:
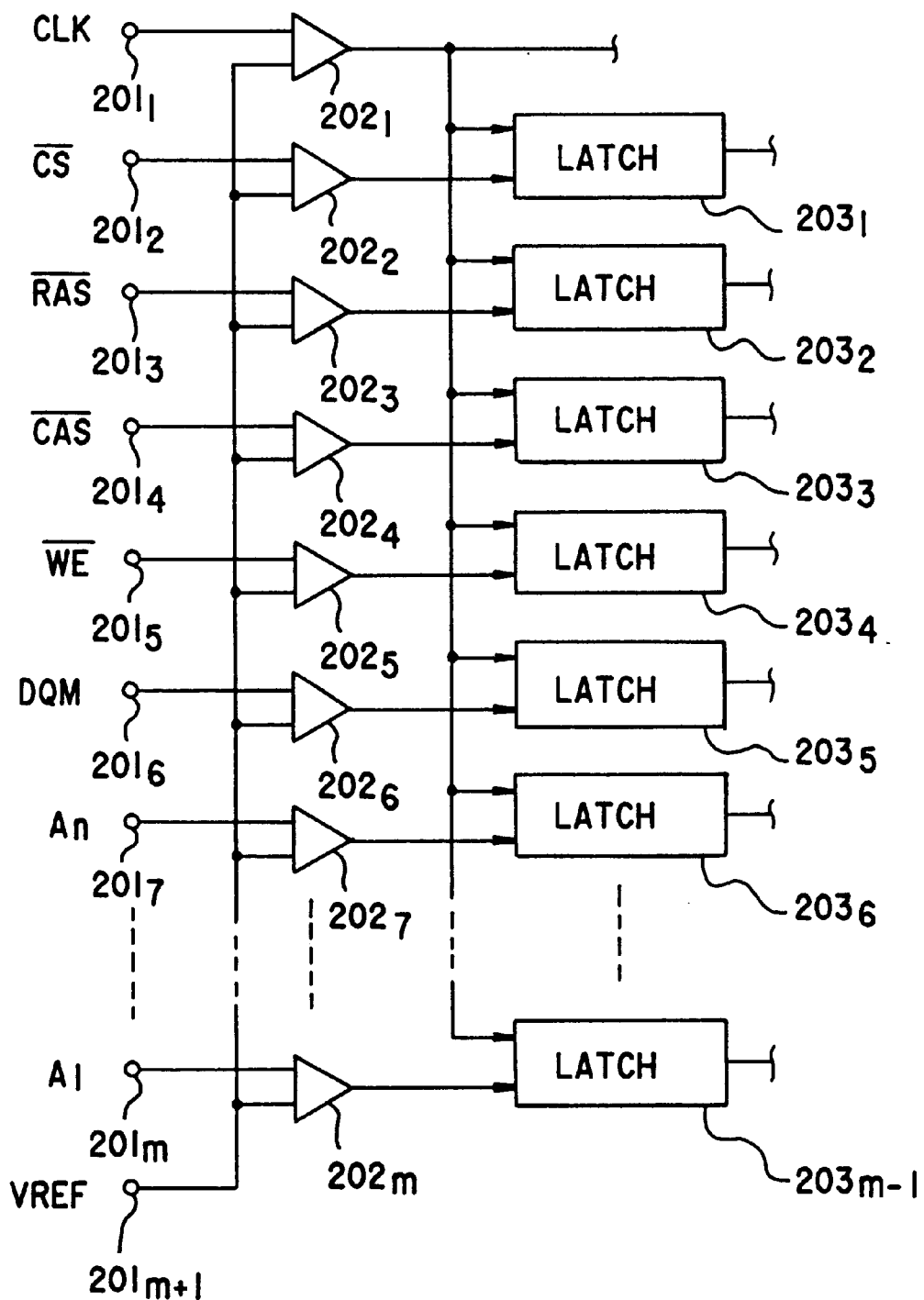
FIG. 21 is a circuit diagram showing a part of a conceivable SDRAM.

FIG. 21 shows a conceivable construction of a part of the SDRAM 2 shown in FIG. 1. The SDRAM 2 is an example of a synchronous semiconductor memory device that inputs a control signal and an address signal which are supplied from the outside in synchronism with a clock signal which is also supplied from the outside.

The SDRAM 2 shown in FIG. 21 includes external input terminals $201_1$ through $201_{m+1}$, input circuits $202_1$ through $202_m$, and latch circuits $203_1$ through $203_{m-1}$ which are connected as shown. The latch circuits $203_1$ through $203_{m-1}$ respectively latch signals output from the input circuits $202_2$ through $202_m$ in synchronism with a rising edge of the clock signal CLK that is output from the input circuit $202_1$.

The clock signal CLK is supplied to the clock signal input terminal $201_1$, and a chip select signal /CS is supplied to the chip select signal input terminal $201_2$. A row address strobe signal /RAS is supplied to the row address strobe signal input terminal $201_3$, and a column address strobe signal /CAS is supplied to the column address strobe signal input terminal $201_4$. A write enable signal /WE is supplied to the write enable signal input terminal $201_5$, and an output mask signal DQM is supplied to an output mask signal input terminal $201_6$. A most significant bit (MSB) $A_n$ of an address signal is supplied to the address signal input terminal $201_7$, and a least significant bit (LSB) $A_1$ of the address signal is supplied to the address signal input terminal $201_m$. A reference voltage VREF is supplied to the reference voltage input terminal $201_{m+1}$. For examples the reference voltage VREF is 1.5 V.

The input circuits $202_1$ through $202_m$ have the same circuit construction. For example, the input circuit $202_1$ has the construction shown in FIG. 22.

Figure 22:
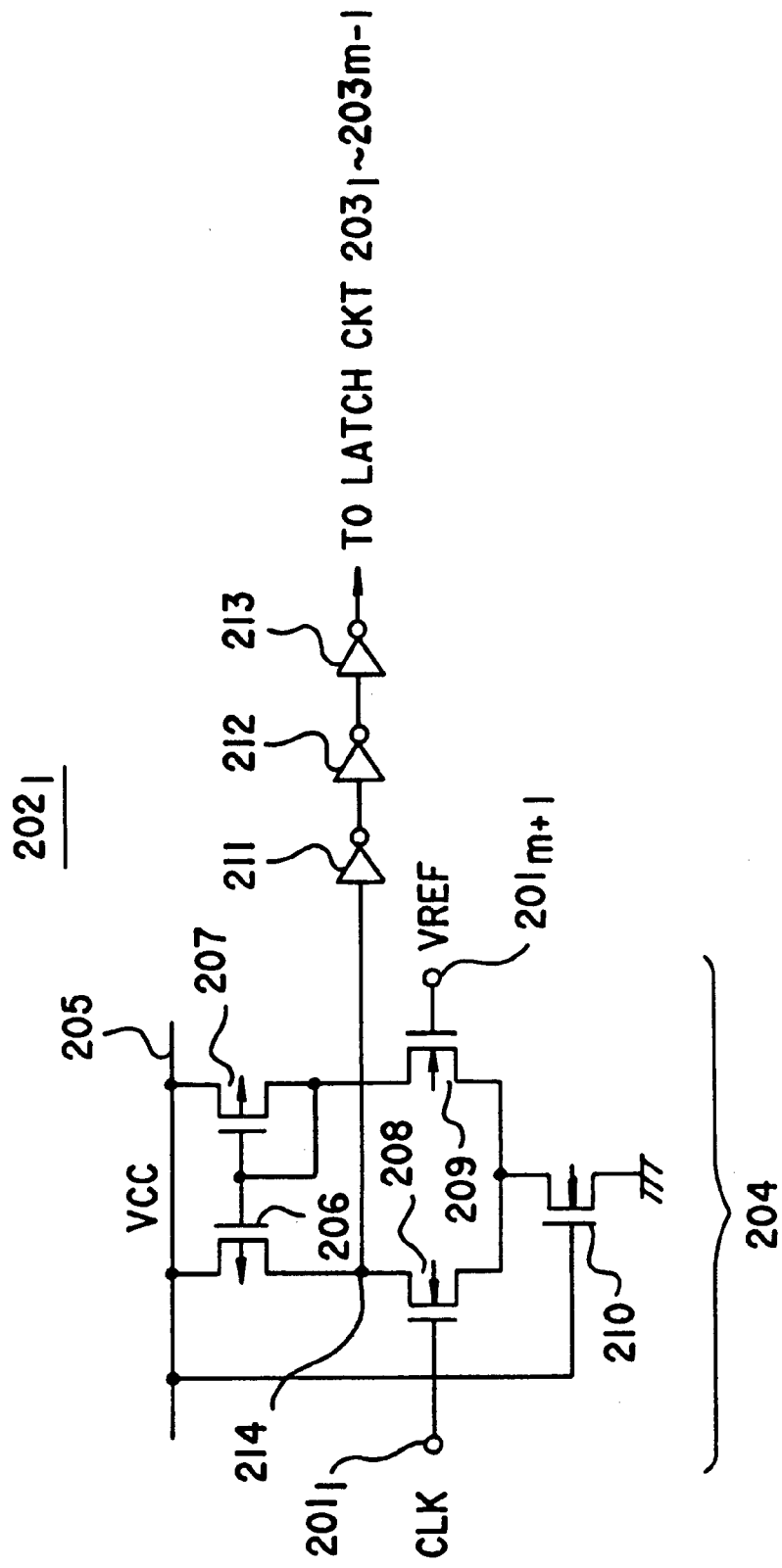
FIG. 22 is a circuit diagram showing an input circuit of the conceivable SDRAM.

The input circuit $202_1$ shown in FIG. 22 includes a differential amplifier circuit 204, a VCC power line 205 for supplying a power supply voltage VCC of 3 V, for example, and inverters 211 through 213. The differential amplifier circuit 204 includes enhancement type pMOS transistors 206 and 207 which form a current mirror circuit and constitute loads, enhancement type nMOS transistors 208 and 209 forming driving transistors, and an enhancement type nMOS transistor 210 that functions as a resistor element. The inverters 211 through 213 are provided for shaping waveforms, and an output of the inverter 213 is connected to clock signal input terminals of the latch circuits $203_1$ through $203_{m-1}$ shown in FIG. 21.

In this input circuit $202_1$ shown in FIG. 22, when the clock signal CLK has the high level, the nMOS transistor 208 turns ON, the nMOS transistor 209 turns OFF, and the voltage at a node 214 assumes a low level. As a result, the output level of the inverter 211 becomes high, the output level of the inverter 212 becomes low, the output level of the inverter 213 becomes high, and this high-level output of the inverter 213 is supplied to the clock signal input terminals of the latch circuits $203_1$ through $203_{m-1}$.

On the other hand, when the clock signal CLK has the low level, the nMOS transistor 208 turns OFF, the nMOS transistor 209 turns ON, and the voltage at the node 214 assumes a high level. As a result, the output level of the inverter 211 becomes low, the output level of the inverter 212 becomes high, the output level of the inverter 213 becomes low, and this low-level output of the inverter 213 is supplied to the clock signal input terminals of the latch circuits $203_1$ through $203_{m-1}$.

In the differential amplifier circuit 204 which forms an initial stage circuit of the input circuit $202_1$, the gate of the nMOS transistor 210 that functions as the resistor element is connected to the VCC power line 205. Hence, the nMOS transistor 210 is constantly ON, and a current always flows in the differential amplifier circuit 204.

In addition, the input circuits $202_1$ through $202_m$ have the same circuit construction. For this reason, each of the input circuits $202_2$ through $202_m$ also have as an initial stage circuit a differential amplifier circuit having the same circuit construction as the differential amplifier circuit 204, and a current always flows in the differential amplifier circuit of each of the input circuits $202_2$ through $202_m$.

Therefore, according to the conceivable SDRAM 2 shown in FIG. 21, the power consumption is large because a current always flows in the differential amplifier circuit that forms the initial stage circuit of each of the input circuits $202_1$ through $202_m$.

Accordingly, a description will now be given of fourth through seventh embodiments of the semiconductor device according to the present invention, in which the power consumption of the input circuit part can be reduced, by referring to FIGS. 23 through 32. In the fourth through seventh embodiments, the present invention is applied to the SDRAM. In addition, in FIGS. 23, 26 and 27, those parts which are the same as those corresponding parts in FIG. 21 are designated by the same reference numerals, and a description thereof will be omitted.

Figure 23:
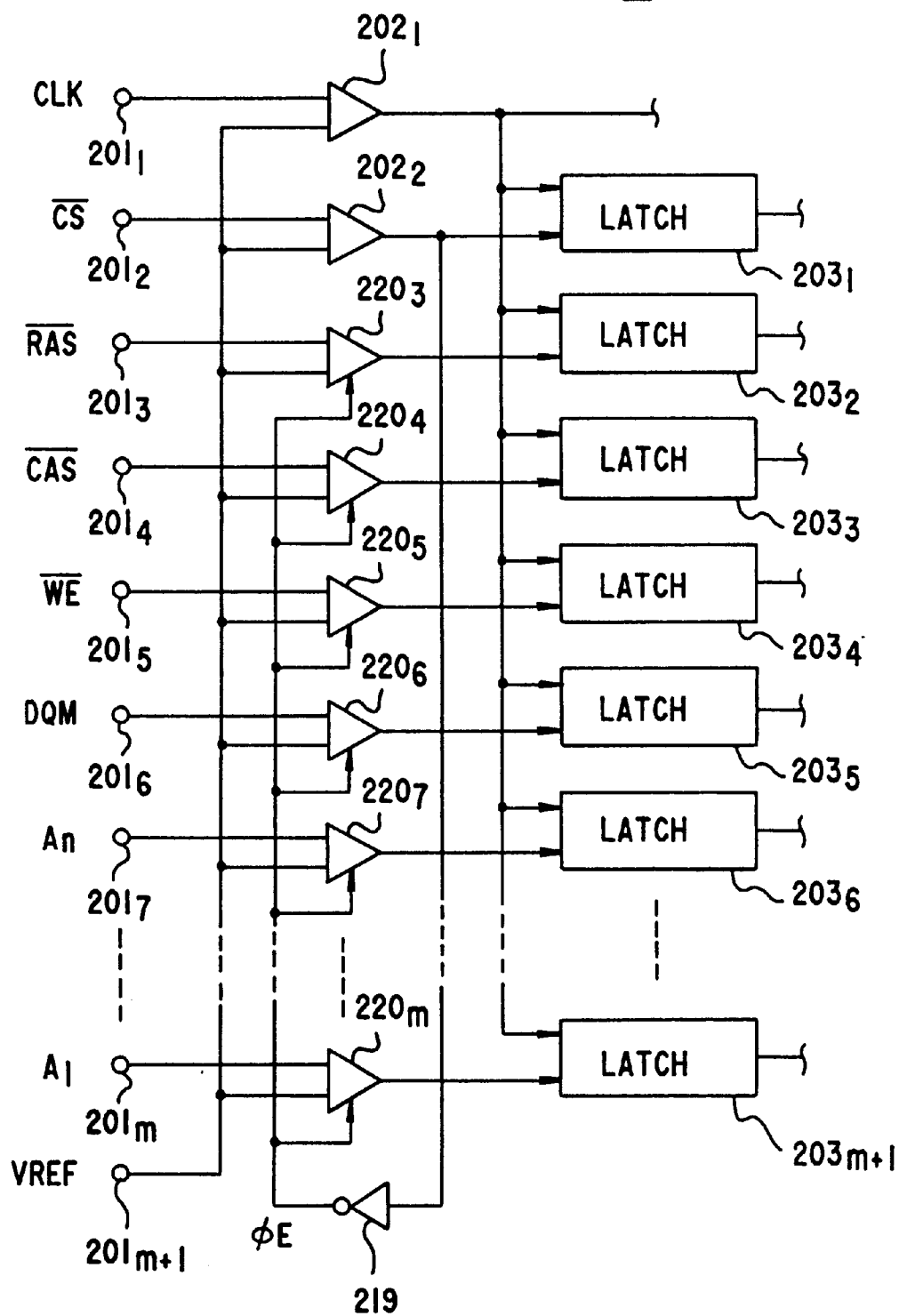
FIG. 23 is a circuit diagram showing a part of a fourth embodiment of the semiconductor device according to the present invention.

The fourth embodiment will be described with reference to FIGS. 23 through 25. FIG. 23 shows the construction of a part of the fourth embodiment. In this embodiment, an inverter 219 is provided. This inverter 219 inverts the chip select signal /CS output from the input circuit $202_2$ that is provided with respect to the chip select signal /CS, and outputs an activation signal $\phi_E$ for activating the differential amplifier circuit.

In addition, with respect to the control signals /RAS, /CAS, /WE and DQM which are other than the chip select signal /CS and the bits $A_n$ through $A_1$ of the address signal, input circuits $220_3$ through $220_m$ are provided in place of the input circuits $202_3$ through $202_m$ shown in FIG. 21. The active/inactive states of the input circuits $220_3$ through $220_m$ are controlled by the activation signal $\phi_E$ output from the inverter 219.

The other parts of the SDRAM 2 shown in FIG. 23 are the same as those of the SDRAM 2 shown in FIG. 21.

The input circuits $220_3$ through $220_m$ have the same circuit construction. For example, the input circuit $220_3$ has the construction shown in FIG. 24.

Figure 24:
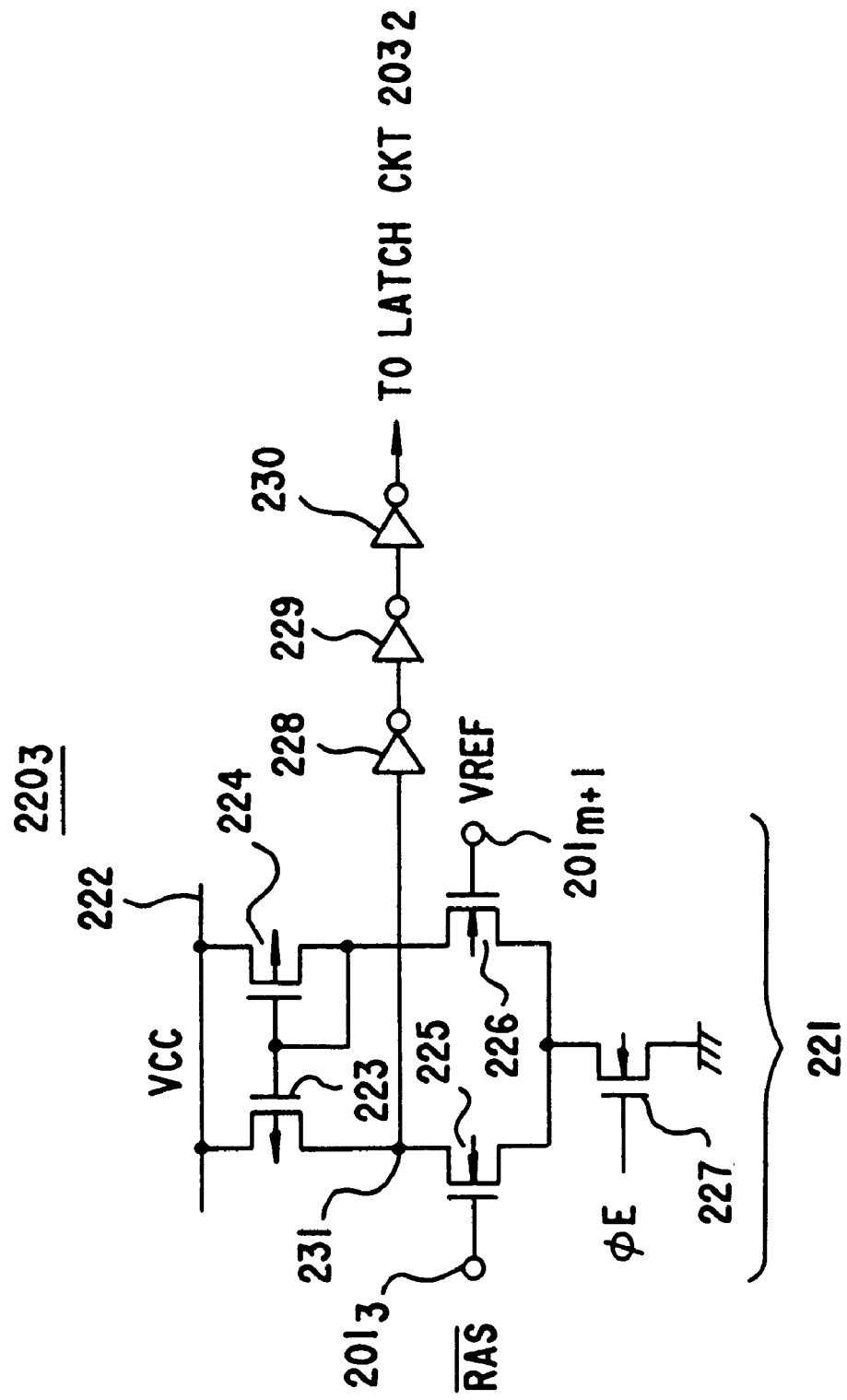
FIG. 24 is a circuit diagram showing an input circuit of the fourth embodiment.

The input circuit $220_3$ shown in FIG. 24 includes a differential amplifier circuit 221, a VCC power line 222 for supplying the power supply voltage VCC, and inverters 228 through 230. The differential amplifier circuit 221 includes enhancement type pMOS transistors 223 and 224 which form a current mirror circuit and constitute loads, enhancement type nMOS transistors 225 and 226 forming driving transistors, and an enhancement type nMOS transistor 227 that functions as a resistor element. The gate of this nMOS transistor 227 is connected to the output end of the inverter 219, and the ON/OFF state of this nMOS transistor 227 is controlled by the activation signal $\phi_E$. The inverters 228 through 230 are provided for shaping waveforms, and an output of the inverter 230 is connected to a row address strobe signal input terminal of the latch circuit $203_2$ shown in FIG. 23.

In the input circuit $220_3$, when the activation signal $\phi_E$ has a low level, the nMOS transistor 227 turns OFF and the differential amplifier circuit 221 is put into an inactive state.

On the other hand, when the activation signal $\phi_E$ has a high level, the nMOS transistor 227 turns ON and the differential amplifier circuit 221 is put into an active state.

In this case, when the row address strobe signal /RAS has a high level, the nMOS transistor 225 turns ON, the nMOS transistor 226 turns OFF, and the voltage at a node 231 assumes a low level. As a result, the output level of the inverter 228 becomes high, the output level of the inverter 229 becomes low, the output level of the inverter 230 becomes high, and this high-level output of the inverter 230 is supplied to the row address strobe signal input terminal of the latch circuit $203_2$.

On the other hand, when the row address strobe signal /RAS has a low level, the nMOS transistor 225 turns OFF, the nMOS transistor 226 turns ON, and the voltage at the node 231 assumes a high level. As a result, the output level of the inverter 228 becomes low, the output level of the inverter 229 becomes high, the output level of the inverter 230 becomes low, and this low-level output of the inverter 230 is supplied to the row address strobe signal input terminal of the latch circuit $203_2$.

According to this embodiment, when the chip select signal /CS supplied from the outside has a high level, the level of the chip select signal /CS output from the input circuit $202_2$ becomes high, the activation signal $\phi_E$ assumes the low level, and the differential amplifier circuits forming the initial stage circuits of the input circuits $220_3$ through $220_m$ assume the inactive state.

But when the chip select signal /CS supplied from the outside has a low level, the level of the chip select signal /CS output from the input circuit $202_2$ becomes low, the activation signal $\phi_E$ assumes the high level, and the differential amplifier circuits forming the initial stage circuits of the input circuits $220_3$ through $220_m$ assume the active state.

When the chip select signal /CS undergoes a transition from the high level to the low level, the activation signal $\phi_E$ undergoes a transition from the low level to the high level after a predetermined time delay. Hence, the timing of the chip select signal /CS must be determined by taking into consideration this predetermined time delay.

Figure 25:
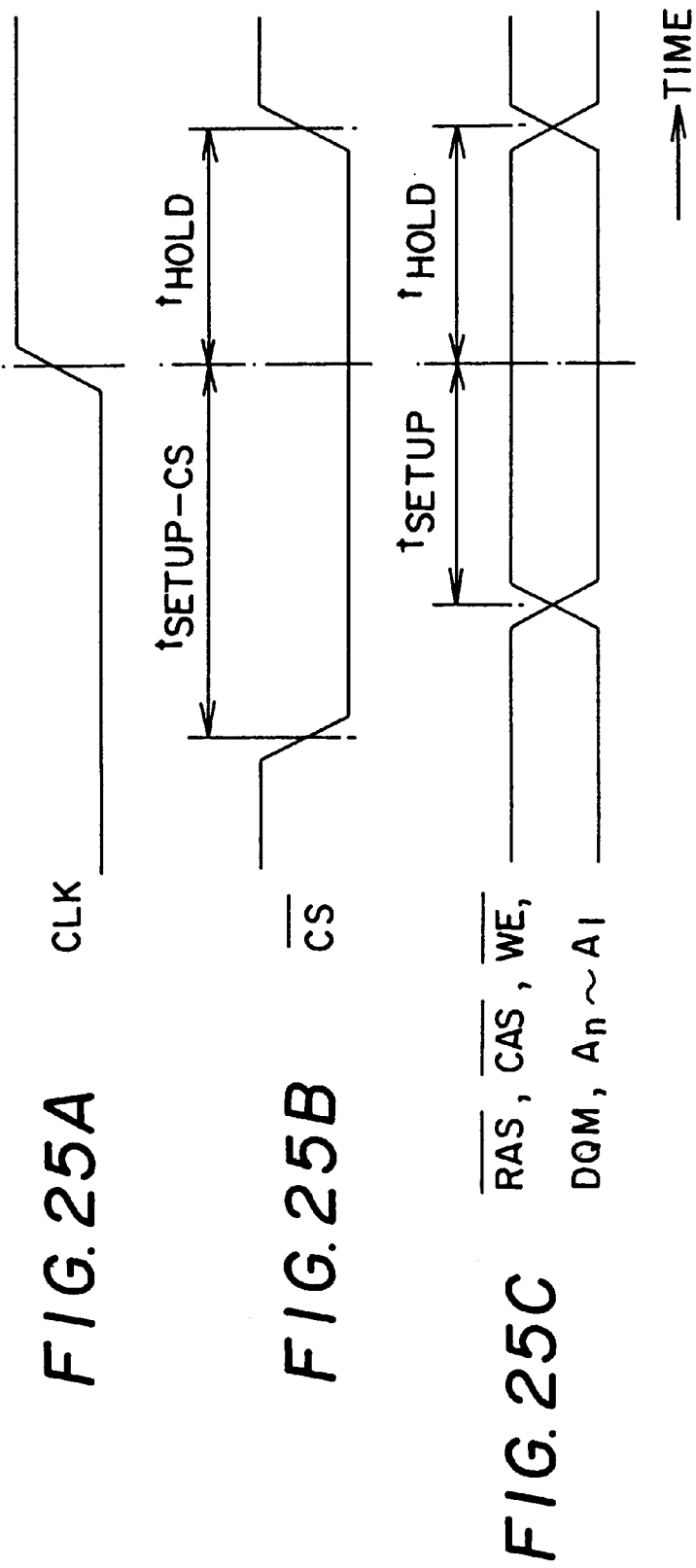
FIG. 25 is a timing chart for explaining the operation of the fourth embodiment.

FIG. 25 is a timing chart for explaining the input timing of the chip select signal /CS. FIG. 25 shows the timings of the clock signal CLK, the chip select signal /CS, and the control signals /RAS, /CAS and /WE other than the chip select signal /CS and the bits $A_n$ through $A_1$ of the address signal.

In other words, in this embodiment, when a set up time $t_{SETUP}$ required of the control signals and the address signal is 2 ns, for example, a set up time $t_{SETUP-CS}$ of the chip select signal /CS must be set longer than the set up time $t_{SETUP}$ by taking into consideration the time it takes for the differential amplifier circuits forming the initial stage circuits of the input circuits $220_3$ through $220_m$ to become active after the chip select signal /CS undergoes the transition from the high level to the low level.

In FIG. 25, a hold time $t_{HOLD}$ required of the control signals and the address signal is 2 ns, for example. The hold time $t_{HOLD}$ is sufficient as a hold time of the chip select signal /CS.

Therefore, according to this embodiment, the input circuits $220_3$ through $220_m$ become active only for a predetermined delay time from a time when the level of the chip select signal /CS becomes high after a predetermined delay time elapses from a time when the level of the chip select signal /CS becomes low. In other words, the input circuits $220_3$ through $220_m$ become active only during a time which is equal to or is approximately the same as the time in which the chip select signal /CS is active. The input circuits $220_3$ through $220_m$ are inactive during other times. As a result, because the input circuits $220_3$ through $220_m$ are not constantly active, it is possible to effectively reduce the power consumption of the input circuit part.

Figure 26:
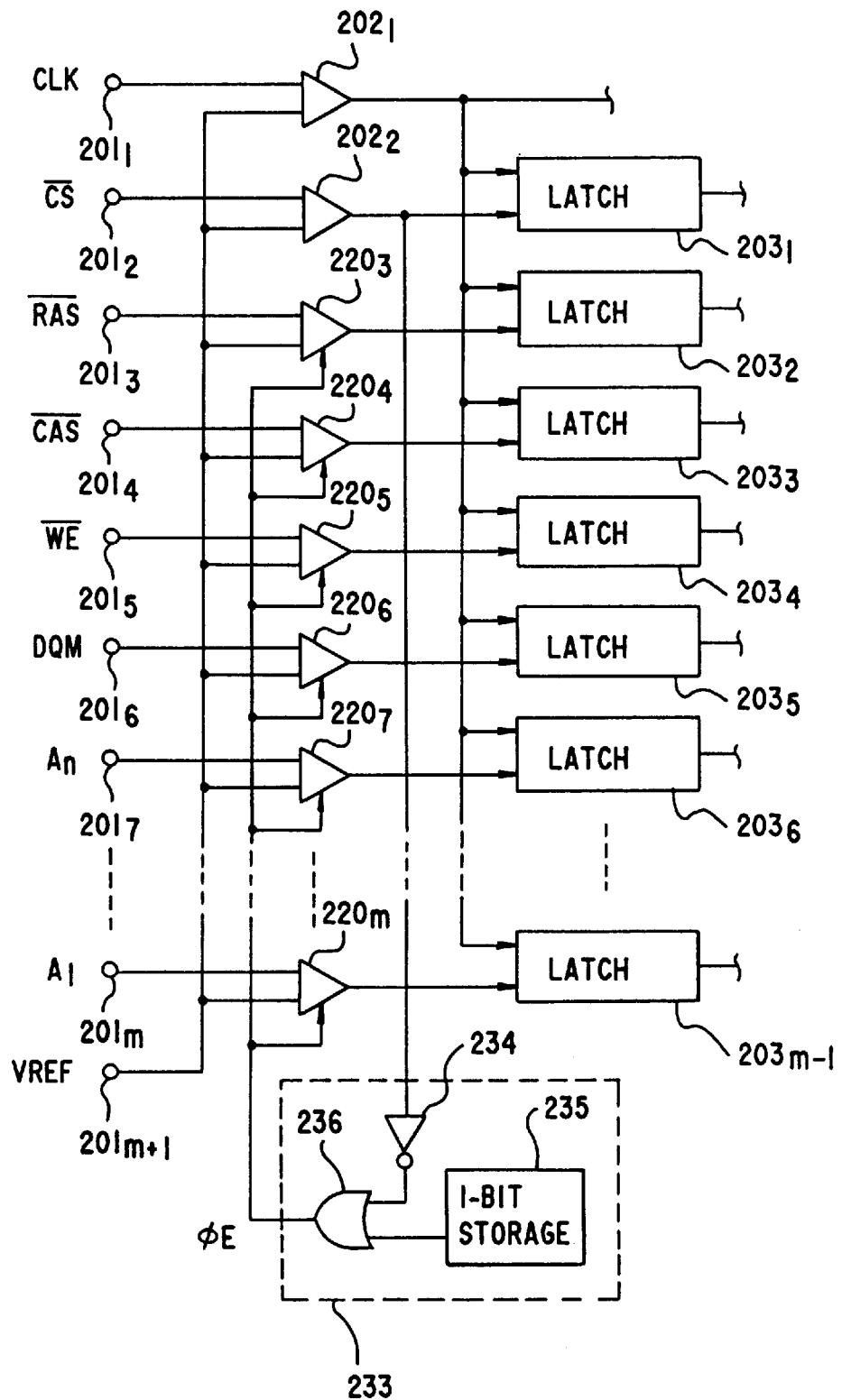
FIG. 26 is a circuit diagram showing a part of a fifth embodiment of the semiconductor device according to the present invention.

Next, a description will be given of a fifth embodiment of the semiconductor device according to the present invention, by referring to FIG. 26. FIG. 26 shows the construction of a part of the fifth embodiment. In this embodiment, a differential amplifier circuit activation circuit 233 is provided in place of a differential amplifier circuit activation circuit of the fourth embodiment including the inverter 219. The differential amplifier circuit activation circuit 233 has a construction different from that of the fourth embodiment. Otherwise, the fifth embodiment is basically the same as the fourth embodiment described above.

The differential amplifier circuit activation circuit 233 includes an inverter 234, a 1-bit storage circuit 235 and an OR circuit 236. The inverter 234 inverts the chip select signal /CS output from the input circuit $202_2$ that is provided with respect to the chip select signal /CS. The 1-bit storage circuit 235 stores a high or low level signal in response to a command signal made up of the control signals and the address signal, and outputs the stored high or low level signal. The OR circuit 36 obtains an OR of the output of the inverter 34 and the output of the 1-bit storage circuit 35, and outputs the activation signal $\phi_E$.

When the output level of the 1-bit storage circuit 235 is low, the output of the inverter 234 is supplied to the differential amplifier circuits forming the initial stage circuits of the input circuits $220_3$ through $220_m$ as the activation signal $\phi_E$. Hence, in this case, when the chip select signal /CS supplied from the outside has the high level, the level of the chip select signal /CS output from the input circuit $202_2$ is high, the output level of the inverter 234 is low, the level of the activation signal $\phi_E$ is low, and the differential amplifier circuits forming the initial stage circuits of the input circuits $220_3$ through $220_m$ are put into the inactive state.

On the other hand, when the chip select signal /CS supplied from the outside has the low level, the level of the chip select signal /CS output from the input circuit $202_2$ is low, the output level of the inverter 234 is high, the level of the activation signal $\phi_E$ is high, and the differential amplifier circuits forming the initial stage circuits of the input circuits $220_3$ through $220_m$ are put into the active state.

In other words, when the output level of the 1-bit storage circuit 235 is low, this embodiment operates similarly to the fourth embodiment. Hence, the differential amplifier circuits forming the initial stage circuits of the input circuits $220_3$ through $220_m$ are active only for a predetermined delay time from a time when the level of the chip select signal /CS becomes high after a predetermined delay time elapses from a time when the level of the chip select signal /CS becomes low. The input circuits $220_3$ through $220_m$ are inactive during other times. As a result, because the input circuits $220_3$ through $220_m$ are not constantly active, it is possible to effectively reduce the power consumption of the input circuit part.

On the other hand, when the output level of the 1-bit storage circuit 235 is high, the output of the OR circuit 236, that is, the activation signal $\phi_E$, is fixed to the high level, and the differential amplifier circuits forming the initial stage circuits of the input circuits $220_3$ through $220_m$ are constantly active. Hence, in this case, this embodiment operates similarly to the conceivable SDRAM shown in FIG. 21.

Therefore, according to this embodiment, it is possible to reduce the power consumption of the input circuit part similarly to the fourth embodiment when the output level of the 1-bit storage circuit 235 is low.

The 1-bit storage circuit 235 may have a known construction that stores the high or low level signal depending on whether or not a predetermined fuse is cut, the existence of a predetermined wiring, the existence of bonding with respect to a predetermined pad and the like. In such cases, it is possible to set the storage content of the 1-bit storage circuit 235 at the manufacturing stage of the semiconductor device.

Figure 27:
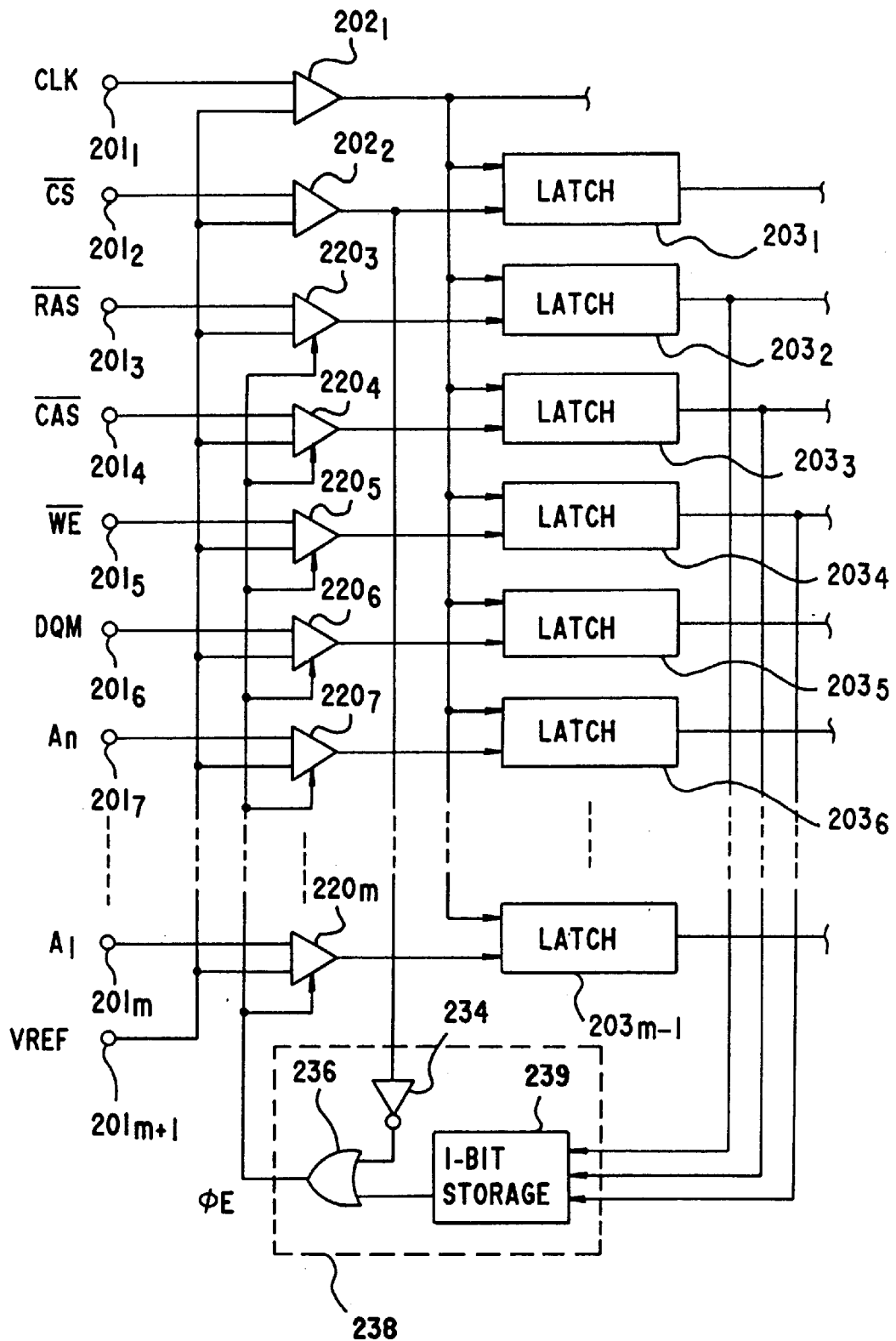
FIG. 27 is a circuit diagram showing a part of a sixth embodiment of the semiconductor device according to the present invention.

Next, a description will be given of a sixth embodiment of the semiconductor device according to the present invention, by referring to FIG. 27. FIG. 27 shows the construction of a part of the sixth embodiment. In this embodiment, a differential amplifier circuit activation circuit 238 is provided in place of the differential amplifier circuit activation circuit 233 of the fifth embodiment. The differential amplifier circuit activation circuit 238 has a construction different from the differential amplifier circuit activation circuit 233 of the fifth embodiment. Otherwise, the sixth embodiment is basically the same as the fifth embodiment described above.

The construction of the differential amplifier circuit activation circuit 238 is similar to that of the differential amplifier circuit activation circuit 233 except for a 1-bit storage circuit 239 which is provided in place of the 1-bit storage circuit 235.

The 1-bit storage circuit 239 receives the row address strobe signal /RAS output from the latch circuit 203₂, the column address strobe signal /CAS output from the latch circuit 203₃, and the write enable signal /WE output from the latch circuit 203₄.

Figure 28:
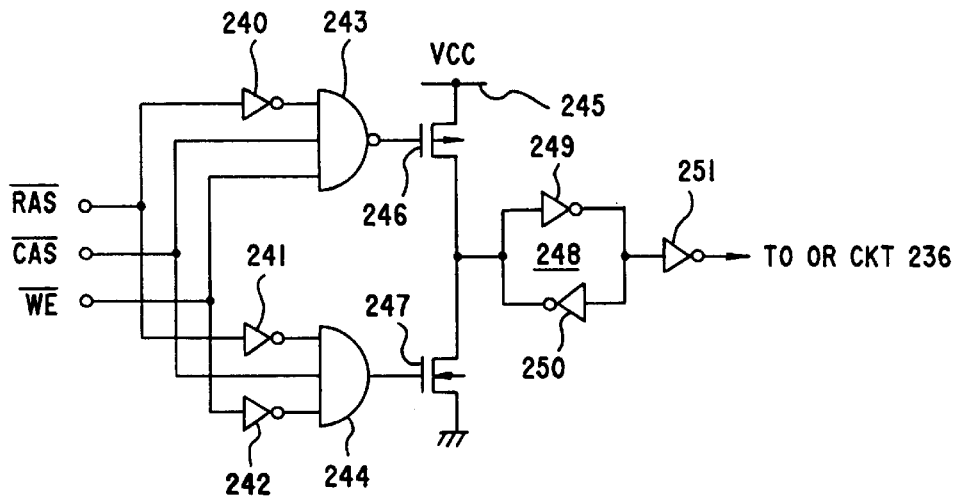
FIG. 28 is a circuit diagram showing a 1-bit storage circuit.

FIG. 28 shows the construction of the 1-bit storage circuit 239. The 1-bit storage circuit 239 shown in FIG. 28 includes inverters 240 through 242, a NAND circuit 243, an AND circuit 244, a VCC power line 245, an enhancement type pMOS transistor 246, an enhancement type nMOS transistor 247, a latch circuit 248, and an inverter 251 which are connected as shown.

The inverters 240 and 241 invert the row address strobe signal /RAS output from the latch circuit 203₂. The inverter 242 inverts the write enable signal /WE output from the latch circuit 203₄. The NAND circuit 43 obtains a NAND of the output of the inverter 240, the column address strobe signal / CAS output from the latch circuit 203₃, and the write enable signal /WE output from the latch circuit 203₄. The AND circuit 244 obtains an AND of the outputs of the inverters 241 and 242, and the column address strobe signal /CAS output from the latch circuit 203₃.

The VCC power line 245 supplies the power supply voltage VCC. The ON/OFF state of the pMOS transistor 246 is controlled by the output of the NAND circuit 243, and the ON/OFF state of the nMOS transistor 247 is controlled by the output of the AND circuit 244. The latch circuit 248 includes inverters 249 and 250. An output end of the inverter 251 is connected to the OR circuit 236 shown in FIG. 27.

Figure 29:
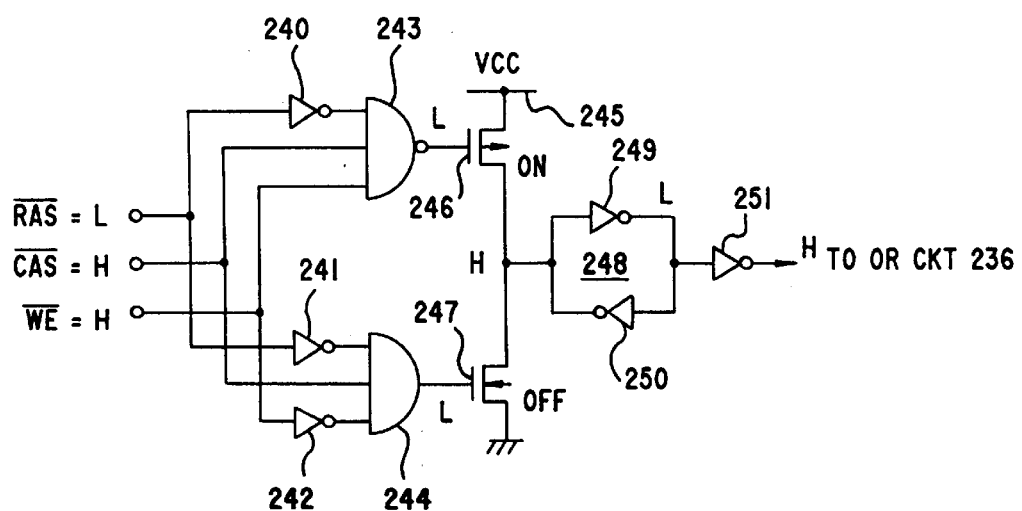
FIG. 29 is a circuit diagram for explaining the operation of the 1-bit storage circuit.

In the 1-bit storage circuit 239, when the level of the row address strobe signal /RAS is low, the level of the column address strobe signal /CAS is high and the level of the write enable signal /WE is high as shown in FIG. 29, that is, when an active command is input, the output level of the NAND circuit 243 becomes low, the pMOS transistor 246 turns ON, output level of the AND circuit 244 becomes low, and the nMOS transistor 247 turns OFF. As a result, the output level of the inverter 249 is set low and the output level of the inverter 250 is set high in the latch circuit 248, and the output level of the inverter 251 becomes high.

Accordingly, in this case, the output level of the OR circuit 236, that is, the level of the activation signal $\phi_E$, becomes high, and the differential amplifier circuits forming the initial stage circuits of the input circuits 220₃ through 220ₘ are constantly put into the active state. Hence, this embodiment in this case operates similarly to the conceivable SDRAM shown in FIG. 21.

Figure 30:
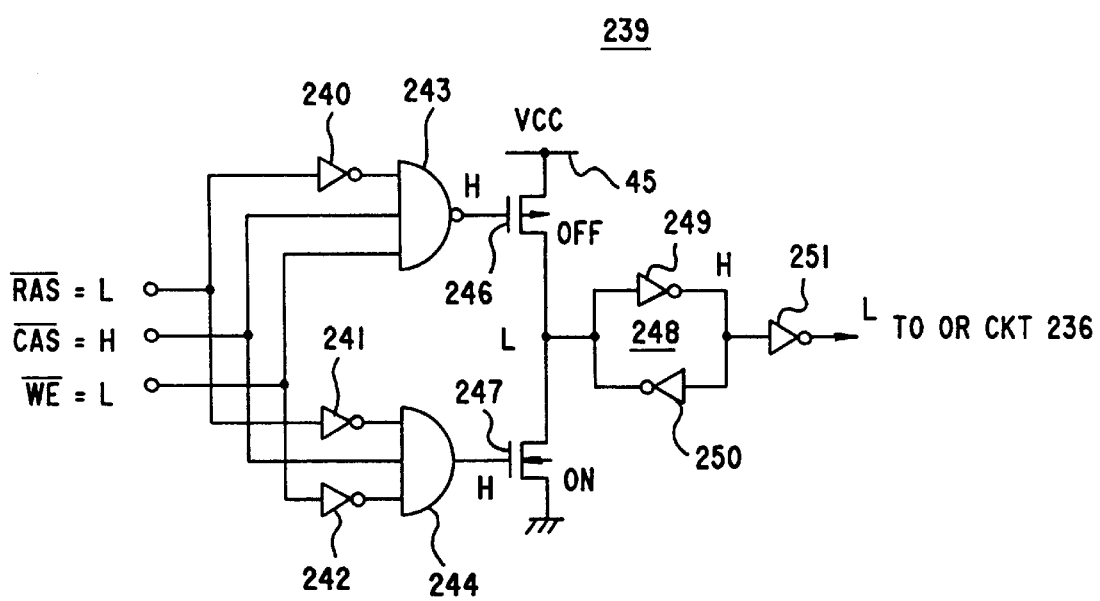
FIG. 30 is a circuit diagram for explaining the operation of the 1-bit storage circuit.

On the other hand, in the 1-bit storage circuit 239, when the level of the row address strobe signal /RAS is low, the level of the column address strobe signal /CAS is high and the level of the write enable signal /WE is low as shown in FIG. 30, that is, when a precharge command is input, the output level of the NAND circuit 243 becomes high, the pMOS transistor 246 turns OFF, output level of the AND circuit 244 becomes high, and the nMOS transistor 247 turns ON. As a result, the output level of the inverter 249 is set high and the output level of the inverter 250 is set low in the latch circuit 248, and the output level of the inverter 251 becomes low.

Accordingly, in this case, the output level of the OR circuit 236, that is, the output of the inverter 234 shown in FIG. 27 is supplied to the differential amplifier circuits forming the initial stage circuits of the input circuits 220₃ through 220ₘ as the activation signal $\phi_E$.

Hence, when the level of the chip select signal /CS supplied from the outside is high in this case, the level of the chip select signal /CS output from the input circuit 202₂ is high, the level of the activation signal $\phi_E$ is low, and the differential amplifier circuits forming the initial stage circuits of the input circuits 220₃ through 220ₘ are put into the inactive state.

But when the level of the chip select signal /CS supplied from the outside is low in this case, the level of the chip select signal /CS output from the input circuit 202₂ is low, the level of the activation signal $\phi_E$ is high, and the differential amplifier circuits forming the initial stage circuits of the input circuits 220₃ through 220ₘ are put into the active state.

In cases other than a case where the level of the row address strobe signal /RAS is low, the level of the column address strobe signal /CAS is high and the level of the write enable signal /WE is high and a case where the level of the row address strobe signal /RAS is low, the level of the column address strobe signal /CAS is high and the level of the write enable signal /WE is low, the output level of the NAND circuit 243 becomes high, the pMOS transistor 246 turns OFF, the output level of the AND circuit 244 becomes low, the nMOS transistor 247 turns OFF, and the latch circuit 248 maintains the previous state.

In this embodiment, an automatic refresh cycle is set 8 times after the power supply is turned ON. When the automatic refresh cycle ends, the operation automatically changes to a precharge operation Hence, after the power supply is turned ON, the latch circuit 248 maintains the high-level output of the inverter 249 and the low-level output of the inverter 250. Hence, the output level of the inverter 251 becomes low, and the output of the inverter 234 is output as the activation signal $\phi_E$. This activation signal $\phi_E$ is supplied to the input circuits 220₃ through 220ₘ, thereby making the differential amplifier circuits of the input circuits 220₃ through 220ₘ inactive.

Thereafter, when the active command is input, the chip select signal /CS undergoes a transition to the low level, thereby making the differential amplifier circuits forming the initial stage circuits of the input circuits 220₃ through 220ₘ active. Hence, the control signal /RAS, /CAS, /WE and DQM other than the chip select signal /CS and the bits $A_n$ through $A_1$ of the address signal are input.

When the active command is input, the output level of the inverter 249 is set low and the output level of the inverter 250 is set high in the latch circuit 248 as shown in FIG. 29. Thus, the output level of the inverter 251 becomes high. As a result, the level of the activation signal $\phi_E$ becomes high, and the differential amplifier circuits forming the initial stage circuits of the input circuits 220₃ through 220ₘ are constantly put into the active state, and this embodiment operates similarly to the conceivable SDRAM shown in FIG. 21.

Thereafter, when the precharge command is input, the output level of the inverter 249 is set high and the output level of the inverter 250 is set low in the latch circuit 248 as shown in FIG. 30. Thus, the output level of the inverter 251 becomes low. As a result, the output of the inverter 234 is supplied to the differential amplifier circuits forming the initial stage circuits of the input circuits 220₃ through 220ₘ as the activation signal $\phi_E$, and this embodiment operates similarly to the fourth embodiment. This state is maintained until the active command is input thereafter.

If the chip select signal /CS undergoes a transition from the high level to the low level when inputting the active command, the activation signal $\phi_E$ undergoes a transition from the low level to the high level after a predetermined time delay. For this reason, the input timing of the chip select signal /CS when inputting the active command must be determined by taking into consideration this predetermined delay time.

Figure 31:
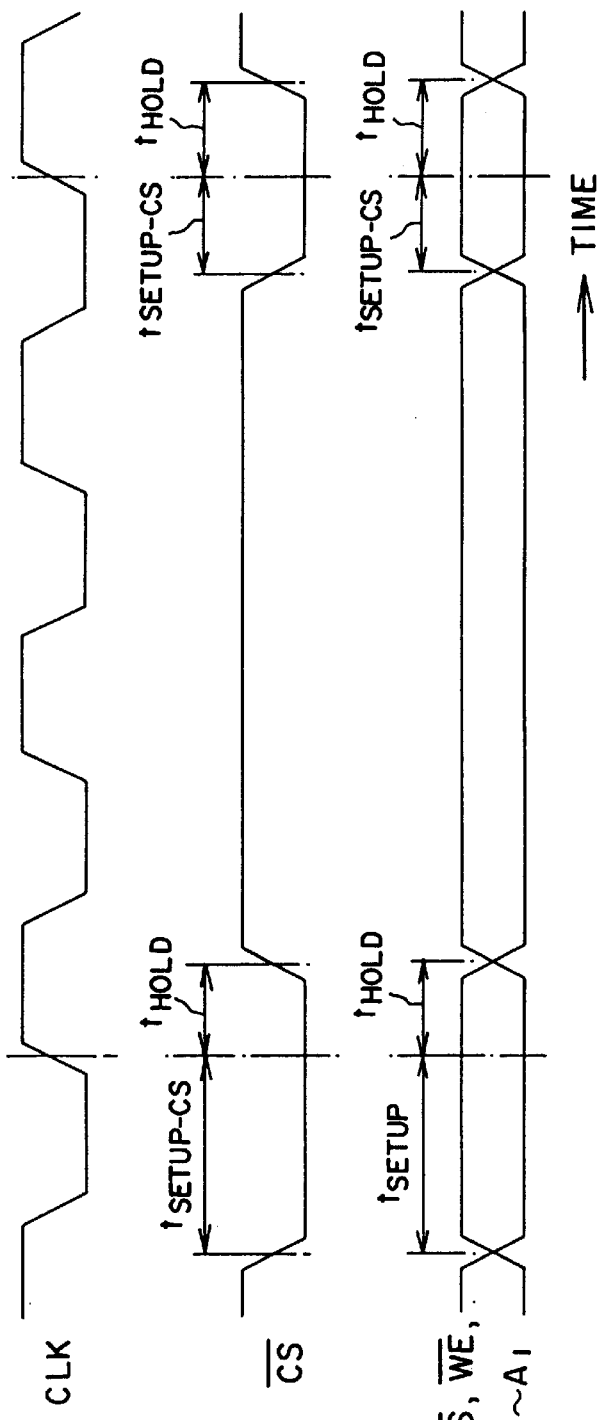
FIG. 31 is a timing chart for explaining the input timing of a chip select signal when inputting an active command.

FIG. 31 is a timing chart for explaining the input timing of the chip select signal /CS when inputting the active command. FIG. 31 shows the clock signal CLK, the chip select signal /CS, and the control signals /RAS, /CAS, /WE and DQM other than the chip select signal /CS and the bits $A_n$ through $A_1$ of the address signal.

In other words, in this embodiment, when the set up time $t_{SETUP}$ required of the control signals and the address signal is 2 ns, for example, the set up time $t_{SETUP-CS}$ of the chip select signal /CS when inputting the active command must be set longer than the set up time $t_{SETUP}$ by taking into consideration the time it takes for the differential amplifier circuits forming the initial stage circuits of the input circuits $220_3$ through $220_m$ to become active after the chip select signal /CS undergoes the transition from the high level to the low level.

However, after the active command is inputs the differential amplifier circuits forming the initial stage circuits of the input circuit $220_3$ through $220_m$ are constantly put into the active state, similarly to the conceivable SDRAM shown in FIG. 21, until the precharge command is input. Hence, in this case, it is sufficient for the set up time $t_{SETUP-CS}$ of the chip select signal /CS to be the same as the set up time $t_{SETUP}$.

In FIG. 31, the hold time $t_{HOLD}$ required of the control signals and the address signal is 2 ns, for example. The hold time $t_{HOLD}$ is sufficient as the hold time of the chip select signal /CS.

Therefore, according to this embodiment, the differential amplifier circuits forming the initial stage circuits of the input circuits $220_3$ through $220_m$ become active only for a time from the time when the chip select signal /CS undergoes a transition to the low level to a time when the precharge command is input, when inputting the active command. The differential amplifier circuits forming the initial stage circuits of the input circuits $220_3$ through $220_m$ are inactive during other times. As a result, because the differential amplifier circuits forming the initial stage circuits of the input circuits $220_3$ through $220_m$ are not constantly active, it is possible to effectively reduce the power consumption of the input circuit part.

Figure 32:
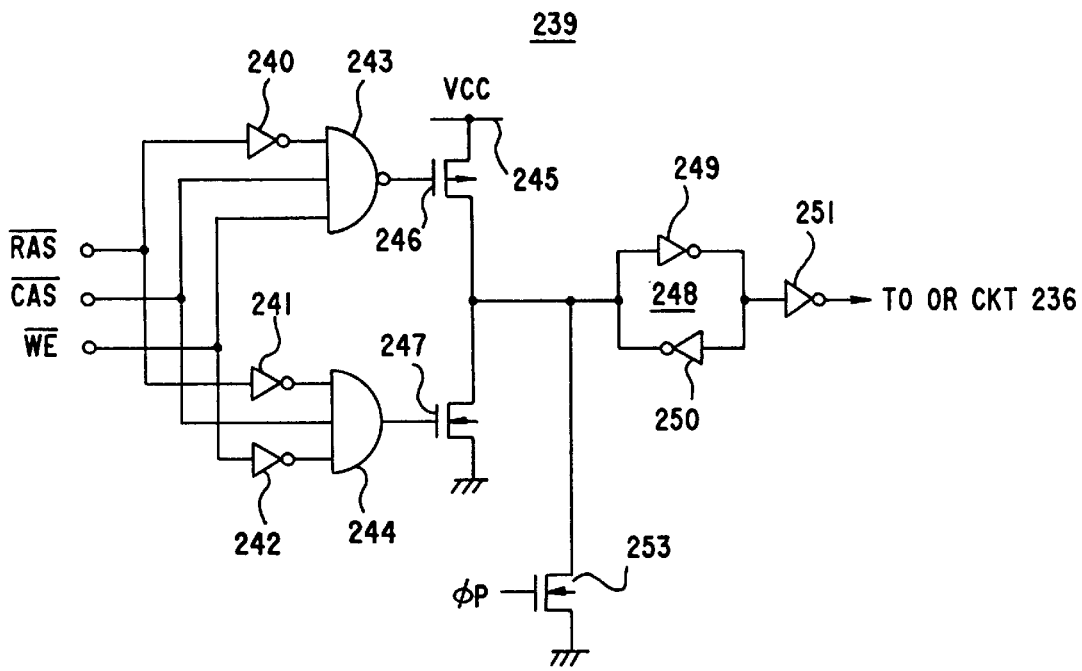
FIG. 32 is a circuit diagram showing a 1-bit storage circuit of a seventh embodiment of the semiconductor device according to the present invention.

Next, a description will be given of a seventh embodiment of the semiconductor device according to the present invention, by referring to FIG. 32. This embodiment uses a 1-bit storage circuit 239 shown in FIG. 32 in place of the 1-bit storage circuit 239 of the sixth embodiment shown in FIG. 28. Otherwise, this embodiment is basically the same as the sixth embodiment. In FIG. 32, those parts which are the same as those corresponding parts in FIG. 28 are designated by the same reference numerals, and a description thereof will be omitted.

The 1-bit storage circuit 239 shown in FIG. 32 is provided with an nMOS transistor 253. Otherwise, the 1-bit storage circuit 239 shown in FIG. 32 is basically the same as the 1-bit storage circuit 239 shown in FIG. 28.

The drain of the nMOS transistor 253 is connected to the input end of the latch circuit 248, that is, to the input end of the inverter 249. The source of the nMOS transistor 253 is grounded. In addition, an automatic precharge change signal $\phi_P$ is supplied to the gate of the nMOS transistor 253.

The automatic precharge change signal $\phi_P$ has a high level for a predetermined time when automatically changing to the precharge operation, and otherwise maintains a low level. This automatic precharge change signal $\phi_P$ is generated inside the semiconductor device. For example, the automatic changing to the precharge operation occurs when a write operation is carried out and the operation changes thereafter to the precharge operation in conformance with a write with automatic precharge command which instructs the automatic precharge operation.

The nMOS transistor 253 turns OFF when the level of the automatic precharge change signal $\phi_P$ is low, and the nMOS transistor 253 turns ON when the level of the automatic precharge change signal $\phi_P$ is high.

In this embodiment, the automatic refresh cycle is also set 8 times after the power supply is turned ON. However, the operation automatically changes to the precharge operation when the automatic refresh cycle ends.

Accordingly, after the power supply is turned ON, the latch circuit 248 maintains the high output level of the inverter 249 and the low output level of the inverter 250, and the output level of the inverter 251 becomes low. The output of the inverter 234 is output as the activation signal $\phi_E$, thereby putting the differential amplifier circuits forming the initial stage circuits of the input circuits $220_3$ through $220_m$ into the inactive state.

Thereafter, when the active command is input, the pMOS transistor 246 turns ON and the nMOS transistor 247 turns OFF. Hence, the output level of the inverter 249 becomes low and the output level of the inverter 250 becomes high in the latch circuit 248, and the output level of the inverter 251 becomes high. As a result, the level of the activation signal $\phi_E$ becomes high, and the differential amplifier circuits forming the initial stage circuits of the input circuits $220_3$ through $220_m$ are constantly put into the active state. Hence, in this case, this embodiment operates similarly to the conceivable SDRAM shown in FIG. 21.

Thereafter, when the precharge command is input, the pMOS transistor 246 turns OFF and the nMOS transistor 247 turns ON. Thus, the output level of the inverter 249 becomes high, the output level of the inverter 250 becomes low, and the output level of the inverter 251 becomes low. As a result, the output of the inverter 234 is supplied to the differential amplifier circuits forming the initial stage circuits of the input circuits $220_3$ through $220_m$ as the activation signal $\phi_E$, and this embodiment is set so as to operate similarly to the fourth embodiment. This state is maintained until the active command is input thereafter.

In addition, after the level of the activation signal $\phi_E$ becomes high and the differential amplifier circuits forming the initial stage circuits of the input circuits $220_3$ through $220_m$ are put into the active state, the level of the automatic precharge change signal $\phi_P$ becomes high and the nMOS transistor 253 turns ON when the operation changes to the precharge operation in conformance with the write with automatic precharge command. As a result, the output level of the inverter 249 becomes high and the output level of the inverter 250 becomes low in the latch circuit 248, and the output level of the inverter 251 becomes low.

Accordingly, the output of the inverter 234 is also supplied in this case to the differential amplifier circuits forming the initial stage circuits of the input circuits $220_3$ through $220_m$ as the activation signal $\phi_E$. Hence, in this case, this embodiment is set to operate similarly to the fourth embodiment, and this state is maintained until the active command is thereafter input.

If the chip select signal /CS undergoes a transition from the high level to the low level when inputting the active command, the activation signal $\phi_E$ undergoes a transition from the low level to the high level after a predetermined delay time. Hence, similarly to the sixth embodiment, it is necessary to determine the input timing of the chip select signal /CS by taking into consideration this predetermined delay time when inputting the active command.

Therefore, according to this embodiment, the differential amplifier circuits forming the initial stage circuits of the input circuits $220_3$ through $220_m$ are put into the active state during a time from a time when the chip select signal /CS undergoes a transition to the low level to a time when the precharge command is input or, during a time from a time when the chip select signal /CS undergoes a transition to the low level to a time when the operation changes to a precharge operation in conformance with the write with automatic precharge command, when inputting the active command. The differential amplifier circuits forming the initial stage circuits of the input circuits $220_3$ through $220_m$ are put into the inactive state during other times, and will not constantly assume the active state. For this reason, it is possible to reduce the power consumption of the input circuit part.

Figure 34:
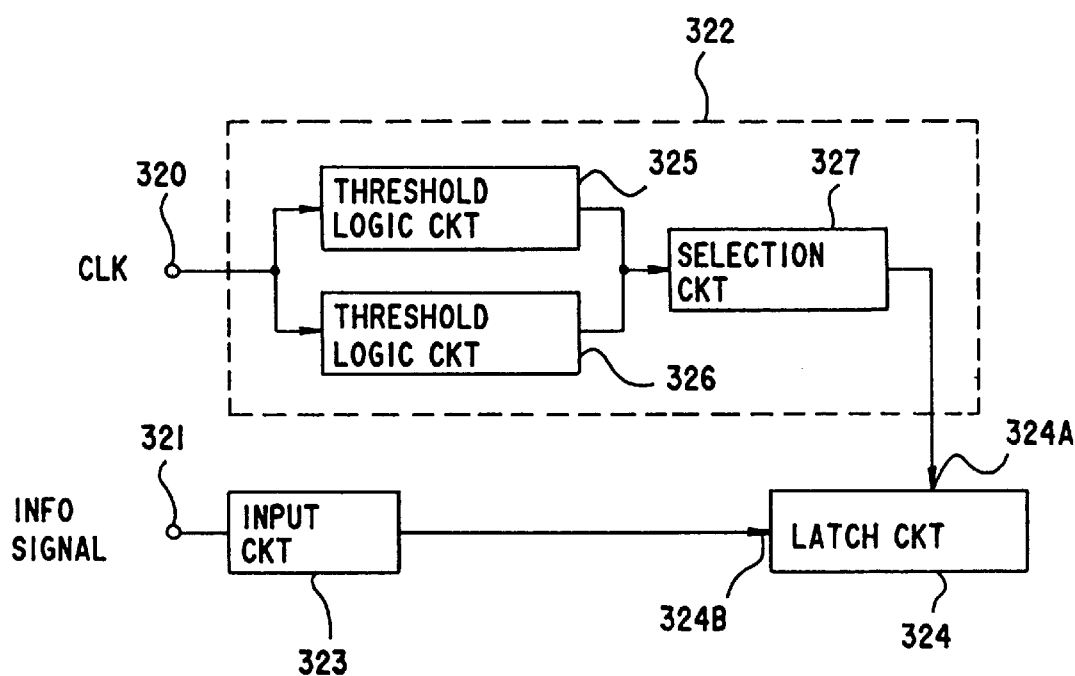
FIG. 34 is a system block diagram for explaining the operating principle of an eighth embodiment of the semiconductor device according to the present invention.

FIG. 34 shows another construction of the input circuit $202_1$ shown in FIG. 21. In FIG. 34, those parts which are the same as those corresponding parts in FIG. 22 are designated by the same reference numerals, and a description thereof will be omitted.

The input circuit $202_1$ shown in FIG. 34 includes a differential amplifier circuit 204, a VCC power line 205 for supplying a power supply voltage VCC of 3.3 V, for example, and inverters 211 through 213. The differential amplifier circuit 204 includes enhancement type pMOS transistors 206 and 207, enhancement type nMOS transistors 208 and 209, an enhancement nMOS transistor 210, and enhancement type pMOS transistors 281 and 282. The enhancement type pMOS transistors 206 and 207 are a kind of p-channel metal insulator semiconductor (MIS) transistor, form a current mirror circuit, and constitute loads. The enhancement type nMOS transistors 208 and 209 are a kind of n-channel MIS transistor, and form driving transistors. The enhancement type nMOS transistor 210 functions as a resistor element, and is turned ON/OFF by the activation signal $\phi_E$. The ON/OFF states of the enhancement type pMOS transistors 281 and 282 are also controlled by the activation signal $\phi_E$. The inverters 211 through 213 are provided for shaping waveforms, and an output of the inverter 213 is connected to clock signal input terminals of the latch circuits $203_1$ through $203_{m-1}$ shown in FIG. 21.

Figure 33:
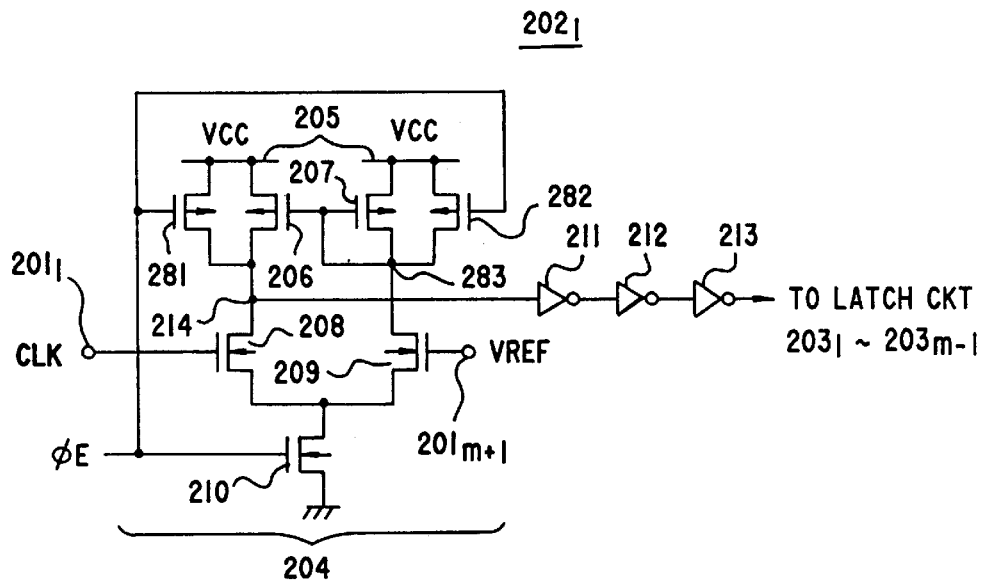
FIG. 33 is a circuit diagram showing another construction of the input circuit shown in FIG. 21.

In the differential amplifier circuit 204 shown in FIG. 33, a threshold voltage $V_{IH}$ on the high level side is 1.7 V, and a threshold voltage $V_{IL}$ on the low level side is 1.3 V.

When the activation signal $\phi_E$ has the high level, the nMOS transistor 210 turns ON, the pMOS transistors 281 and 282 turn OFF, and the differential amplifier circuit 204 is put into the active state in the input circuit $202_1$ shown in FIG. 33.

In this input circuit $202_1$ shown in FIG. 33, when the clock signal CLK has the high level, the nMOS transistor 208 turns ON, the nMOS transistor 209 turns OFF, and the voltage at a node 214 assumes a low level. As a result, the output level of the inverter 211 becomes high, the output level of the inverter 212 becomes low, the output level of the inverter 213 becomes high, and this high-level output of the inverter 213 is supplied to the clock signal input terminals of the latch circuits $203_1$ through $203_{m-1}$.

On the other hand, when the clock signal CLK has the low level, the nMOS transistor 208 turns OFF, the nMOS transistor 209 turns ON, and the voltage at the node 214 assumes a high level. As a result, the output level of the inverter 211 becomes low, the output level of the inverter 212 becomes high, the output level of the inverter 213 becomes low, and this low-level output of the inverter 213 is supplied to the clock signal input terminals of the latch circuits $203_1$ through $203_{m-1}$.

In addition, when the activation signal $\phi_E$ has the low level, the nMOS transistor 210 turns OFF, the pMOS transistors 281 and 282 turn ON, and the differential amplifier circuit 204 is put into the inactive state. Furthermore, the output of the differential amplifier circuit 204 is fixed to the high level.

Prior to forwarding the semiconductor devices such as the SDRAM shown in FIG. 21, a so-called burn-in test is carried out to eliminate the semiconductor devices including latent defects. The burn-in test tests the operation of the semiconductor devices for a predetermined time under a high temperature condition.

For example, 100 to 200 semiconductor devices are mounted on a so-called burn-in board which is used for the burn-in test. For this reason, the length of the wirings on the burn-in board becomes long, and the rise and fall of the clock signal CLK become considerably slow. If noise is mixed into the rising or falling waveform of the clock signal CLK, erroneous operations will be carried out in the latch circuits $203_1$ through $203_{m-1}$, and it will become impossible to carry out a normal burn-in test.

Next, a description will be given of an eighth embodiment of the semiconductor device according to the present invention that enables a normal burn-in test even if noise is mixed into the clock signal CLK when carrying out the burn-in test.

First, a description will be given of the operating principle of this eighth embodiment, by referring to FIG. 34. A semiconductor device shown in FIG. 34 includes a clock signal input terminal 320, an information signal input terminal 321, an input circuit 322, an input circuit 323, and a latch circuit 324 which are connected as shown in FIG. 34.

The clock signal CLK is supplied to the clock signal input terminal 320 from the outside, and an information signal is supplied to the information signal input terminal 321 from the outside.

The input circuit 322 amplifies the clock signal CLK received via the clock signal input terminal 320. The input circuit 323 amplifies the information signal received via the information signal input terminal 321. The latch circuit 324 latches the information signal output from the input circuit 323 with a timing determined by the rising or falling edge of the clock signal CLK output from the input circuit 322. The latch circuit 324 has a clock signal input terminal 324A which receives the clock signal CLK, and an information signal input terminal 324B which receives the information signal.

The input circuit 322 includes threshold logic circuits 325 and 326, and a selection circuit 327. The threshold logic circuit 326 has a high-level threshold value $V_{IH}$ that is higher than that of the threshold logic circuit 325. In addition, the threshold logic circuit 326 has a low-level threshold value $V_{IL}$ that is lower than that of the threshold logic circuit 325. The threshold logic circuit 326 is inactive during the normal operation, and is active during the burn-in test. The selection circuit 327 selectively outputs the clock signal CLK that is output from the threshold logic circuit 325 to the clock signal input terminal 324A of the latch circuit 324 during the normal operation. On the other hand, the selection circuit 327 selectively outputs the clock signal CLK that is output from the threshold logic circuit 326 to the clock signal input terminal 324A of the latch circuit 324 during the burn-in test.

The high-level threshold value $V_{IH}$ of the threshold logic circuit 326 is higher than that of the threshold logic circuit 325, and the low-level threshold value $V_{IL}$ of the threshold logic circuit 326 is lower than that of the threshold logic circuit 325, so that the threshold logic circuit 326 is stronger against noise compared to the threshold logic circuit 325. When carrying out the burn-in test, the clock signal CLK output from the threshold logic circuit 326 is supplied to the clock signal input terminal 324A of the latch circuit 324.

Therefore, even if the noise mixes into the rising or falling waveform of the clock signal CLK when carrying out the burn-in test, it is possible to prevent an erroneous operation from being carried out so that the burn-in test can be carried out in a normal manner.

Next, a more detailed description will be given of the eighth embodiment, by referring to FIGS. 35 through 40. In this embodiment, the present invention is applied to the SDRAM.

Figure 35:
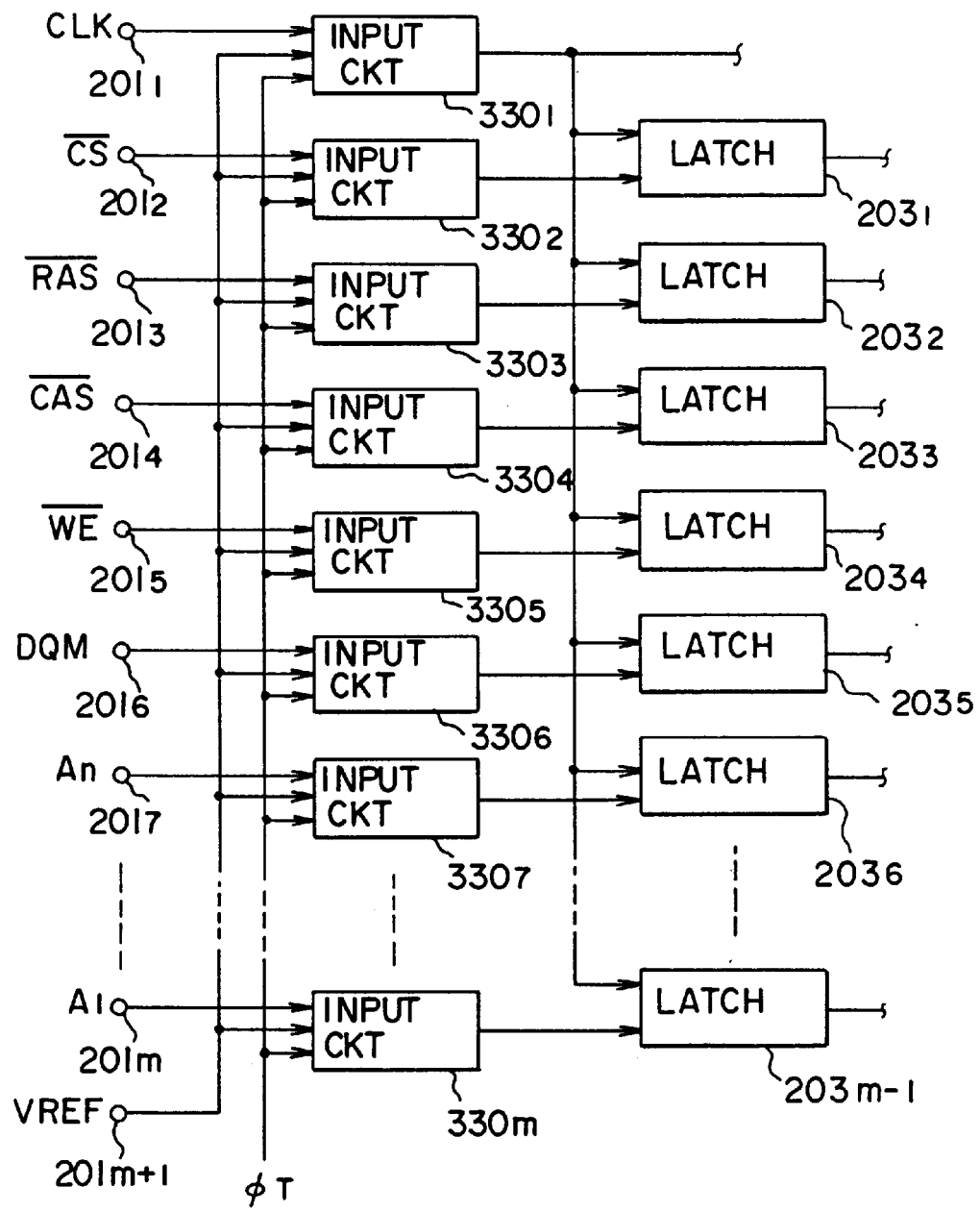
FIG. 35 is a system block diagram showing the eighth embodiment of the semiconductor device according to the present invention.
Figure 36:
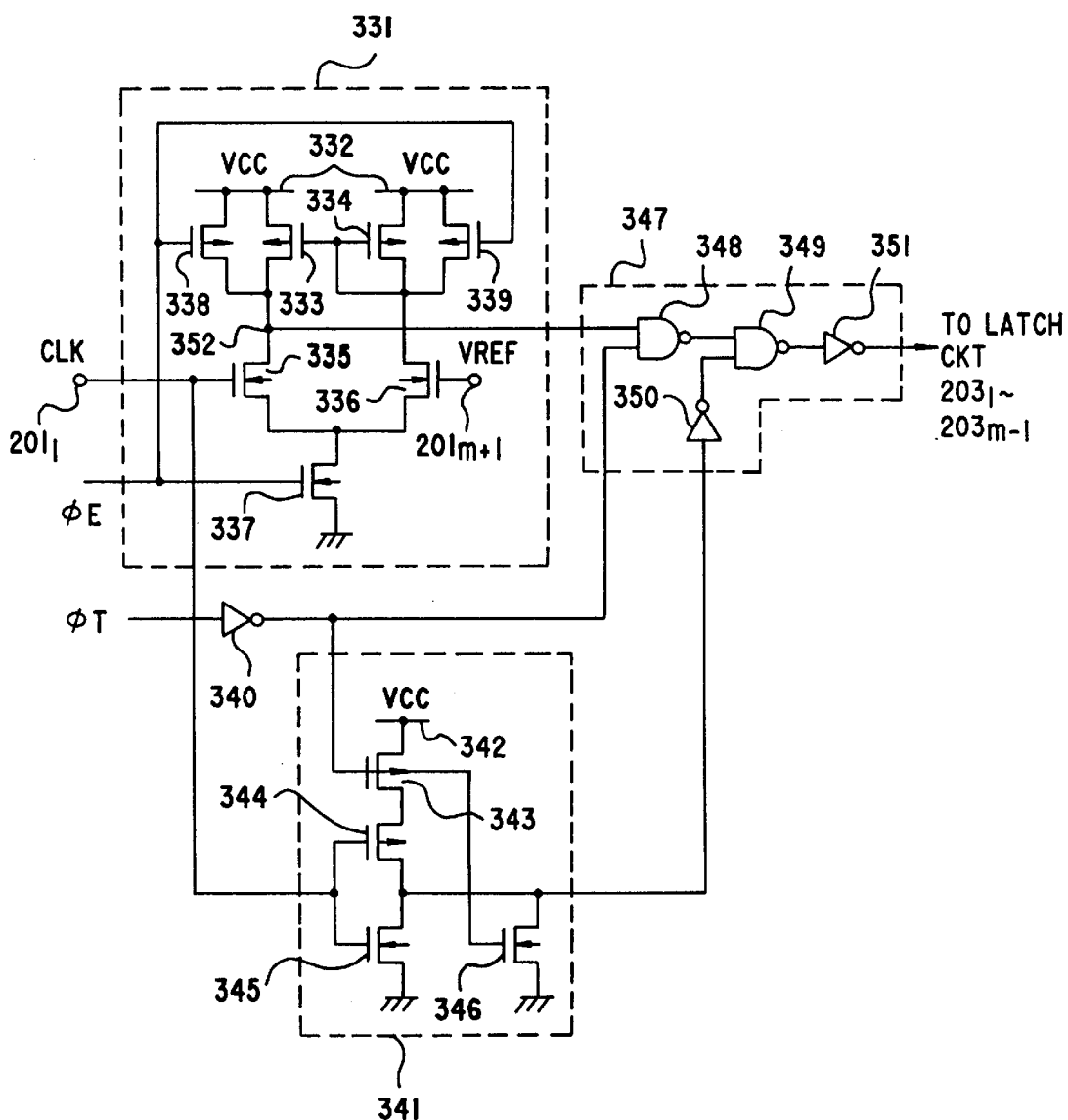
FIG. 36 is a circuit diagram showing an input circuit.

FIG. 35 shows a part of the eighth embodiment. In FIG. 35, those parts which are the same as those corresponding parts in FIG. 21 are designated by the same reference numerals, and a description thereof will be omitted.

In this embodiment, input circuits $330_1$ through $330_m$ having a circuit construction different from the input circuits $202_1$ through $202_m$ shown in FIG. 21 are provided in place of the input circuits $202_1$ through $202_m$. In addition, a test control signal $\phi_T$ is supplied to each of the input circuits $330_1$ through $330_m$. Otherwise, the construction of this embodiment shown in FIG. 35 is basically the same as the conceivable SDRAM shown in FIG. 21.

The input circuits $330_1$ through $330_m$ may have the same circuit construction. For example, the input circuit $330_1$ has the construction-shown in FIG. 36. The input circuit $330_1$ shown in FIG. 36 includes a differential amplifier circuit 331, an inverter 340, a NOR circuit 341 and a selection circuit 347 which are connected as shown.

The differential amplifier circuit 331 includes a VCC power line 332 for supplying a power supply voltage VCC of 3.3 V, for example, enhancement type pMOS transistors 333 and 334 which form a current mirror circuit and constitute loads, enhancement type nMOS transistors 335 and 336 which form driving transistors, an enhancement type nMOS transistor 337 which is turned ON/OFF by an activation signal $\phi_E$, and enhancement type pMOS transistors 338 and 339 which is turned ON/OFF by the activation signal $\phi_E$. The differential amplifier circuit 331 has a high-level threshold value $V_{IH}$ of 1.7 V and a low-level threshold value $V_{IL}$ of 1.3 V with respect to the clock signal CLK.

The inverter 340 inverts a test control signal $\phi_T$, and the output of the inverter 340 is supplied to the NOR circuit 341 and the selection circuit 347.

The NOR circuit 341 includes a VCC power line 342 for supplying the power supply voltage VCC, enhancement type pMOS transistors 343 and 344, and enhancement type nMOS transistors 445 and 446. The NOR circuit 441 has a high-level threshold value $V_{IH}$ of 2.2 V and a low-level threshold value $V_{IL}$ of 0.8 V with respect to the clock signal CLK.

The selection circuit 347 includes NAND circuits 448 and 449, and inverters 450 and 451. The output of the inverter 451 is connected to the clock signal input terminals of the latch circuits $303_1$ through $303_{m-1}$ shown in FIG. 35.

Figure 37:
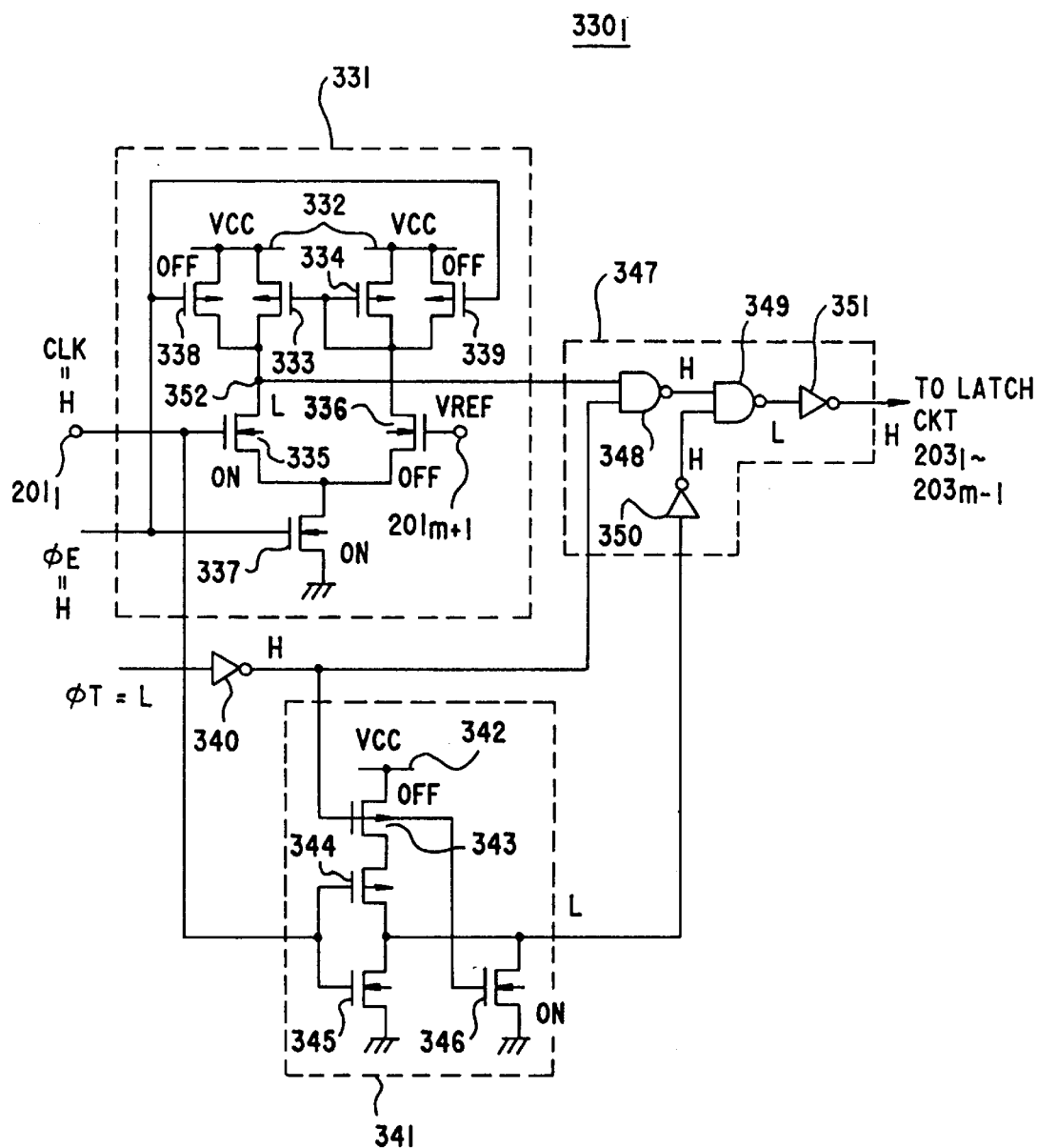
FIG. 37 is a circuit diagram for explaining the operation of the input circuit during a normal operation.

During the normal operation of this embodiment, the test control signal $\phi_T$ is fixed to a low level and the output of the inverter 340 is fixed to a high level as shown in FIG. 37. As a result, in the NOR circuit 341, the pMOS transistor 343 turns OFF and the nMOS transistor 346 turns ON. Hence, the NOR circuit 341 is put into an inactive state, and the output of the NOR circuit 341 is fixed to the low level.

In addition, in the selection circuit 347, because the output of the inverter 340 is fixed to the high level, the NAND circuit 348 operates as an inverter with respect to the output of the differential amplifier circuit 331. On the other hand, since the output of the NOR circuit 341 is fixed to the low level, the output of the inverter 350 is fixed to the high level, and the NAND circuit 349 operates as an inverter with respect to the output of the NAND circuit 348.

If the activation signal $\phi_E$ has the high level, for example, the nMOS transistor 337 turns ON, the pMOS transistors 338 and 339 turn OFF in the differential amplifier circuit 331. Hence, the differential amplifier 331 is put into an active state.

In this case, when the clock signal CLK has the high level, the nMOS transistor 335 turns ON, the nMOS transistor 336 turns OFF, and the voltage level at a node 352 becomes low. As a result, the output level of the NAND circuit 348 becomes high, the output level of the NAND circuit 349 becomes low and the output level of the inverter 351 becomes high in the selection circuit 347. This high-level output of the inverter 351 is supplied to the clock signal input terminals of the latch circuits $303_1$ through $303_{m-1}$.

Figure 38:
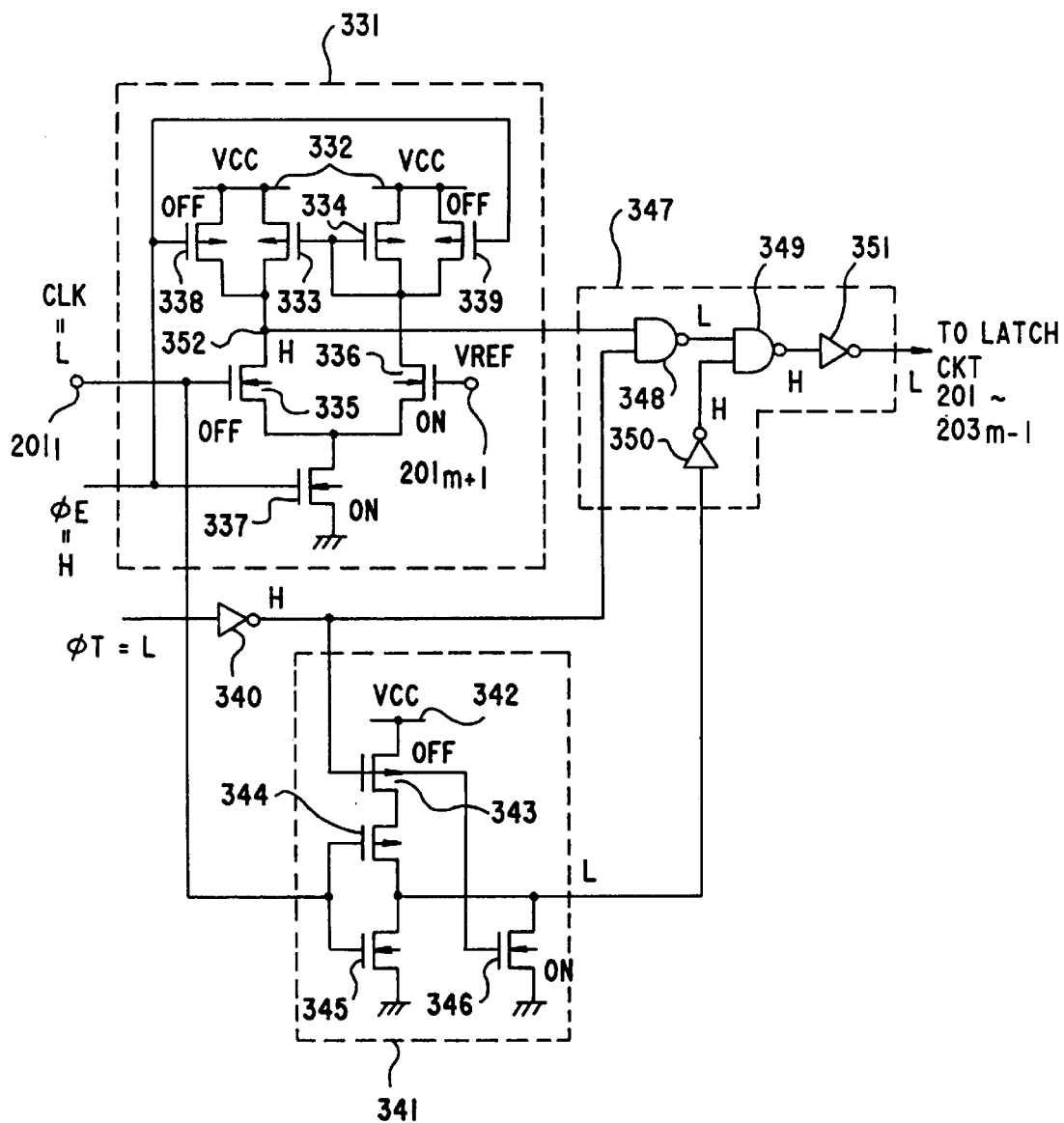
FIG. 38 is a circuit diagram for explaining the operation of the input circuit during the normal operation.

On the other hand, when the clock signal CLK has the low level, the nMOS transistor 335 turns OFF, the nMOS transistor 336 turns ON and the voltage level at the node 352 becomes high in the differential amplifier circuit 331 as shown in FIG. 38. As a result, in the selection circuit 347, the output level of the NAND circuit 348 becomes low, the output level of the NAND circuit 349 becomes high and the output level of the inverter 351 becomes low. This low-level output of the inverter 351 is supplied to the latch circuits $303_1$ through $303_{m-1}$.

Although the illustration thereof will be omitted, when the activation signal $\phi_E$ has the low level, the nMOS transistor 337 turns OFF and the pMOS transistors 338 and 339 turn ON. Hence, the differential amplifier circuit 331 is put into the inactive state, and the voltage level at the node 352 is fixed to the high level.

Figure 39:
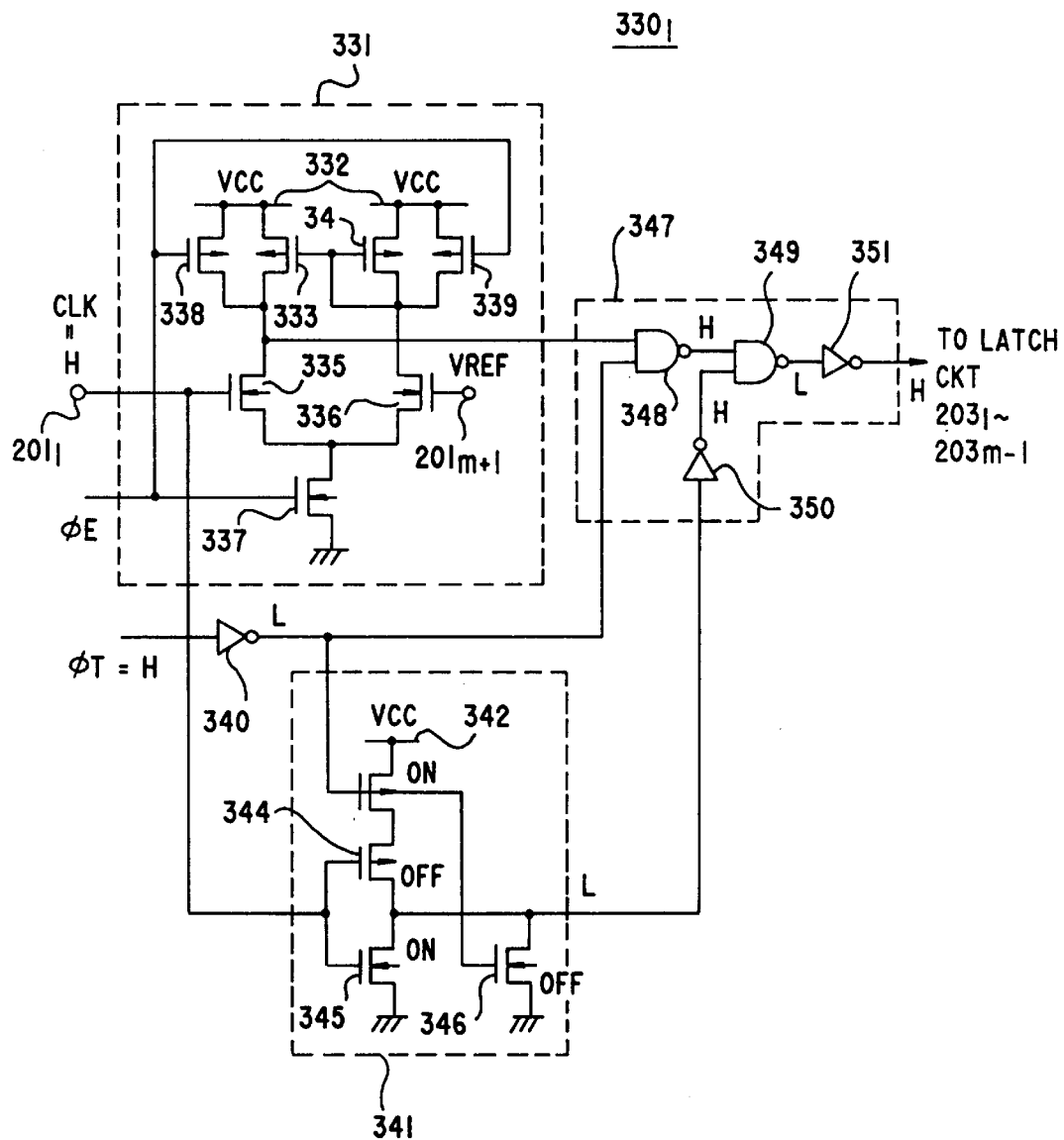
FIG. 39 is a circuit diagram for explaining the operation of the input circuit during a burn-in test.

On the other hand, during the burn-in test of this embodiment, the test control signal $\phi_T$ has a high level and the output level of the inverter 340 is low as shown in FIG. 39. As a result, in the NOR circuit 341, the pMOS transistor 343 turns ON and the nMOS transistor 346 turns OFF. Hence, with respect to the clock signal CLK, the NOR circuit 341 operates as a CMOS inverter that is made up of the pMOS transistor 344 and the nMOS transistor 345.

In the selection circuit 347, the output of the NAND circuit 348 is fixed to the high level, and the NAND circuit 349 operates as an inverter with respect to the output of the NOR circuit 341.

For example, if the clock signal CLK has the high level, the pMOS transistor 344 turns OFF and the nMOS transistor 345 turns ON in the NOR circuit 341, and the output level of the NOR circuit 341 becomes low. As a result, the output level of the inverter 350 becomes high, the output level of the NAND circuit 349 becomes low and the output level of the inverter 351 becomes high in the selection circuit 347. This high-level output of the inverter 351 is supplied to the clock signal input terminals of the latch circuits $303_1$ through $303_{m-1}$.

Figure 40:
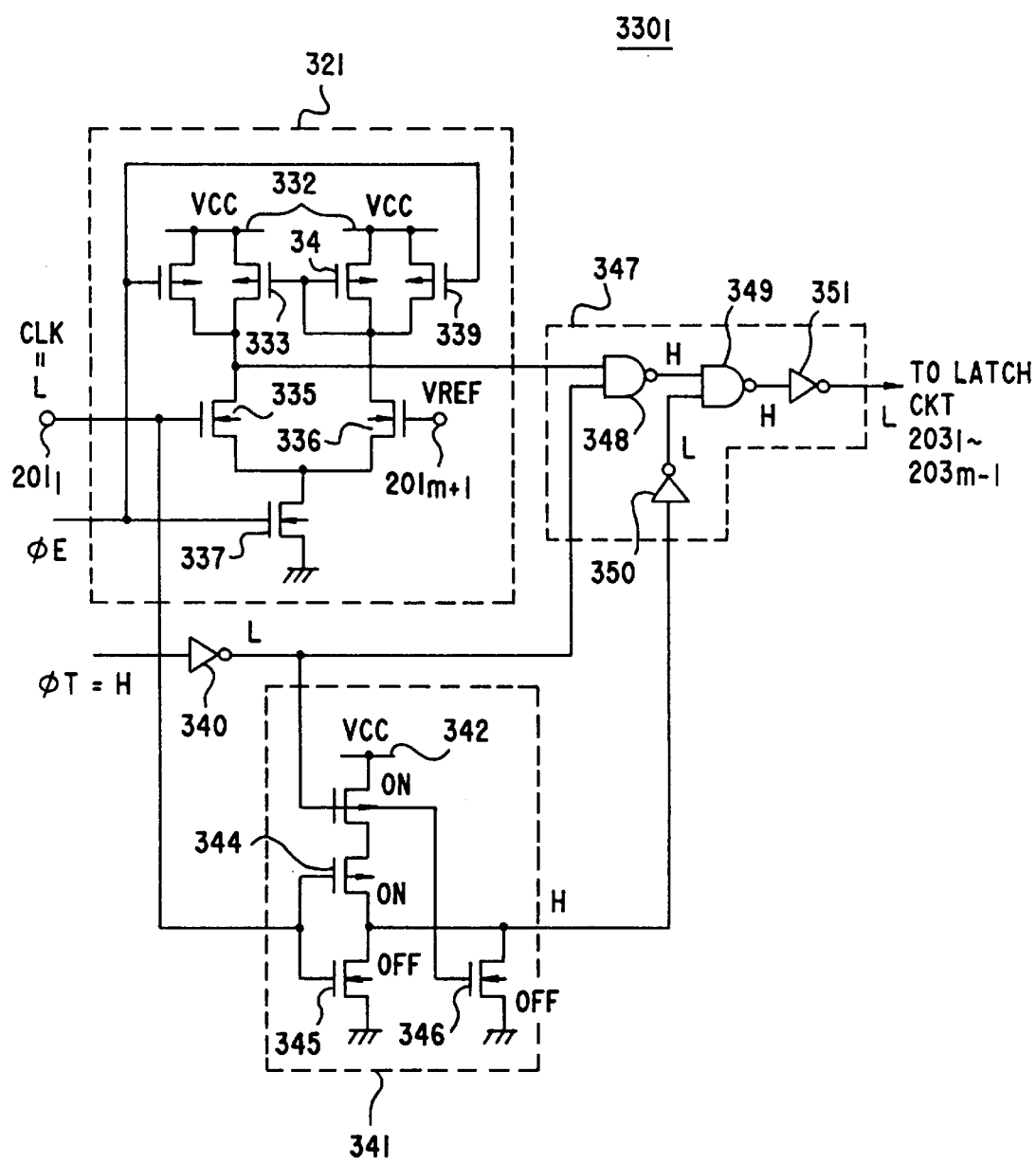
FIG. 40 is a circuit diagram for explaining the operation of the input circuit during the burn-in test.

On the other hand, when the clock signal CLK has the low level, the pMOS transistor 344 turns ON, the nMOS transistor 345 turns OFF in the NOR circuit 341 as shown in FIG. 40. In this case, the output level of the NOR circuit 341 becomes high. As a result, in the selection circuit 347, the output level of the inverter 350 becomes low, the output level of the NAND circuit 349 becomes high and the output level of the inverter 351 becomes low. This low-level output of the inverter 351 is supplied to the clock signal input terminals of the latch circuits $303_1$ through $303_{m-1}$.

Therefore, according to this embodiment, the differential amplifier circuit 331 having the high-level threshold value $V_{IH}$ of 1.7 V and the low-level threshold value $V_{IL}$ of 1.3 V is used as the input circuit with respect to the clock signal CLK during the normal operation.

On the other hand, during the burn-in test, the NOR circuit 341 having the high-level threshold value $V_{IH}$ of 2.2 V and the low-level threshold value $V_{IL}$ of 0.8 V, which is stronger against noise compared to the differential amplifier circuit 331, is used as the input circuit with respect to the clock signal CLK.

Accordingly, even if the noise is mixed into the rising or falling waveform of the clock signal CLK during the burn-in test, this embodiment can prevent an erroneous operation and carry out the burn-in test is a normal manner.

Furthermore, in this embodiment, the input circuits $330_2$ through $330_m$ which are provided with respect to information signals such as the chip select signal /CS has the same circuit construction as the input circuit $330_1$ which is provided with respect to the clock signal CLK. For this reason, it is possible to prevent an erroneous operation and carry out the burn-in test in the normal manner even if noise is mixed into such information signals.

Figure 41:
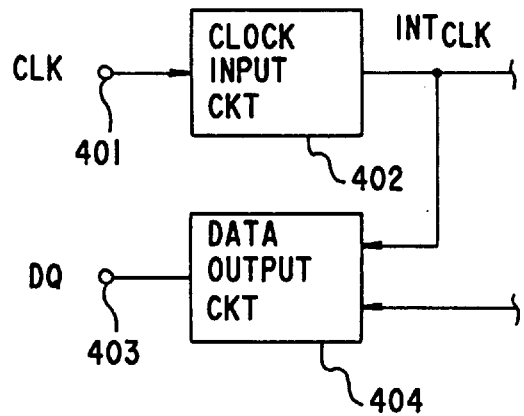
FIG. 41 is a system block diagram showing a part of a conceivable SDRAM.

FIG. 41 shows a part of a conceivable SDRAM, and FIG. 42 is a timing chart for explaining a read operation of this conceivable SDRAM.

The SDRAM shown in FIG. 41 includes a clock input circuit (or clock input buffer) 402 and a data output circuit (or data output buffer) 404. A system clock signal CLK is supplied to a clock input terminal 401 from the outside, and the clock input circuit 402 inputs this system clock signal CLK. The clock input circuit 402 shapes the system clock signal CLK into an internal clock signal $INT_{CLK}$. The data output circuit 404 is constructed to output a data DQ via a data input/output terminal 403 in synchronism with the rise timing of the internal clock signal $INT_{CLK}$ that is supplied from the clock input circuit 402, based on the data that is already latched.

FIG. 42 shows the system clock signal CLK applied to the clock input terminal 401, the internal clock signal $INT_{CLK}$ output from the clock input circuit 402, and the data DQ output from the data output circuit 404.

For example, when inputting a read command to the SDRAM shown in FIG. 41 at the rise timing of the nth clock (pulse) of the system clock signal CLK, the read command is actually input at the rise timing of the nth clock (pulse) of the internal clock signal $INT_{CLK}$ which is obtained by shaping the nth clock (pulse) of the system clock signal CLK.

Thereafter, when the (n+2)th clock (pulse) of the system clock signal CLK rises, the data output circuit 404 starts the operation of outputting the data DQ to the outside in synchronism with the rise timing of the (n+2)th clock (pulse) of the internal clock signal $INT_{CLK}$, and the data DQ is output to the outside after a predetermined time delay.

Hence, according to the SDRAM shown in FIG. 41, the data DQ is output after a delay time $t_a$ from the rise timing of the closest clock (pulse) of the system clock signal CLK. The delay time $t_a$ is a sum of a delay time of the clock input circuit 402 and a delay time of the data output circuit 404. This delay time $t_a$ is also referred to as the access time $t_a$ from the system clock signal CLK. The access time $t_a$ is an output settling time in which the previous data continues to be output.

The clock input circuit 402 and the data output circuit 404 are made up of MOS transistors. For this reason, when the power supply voltage changes or a temperature occurs, the threshold values and, the current driving capabilities of the MOS transistors change. In such cases, the access time $t_a$ from the system clock signal CLK changes, that is, the output settling time changes, and it may become impossible to input the correct data at a destination of the data transfer.

Next, a description will be given of a ninth embodiment of the semiconductor device according to the present invention which can suppress the change in the access time from the system clock signal caused by the change in the power supply voltage supplied from the outside and the change in the temperature, so that the correct data can be input at a destination of the data transfer.

Figure 43:
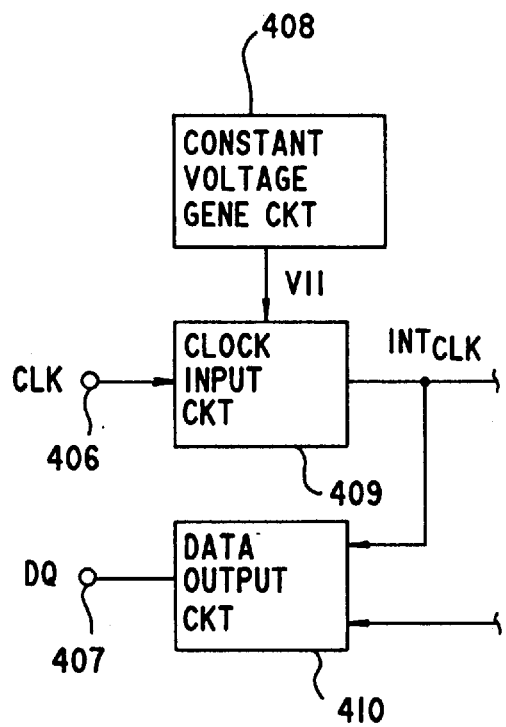
FIG. 43 is a system block diagram for explaining the operating principle of a ninth embodiment of the semiconductor device according to the present invention.

First, a description will be given of the operating principle of the ninth embodiment, by referring to FIG. 43. A semiconductor device shown in FIG. 43 includes a constant voltage generating circuit 408, a clock input circuit 409 and a data output circuit 410. The system clock signal CLK is supplied to a clock signal input terminal 406 from the outside. A data DQ is input and output via a data input/output terminal 407.

The constant voltage generating circuit 408 generates a constant voltage VII having a voltage value for suppressing the change in the operating speeds of transistors with respect to a temperature change. The clock input circuit receives the constant voltage VII from the constant voltage generating circuit 408 as a power supply voltage, and inputs the system clock signal CLK from the clock signal input terminal 406. The clock input circuit 409 shapes the system clock signal CLK into an internal clock signal $INT_{CLK}$. The data output circuit 410 carries out an operation of outputting a data DQ to the outside via the data input/output terminal 407 in synchronism with the rise or fall timing of the internal clock signal $INT_{CLK}$.

In this embodiment, the clock input circuit 409 receives as the power supply voltage the constant voltage VII having the voltage value for suppressing the changes in the operating speeds of the transistors with respect to the temperature change. Hence, it is possible to suppress a change in the delay time of the clock input circuit 409 caused by the change in the power supply voltage supplied from the outside and the temperature change.

Next, a more detailed description will be given of the ninth embodiment, by referring to FIGS. 44 through 53. In this embodiment, the present invention is applied to the SDRAM.

Figure 44:
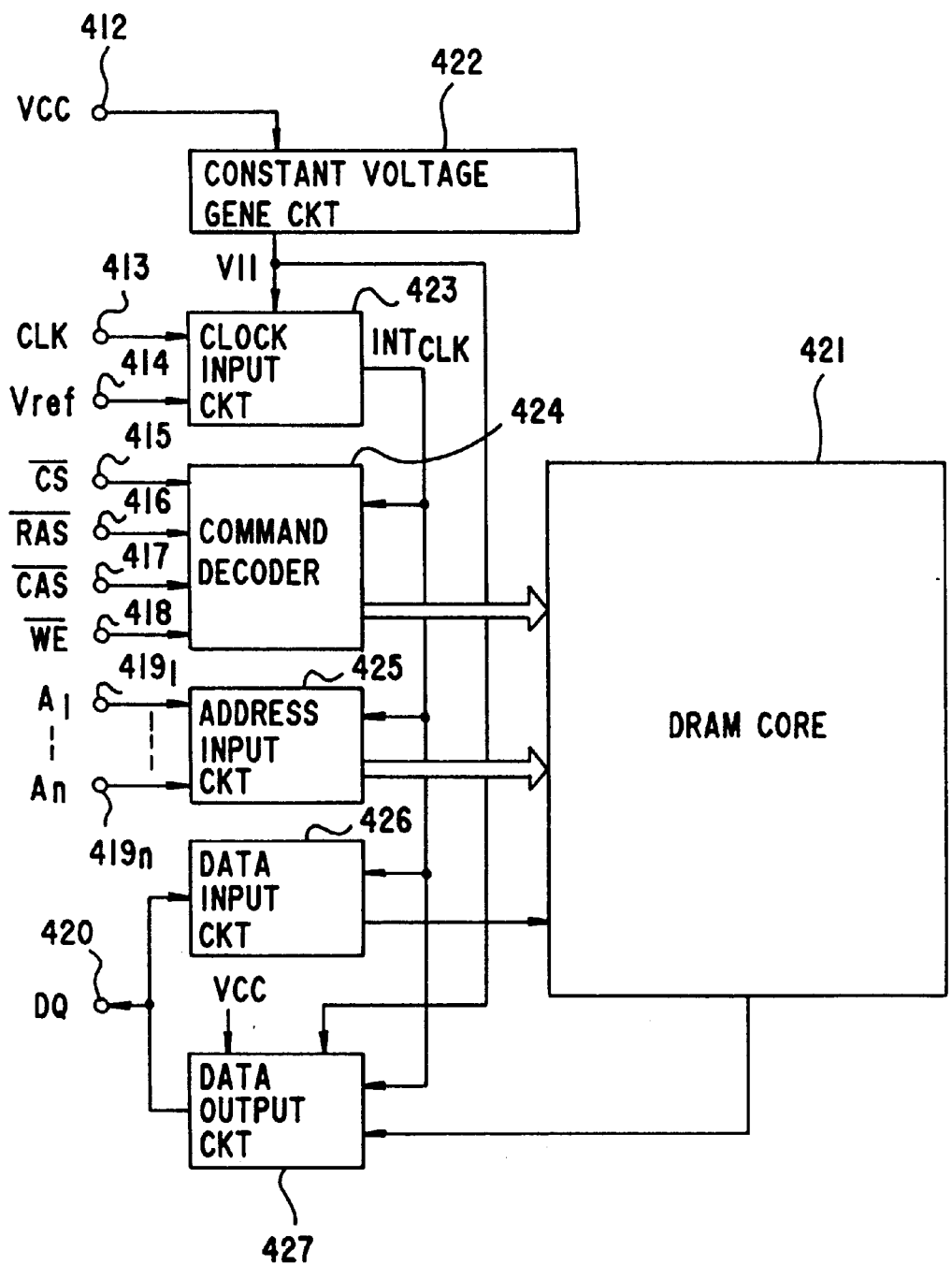
FIG. 44 is a system block diagram showing an important part of the ninth embodiment of the semiconductor device.

FIG. 44 shows an important part of the ninth embodiment. A SDRAM shown in FIG. 44 includes terminals 412 through 418, $419_1$ through $419_n$ and 420, a DRAM core 421, a constant voltage generating circuit 422, a clock input circuit 423, an address input circuit 425, a data input circuit 426, and a data output circuit 427 which are connected as shown.

An external power supply voltage VCC is supplied to the power supply voltage input terminal 412, the system clock signal CLK is supplied to the clock signal input terminal 413, and a reference voltage $V_{ref}$ is supplied to the reference voltage input terminal 414.

A chip select signal /CS is supplied to the chip select signal input terminal 415, a row address strobe signal /RAS is supplied to the row address strobe signal input terminal 416. A column address strobe signal /CAS is supplied to the column address strobe signal input terminal 417, and a write enable signal /WE is supplied to the write enable signal input terminal 418.

Bits $A_1$ through $A_n$ of an address signal are respectively supplied to the address signal input terminals $419_1$ through $419_n$. The data input/output terminal 420 is used to input and output the data.

A memory cell array, a sense amplifier, a row decoder, a column decoder, a column gate and the like are provided in the DRAM core 421. The constant voltage generating circuit 422 generates the constant voltage VII.

The clock input circuit 423 inputs the system clock signal CLK which is supplied from the outside, and shapes this system clock signal CLK into the internal clock signal $INT_{CLK}$. The clock input circuit 423 outputs this internal clock signal $INT_{CLK}$ to the command decoder 424, the address input circuit 425, the data input circuit 426 and the data output circuit 427.

The command decoder 424 decodes commands made up of the chip select signal /CS, the row address strobe signal /RAS, the column address strobe signal /CAS and the write enable signal /WE. The address input circuit 425 inputs the bits $A_1$ through $A_n$ of the address signal. The data input circuit 426 inputs the data supplied from the outside during the write operation. The data output circuit 427 outputs the data during the read operation.

Figure 45:
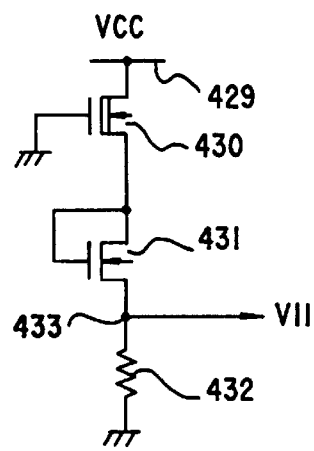
FIG. 45 is a circuit diagram showing a constant voltage generating circuit.

FIG. 45 shows the construction of the constant voltage generating circuit 422. The constant voltage generating circuit 422 shown in FIG. 45 includes a VCC power line 429 for supplying the power supply voltage VCC, a depletion type nMOS transistor 430, an enhancement type nMOS transistor 431, and a resistor 432 which are connected as shown. The nMOS transistor 430 has a drain connected to the VCC power line 429, and a gate that is grounded. The nMOS transistor 431 has a gate and a drain that are connected, and the drain of the nMOS transistor 431 is connected to a source of the nMOS transistor 430. One end of the resistor 432 is connected to a source of the nMOS transistor 431, and the other end of the resistor 432 is grounded. The constant voltage VII is obtained from a node 433 which connects the resistor 432 and the source of the nMOS transistor 431.

A threshold voltage $V_{THD}$(H,T) of the nMOS transistor 430 at a high temperature can be described by the following formula (1), where $V_{THD}$(R,T) denotes a threshold voltage of the nMOS transistor 430 at a normal or room temperature and $\Delta V_{THD}$ denotes a deviation of the threshold voltage $V_{THD}$ due to a temperature change.

$$V_{THD}(H,T) = V_{THD}(R,T) - \Delta V_{THD} \quad (1)$$

In addition, a threshold voltage $V_{THE}$(H,T) of the nMOS transistor 431 at a high temperature can be described by the following formula (2), where $V_{THE}$(R,T) denotes a threshold voltage of the nMOS transistor 431 at a normal (or room) temperature and $\Delta V_{THE}$ denotes a deviation of the threshold voltage $V_{THE}$ due to a temperature change.

$$V_{THE}(H,T) = V_{THE}(R,T) - \Delta V_{THE} \quad (2)$$

Because the gate of the nMOS transistor 430 is grounded, the constant voltage VII becomes $|V_{THD}|-V_{THE}$. Hence, a constant voltage VII(R,T) at the ordinary (or standard) temperature can be described by the following formula (3), and a constant voltage VII(H,T) at the high temperature can be described by the following formula (4).

$$VII(R, T) = |V_{THD}(R, T)| - V_{THE}(R, T) \quad (3)$$

$$\begin{aligned}
VII(H, T) &= |V_{THD}(H, T)| - V_{THE}(H, T) \\
&= |V_{THD}(R, T) - \Delta V_{THD}| - (V_{THE}(R, T) - \Delta V_{THE}) \\
&= |V_{THD}(R, T)| - V_{THE}(R, T) + \Delta V_{THD} + \Delta V_{THE} \\
&= VII(R, T) + \Delta V_{THD} + \Delta V_{THE} \\
&= VII(R, T) + \Delta V
\end{aligned} \quad (4)$$

In addition, a threshold voltage $V_{THD}$(L,T) of the nMOS transistor 430 at a low temperature can be described by the following formula (5), a threshold voltage $V_{THE}$(L,T) of the nMOS transistor 431 at the low temperature can be described by the following formula (6), and a constant voltage VII(L,T) at the low temperature can be described by the following formula (7).

$$V_{THD}(L, T) = V_{THD}(R, T) + \Delta V_{THD} \quad (5)$$

$$V_{THE}(L, T) = V_{THE}(R, T) + \Delta V_{THE} \quad (6)$$

$$\begin{aligned}
VII(L, T) &= |V_{THD}(L, T)| - V_{THE}(L, T) \\
&= |V_{THD}(R, T) + \Delta V_{THD}| - (V_{THE}(R, T) + \Delta V_{THE}) \\
&= |V_{THD}(R, T)| - V_{THE}(R, T) + \Delta V_{THD} - \Delta V_{THE} \\
&= VII(R, T) - \Delta V_{THD} - \Delta V_{THE} \\
&= VII(R, T) - \Delta V
\end{aligned} \quad (7)$$

Figure 46:
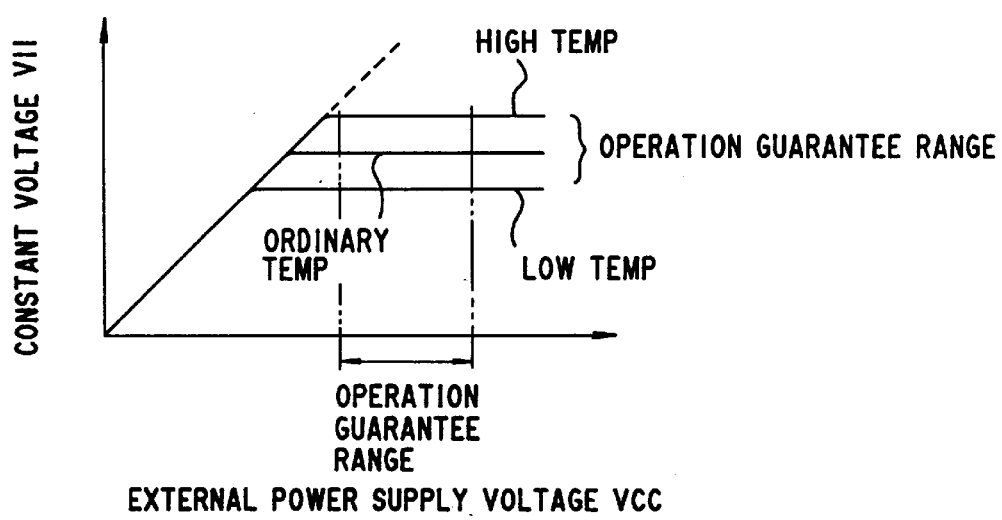
FIG. 46 is a diagram showing the characteristic of the constant voltage generating circuit.

Accordingly, the relationship between the external power supply voltage VCC, the temperature and the constant voltage VII in the constant voltage generating circuit 422 becomes as shown in FIG. 46. In other words, within a predetermined range, the constant voltage VII becomes higher than that at the ordinary temperature when the temperature becomes high, and the constant voltage VII becomes lower than that at the ordinary temperature when the temperature becomes low.

Hence, in this embodiment, the constant voltage generating circuit 422 is constructed to generate the constant voltage VII having a voltage value for suppressing the change in the operating speeds of the transistors with respect to the temperature change.

Figure 47:
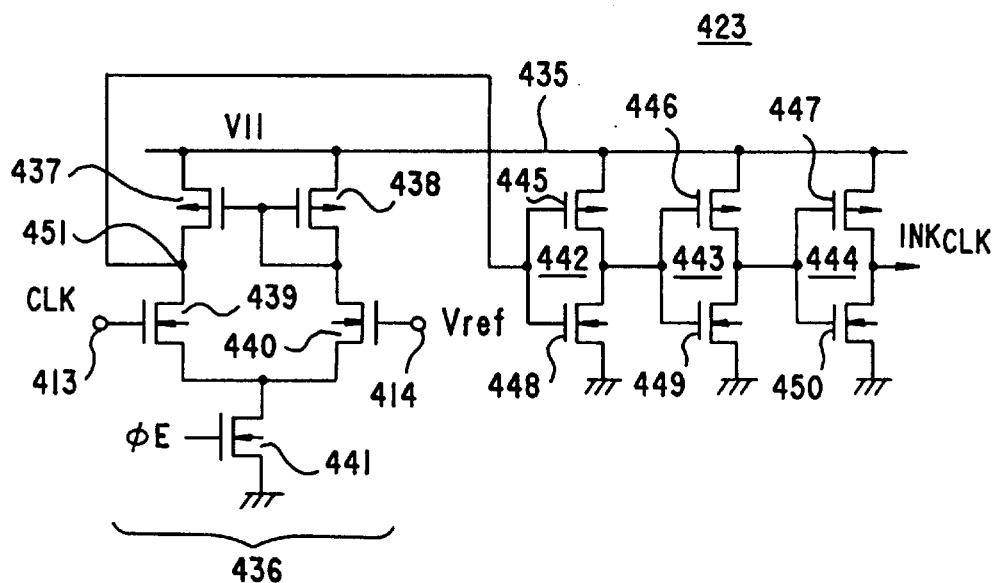
FIG. 47 is a circuit diagram showing a clock input circuit.

FIG. 47 shows the construction of the clock input circuit 423. The clock input circuit 423 shown in FIG. 47 includes a VII power line 435 for supplying the constant voltage VII, a differential amplifier circuit 436, an inverters 442 through 444 for shaping.

The differential amplifier circuit 436 includes enhancement type pMOS transistors 437 and 438 which form a current mirror circuit and constitute loads, enhancement type nMOS transistors 439 and 440 which form driving transistors, and an enhancement type nMOS transistor 441 which functions as a resistor element. The system clock signal CLK is supplied to the gate of the nMOS transistor 439, and the reference voltage $V_{ref}$ is supplied to the gate of the nMOS transistor 440. The nMOS transistor 441 is turned ON/OFF by the activation signal $\phi_E$.

The inverter 442 is made up of an enhancement type pMOS transistor 445 and an enhancement type nMOS transistor 448. The inverter 442 is made up of an enhancement type pMOS transistor 446 and an enhancement type nMOS transistor 449. The inverter 444 is made up of an enhancement type pMOS transistor 447 and an enhancement type nMOS transistor 450.

When the activation signal $\phi_E$ has a low level in this clock input circuit 423 shown in FIG. 47, the nMOS transistor 441 turns OFF, the differential amplifier circuit 436 is put into an inactive state, and the clock input circuit 423 does not function.

On the other hand, when the activation signal $\phi_E$ has a high level, the nMOS transistor 441 turns ON, and the differential amplifier circuit 436 is put into an active state.

Figure 48:
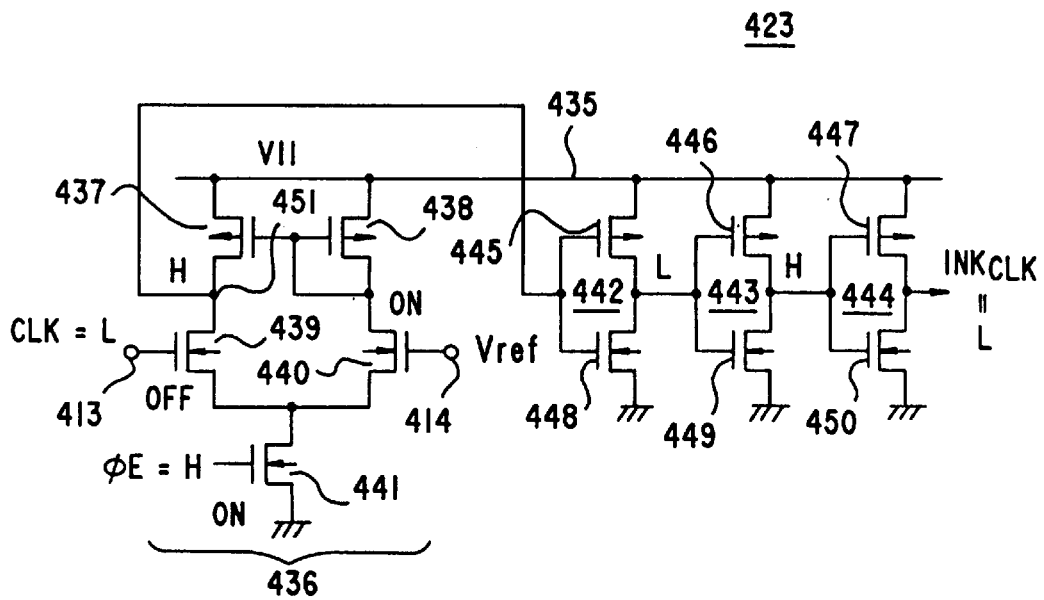
FIG. 48 is a circuit diagram for explaining the operation of the clock input circuit.

In this case, when the system clock signal CLK has a low level as shown in FIG. 48, the nMOS transistor 439 turns OFF, the nMOS transistor 440 turns ON, the level at a node 451 becomes high, the output level of the inverter 442 becomes low, the output level of the inverter 443 becomes high, and the level of the internal clock signal $INT_{CLK}$ becomes low.

Figure 49:
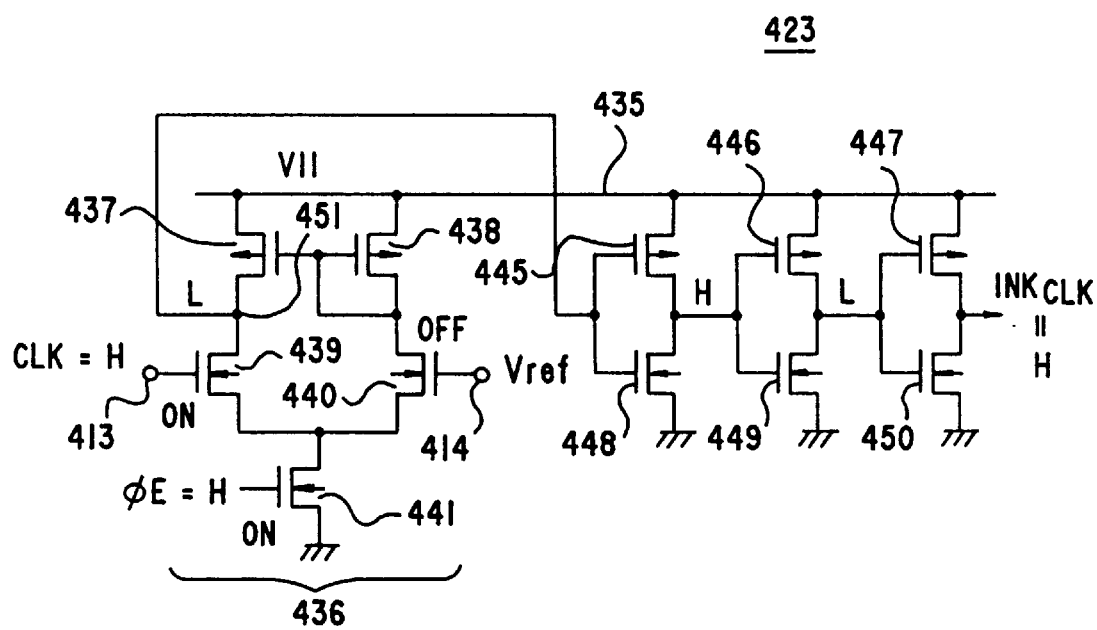
FIG. 49 is a circuit diagram for explaining the operation of the clock input circuit.

On the other hand, when the system clock signal CLK has a high level as shown in FIG. 49, the nMOS transistor 439 turns ON, the nMOS transistor 440 turns OFF, the level at the node 451 becomes low, the output level of the inverter 442 becomes high, the output level of the inverter 443 becomes low, and the level of the internal clock signal $INT_{CLK}$ becomes high.

Figure 50:
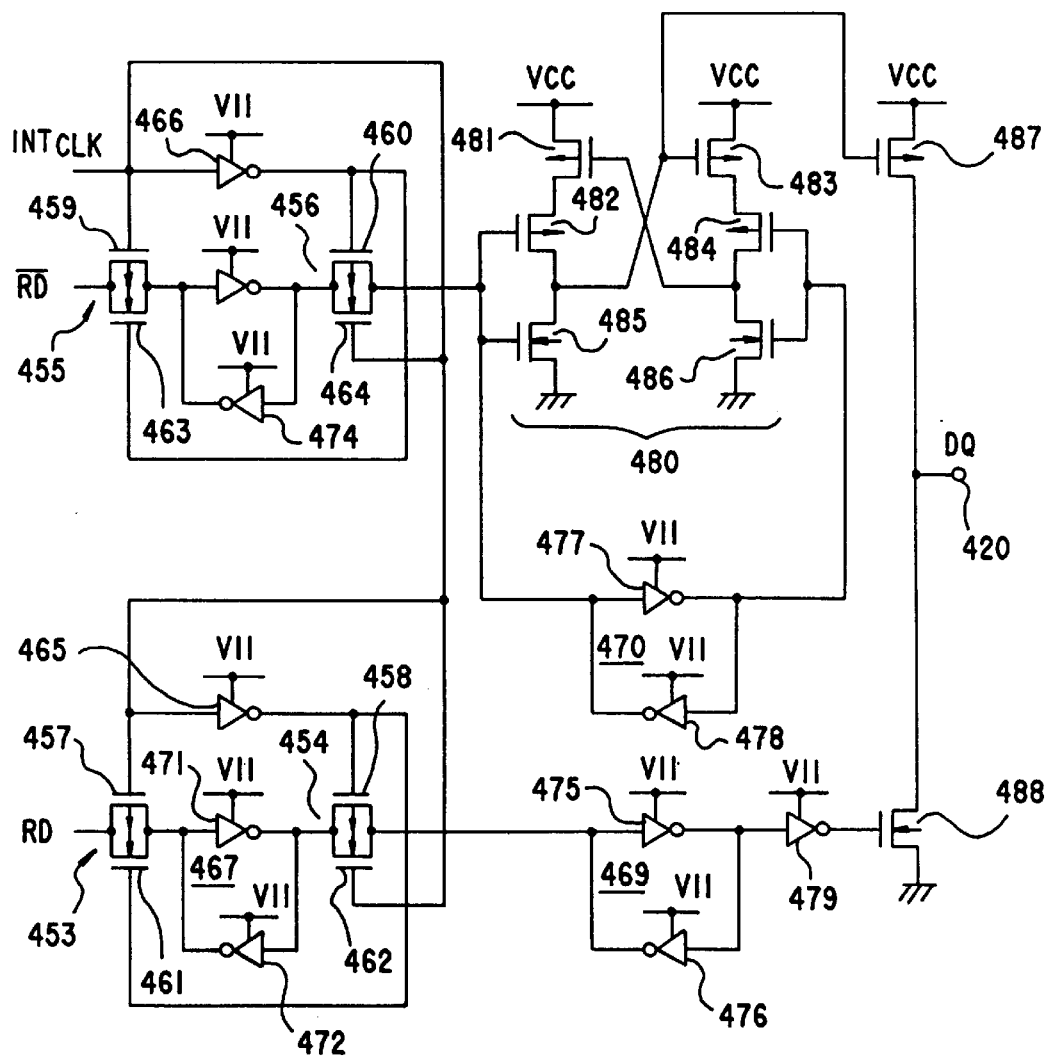
FIG. 50 is a circuit diagram showing a data output circuit.

FIG. 50 shows the construction of the data output circuit 427. In FIG. 50, RD denotes a read data that is read from the DRAM core 421, and /RD denotes an inverted read data which is in an inverted relationship to the read data RD.

The data output circuit 427 includes transmission gate circuits 453 through 456, inverters 465 and 466, latch circuits 467 through 470, an inverter 479, a level shift circuit 480, and output transistors 487 and 488 which are connected as shown.

The transmission gate circuit 453 is made up of an enhancement type pMOS transistor 457 and an enhancement type nMOS transistor 461. The transmission gate circuit 454 is made up of an enhancement type pMOS transistor 458 and an enhancement type nMOS transistor 462. The transmission gate circuit 455 is made up of an enhancement type pMOS transistor 459 and an enhancement type nMOS transistor 463. The transmission gate circuit 456 is made up of an enhancement type pMOS transistor 460 and an enhancement type nMOS transistor 464.

The inverters 465 and 466 respectively invert the internal clock signal $INT_{CLK}$ output from the clock input circuit 423.

The latch circuit 467 is made up of inverters 471 and 472, and the latch circuit 468 is made up of inverters 473 and 474. The latch circuit 469 is made up of inverters 475 and 476, and the latch circuit 470 is made up of inverters 477 and 478.

The inverter 479 inverts the output of the latch circuit 469. The level shift circuit 480 includes enhancement type pMOS transistors and enhancement type nMOS transistors 485 and 486 which are connected as shown. The output transistor 487 is made up of an enhancement type pMOS transistor forming a pull-up element. The output transistor 488 is made up of an enhancement type nMOS transistor forming a pull-down element.

The constant voltage VII is supplied as the power supply voltage to the inverters 465, 466 and 471 through 479. On the other hand, the power supply voltage VCC from the outside is supplied as the power supply voltage to the level shift circuit 480 and an output transistor circuit (or driver circuit) that is made up of the output transistors 487 and 488.

Figure 51:
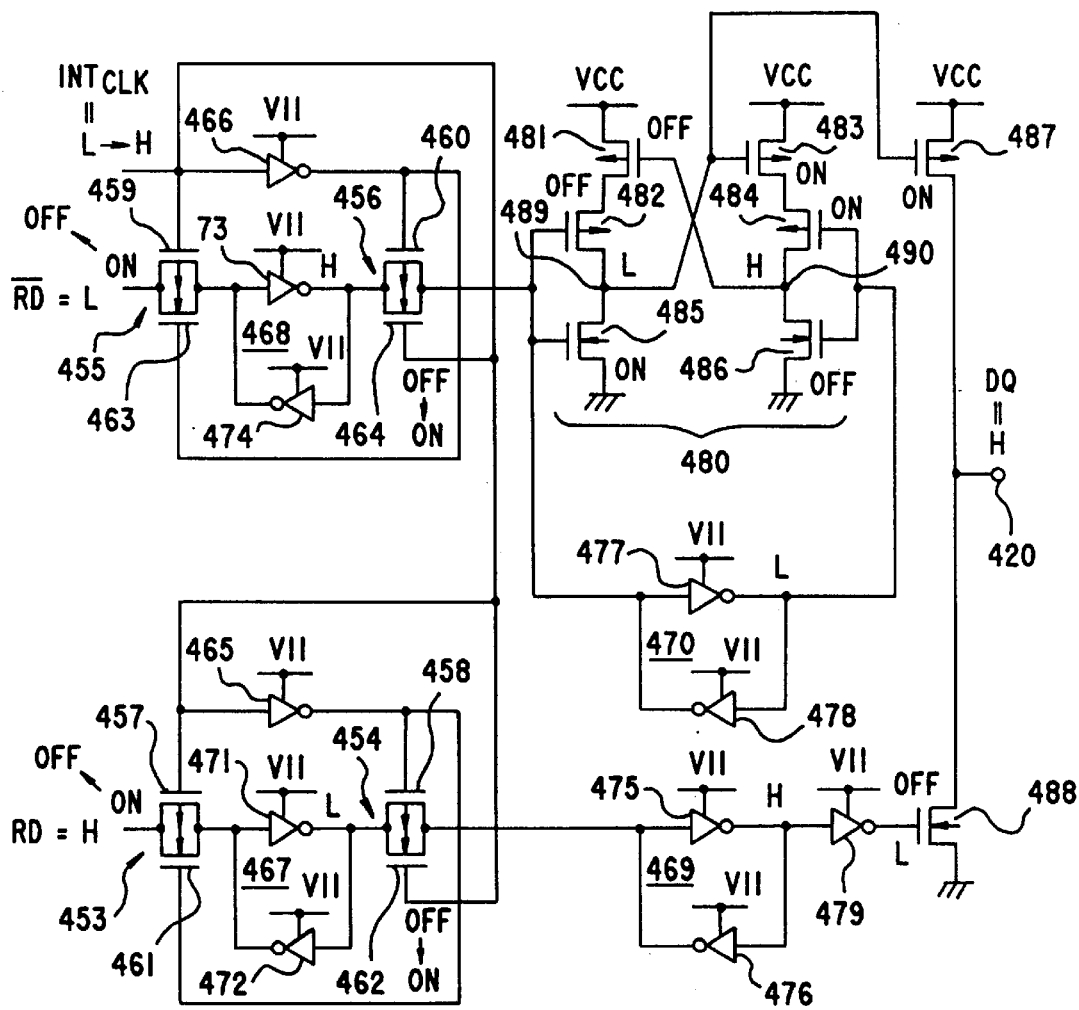
FIG. 51 is a circuit diagram for explaining the operation of the data output circuit.

In the data output circuit 427, when the internal clock signal $INT_{CLK}$ has the low level as shown in FIG. 51, the transmission gate circuit 457 turns ON, the transmission gate circuit 458 turns OFF, the transmission gate circuit 459 turns ON, and the transmission gate circuit 460 turns OFF.

In this case, when the level of the read data RD is high and the level of the inverted read data /RD is low, the output level of the latch circuit 467 is low and the output level of the latch circuit 468 is high.

Thereafter, when the internal clock signal $INT_{CLK}$ undergoes a transition to the high level, the transmission gate circuit 457 turns OFF, the transmission gate circuit 458 turns ON, the transmission gate circuit 459 turns OFF, and the transmission gate circuit 460 turns ON. As a result, the output level of the latch circuit 469 becomes high, the output level of the inverter 479 becomes low, and the nMOS transistor 488 turns OFF.

In addition, the pMOS transistor 482 turns OFF, the nMOS transistor 485 turns ON, the level at a node 489 becomes low, the output level of the latch circuit 470 becomes low, the pMOS transistor 484 turns ON, and the nMOS transistor 486 turns OFF. As a result, the pMOS transistor 483 turns ON, the level at a node 490 becomes high, the pMOS transistor 481 turns OFF, the pMOS transistor 487 turns ON, and a high level having the same phase as the read data RD is output as the data DQ.

Figure 52:
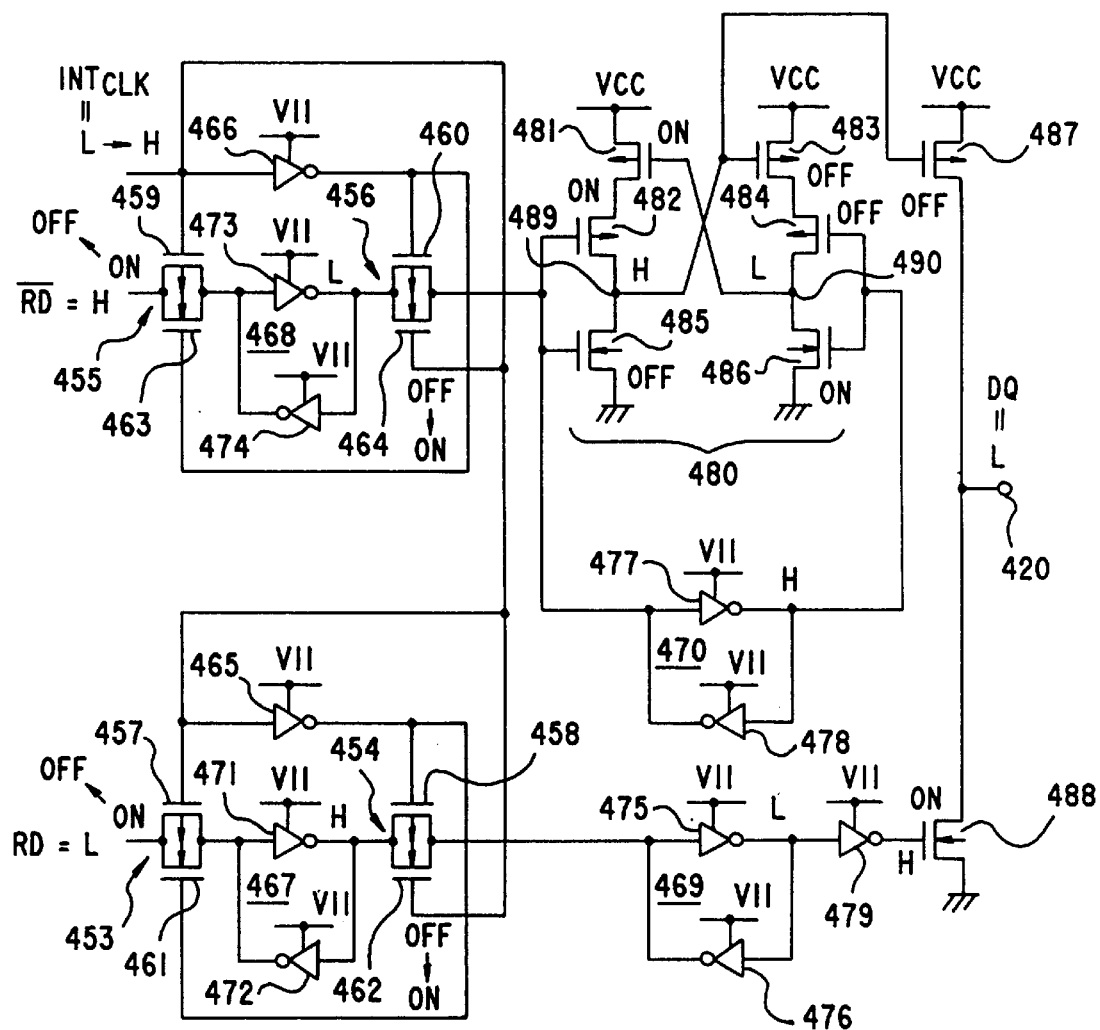
FIG. 52 is a circuit diagram for explaining the operation of the data output circuit.

On the other hand, when the internal clock signal $INT_{CLK}$ has the low level, the read data RD has the low level and the inverted read data /RD has the high level as shown in FIG. 52, the output level of the latch circuit 467 becomes high and the output level of the latch circuit 468 becomes low.

Thereafter, when the internal clock signal $INT_{CLK}$ undergoes a transition to the high level, the transmission gate circuit 457 turns OFF, the transmission gate circuit 458 turns ON, the transmission gate circuit 459 turns OFF, and the transmission gate circuit 460 turns ON. As a result, the output level of the latch circuit 469 becomes low, the output level of the inverter 479 becomes high, and the nMOS transistor 488 turns ON.

In addition, the pMOS transistor 482 turns ON, the nMOS transistor 485 turns OFF, the output level of the latch circuit 470 becomes high, the pMOS transistor 484 turns OFF, the nMOS transistor 486 turns ON, and the level at the node 490 becomes low. As a result, the pMOS transistor 481 turns ON, the level at the node 489 becomes high, the pMOS transistor 483 turns OFF, the pMOS transistor 487 turns OFF, and a low level having the same phase as the read data RD is output as the data DQ.

Figure 53:
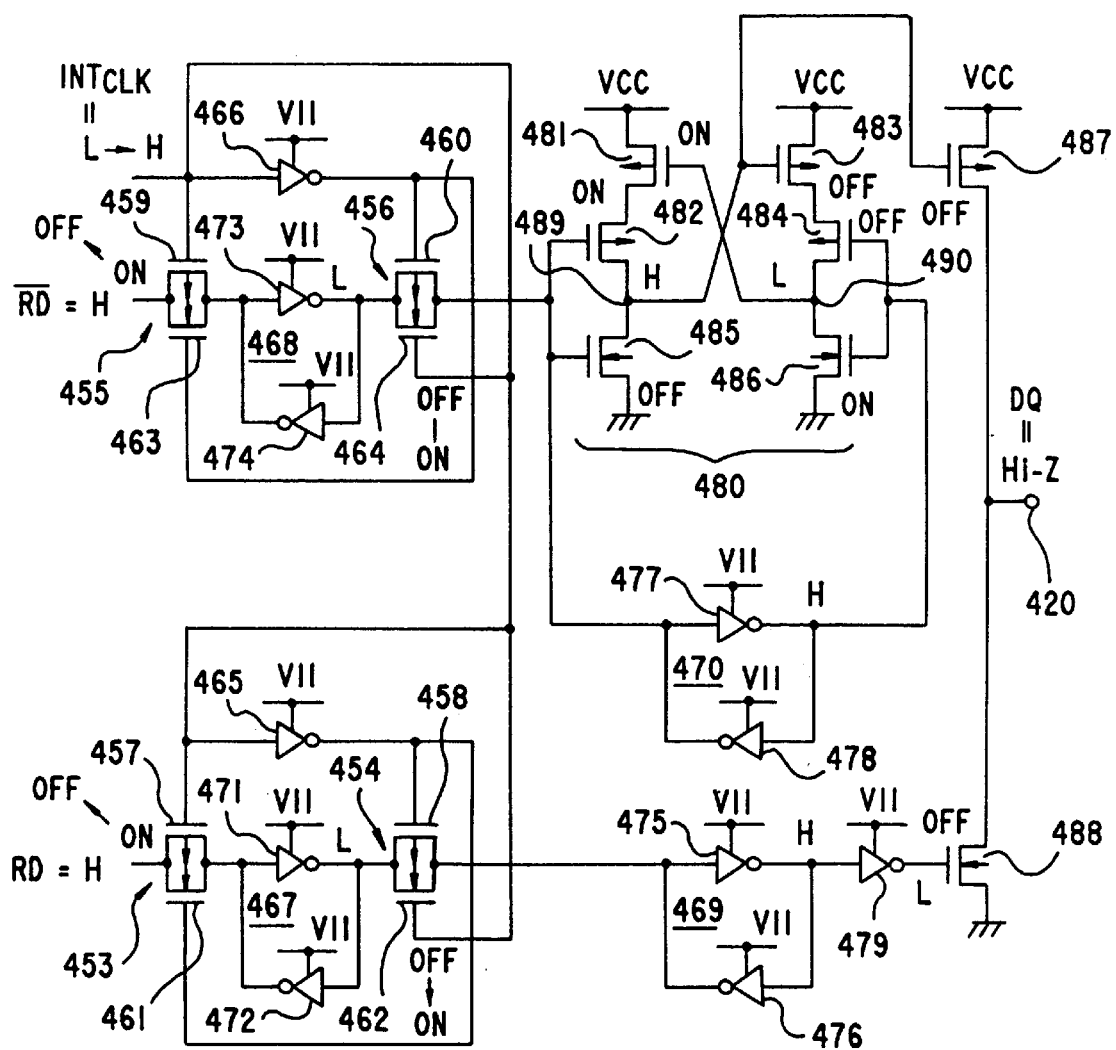
FIG. 53 is a circuit diagram for explaining the operation of the data output circuit.

Furthermore, when the internal clock signal $INT_{CLK}$ has the low level, the read data RD has the high level and the inverted read data /RD has the high level as shown in FIG. 53, the output level of the latch circuit 467 becomes low and the output level of the latch circuit 468 becomes low.

Thereafter, when the internal clock signal $INT_{CLK}$ undergoes a transition to the high level, the transmission gate circuit 457 turns OFF, the transmission gate circuit 458 turns ON, the transmission gate circuit 459 turns OFF, and the transmission gate circuit 460 turns ON. As a result, the output level of the latch circuit 469 becomes high, the output level of the inverter 479 becomes low, and the nMOS transistor 488 turns OFF.

In addition, the pMOS transistor 482 turns ON, the nMOS transistor 485 turns OFF, the output level of the latch circuit 470 becomes high, the pMOS transistor 484 turns OFF, the nMOS transistor 486 turns ON, and the level at the node 490 becomes low. As a result, the pMOS transistor 481 turns ON, the level at the node 489 becomes high, the pMOS transistor 483 turns OFF, the pMOS transistor 487 turns OFF, and the output state becomes a high impedance (high-Z) state.

In this embodiment, when inputting the read command at the rise timing of the nth clock (pulse) of the system clock signal CLK similarly to the conceivable case described above in conjunction with FIG. 42, the read command is actually input at the rise riming of the nth clock (pulse) of the internal clock signal $INT_{CLK}$ which is obtained by shaping the nth clock (pulse) of the system clock signal CLK.

Accordingly, the data output circuit 427 latches the read data RD and the inverted read data /RD output from the DRAM core 421 in the latch circuits 467 and 468, respectively, in synchronism with the rise timing of the (n+1)th clock (pulse) of the internal clock signal $INT_{CLK}$ which is obtained by shaping the (n+1)th clock (pulse) of the system clock signal CLK, for example.

When the (n+2)th clock (pulse) of the system clock signal CLK rises, for example, the data output circuit 427 starts the operation of outputting to the outside the data DQ which has the same phase as the read data RD, in synchronism with the rise timing of the (n+2)th clock (pulse) of the internal clock signal $INT_{CLK}$ which is obtained by shaping the (n+2)th clock (pulse) of the system clock signal CLK. The data DQ is thus output to the outside with a predetermined time delay.

Therefore, in this embodiment, the data DQ is also output with a delay corresponding to the access time ta from the system clock signal CLK. However, in this embodiment, the clock input circuit 423 is supplied with the constant voltage VII having the voltage value for suppressing the change in the operation speeds of the transistors with respect to the temperature change. For this reason, it is possible to suppress the change in the delay time of the clock input circuit 423 caused by the change in the power supply voltage VCC supplied from the outside and the temperature change.

In addition, in this embodiment, the constant voltage VII is supplied as the power supply voltage to the circuit parts of the data output circuit 427 excluding the level shift circuit 480 and the output transistor circuit which is made up of the output transistors 487 and 488. Hence, it is possible to suppress the change in the delay time of the data output circuit 427 caused by the change in the power supply voltage VCC which is supplied from the outside and the temperature change.

Therefore, according to this embodiment, it is possible to input the correct data at the destination of the data transfer because it is possible to suppress the change in the access time ta from the system clock signal CLK caused by the change in the power supply voltage VCC which is supplied from the outside and the temperature change.

Next, a description will be given of another conceivable SDRAM and the problems thereof, by referring to FIGS. 54 and 55.

Figure 54:
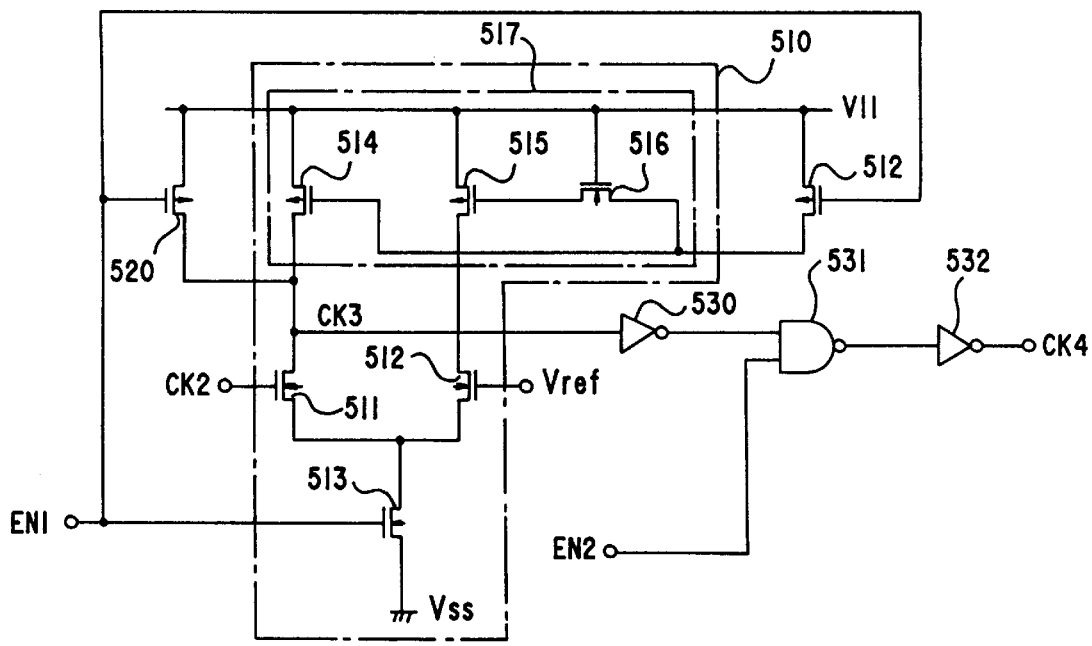
FIG. 54 is a circuit diagram showing a clock input circuit of a conceivable SDRAM.

FIG. 54 shows a clock input circuit of a conceivable SDRAM. The SDRAM includes a differential amplifier circuit 510, pMIS transistors 520 and 521, an inverter 530, a NAND circuit 531 and an inverter 531 which are connected as shown in FIG. 54. The differential amplifier circuit 510 includes nMIS transistors 511, 512 and 513, and a current mirror circuit 517. The current mirror circuit 517 includes pMIS transistors 514 and 515, and an nMIS transistor 516.

In FIG. 54, a clock signal CK2 which is supplied from the outside has an extremely high frequency in the range of 50 MHz to 200 MHz. Hence, the clock signal CK2 has the terminated low voltage transistor-transistor logic (T-LVTTL) level, that is, terminated by a 50Ω resistor. The logic amplitude of the clock signal CK2 is extremely small such that lower limit of the high level is 1.5+0.4 V, and the upper limit of the low level is 1.5−0.4 V. In order to prevent an erroneous operation, the characteristics of the circuit elements are determined so that the high level is detected for an input of 1.5+0.2 V and the low level is detected for an input of 1.5−0.2 V.

On the other hand, in the SDRAM, a voltage between a power supply line Vii and a ground line Vss, such as 3.3 V, is used. In addition, signals having a high level of approximately 3 V and a low level of approximately 0 V are used. Hence, the clock signal CK2 is amplified in the differential amplifier circuit 510.

When an enable signal EN1 has a low level, the nMIS transistor 513 turns OFF and the pMIS transistors 520 and 521 turn ON. Thus, the differential amplifier circuit 510 is put into an inactive state, and drain potentials of the nMIS transistors 511 and 512 become the potential of the power supply line Vii.

When the enable signal EN1 undergoes a transition to a high level, the nMIS transistor 513 turns ON, the pMIS transistors 520 and 521 turn OFF, and the differential amplifier circuit 510 is put into an active state. During this transition, the differential amplifier circuit 510 immediately assumes the active state because the drain potentials of the nMIS transistors 511 and 512 are already the potential Vii.

In this state, when the clock signal CK2 is supplied to the gate of the nMIS transistor 511, a clock signal CK3 is output from the differential amplifier circuit 510. This clock signal CK3 is an inverted and amplified signal of the clock signal CK2.

The clock signal CK3 is supplied to the inverter 530. The NAND circuit 531 obtains a NAND of the output of the inverter 530 and an enable signal EN2, and the inverter 532 inverts the output of the NAND circuit 531 into a clock signal CK4.

Figure 55:
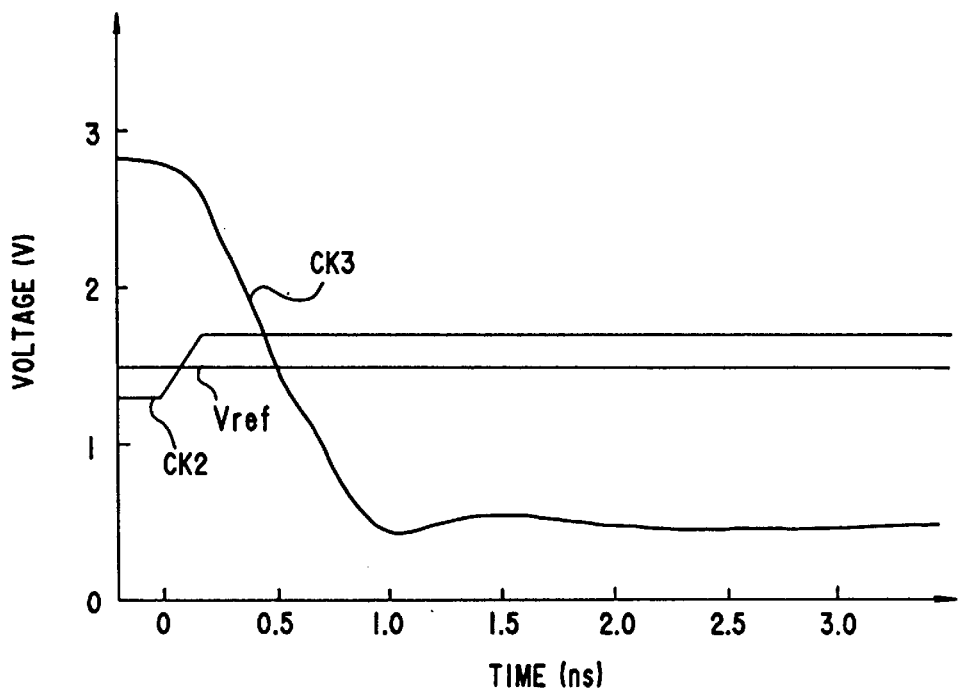
FIG. 55 is a diagram for showing simulation results obtained for the clock input circuit shown in FIG. 54.

FIG. 55 is a diagram showing simulation results obtained for the SDRAM shown in FIG. 54. It may be seen from FIG. 55 that when the clock signal CK2 undergoes a transition from 1.5−0.3 V to 1.5+0.3 V for a reference voltage $V_{ref}$ of 1.5 V, a signal propagation delay time required for the clock signal CK3 to become 1.5 V from the time when the clock signal CK2 becomes 1.5 V is 0.42 ns.

Because of the input capacitance of the inverter 530, the signal propagation delay time of 0.42 ns is relatively long compared to 0.2 ns which is the transition time of the clock signal CK2.

Accordingly, a description will now be given of tenth through twelfth embodiments of the semiconductor device according to the present invention that can reduce the signal propagation delay time by adding a simple circuit to the differential amplifier circuit, by referring to FIGS. 56 through 61.

Figure 56:
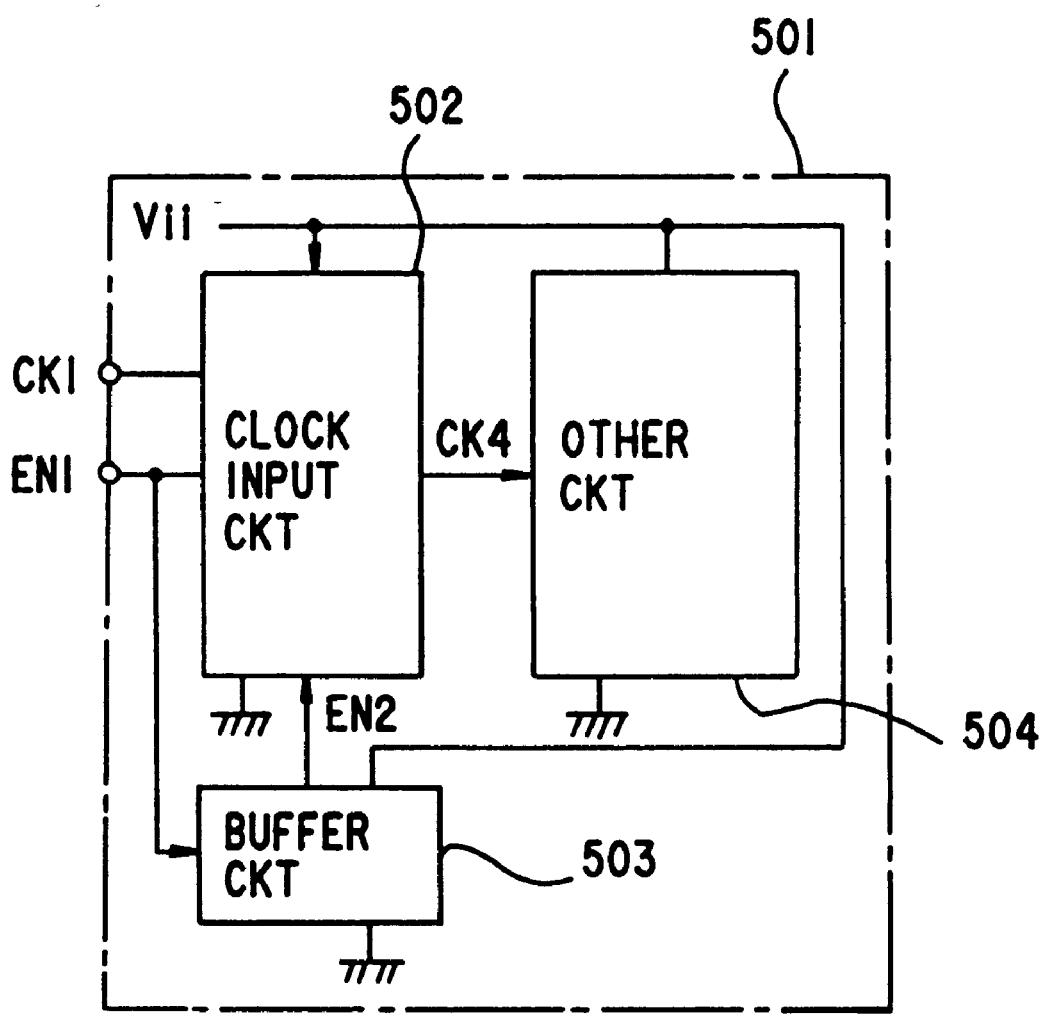
FIG. 56 is a system block diagram showing the construction of a SDRAM.

FIG. 56 shows the construction of a SDRAM to which the present invention is applied in the tenth through twelfth embodiments. A SDRAM 501 shown in FIG. 56 includes a clock input circuit 502, a buffer circuit 503, and other circuits 504 which are connected as shown.

The clock input circuit 502 receives the clock signal CK1 and the enable signal EN1 from the outside. The buffer circuit 503 receives the enable signal EN1. This buffer circuit 503 amplifies the enable signal EN1 and generates the enable signal EN2. The circuits 504 operates in synchronism with a clock signal CK4 output from the clock input circuit 502.

The clock input circuit 502 becomes active when the level of the enable signal EN1 becomes high, and amplifies the clock signal CK1 to generate the clock signal CK4. The clock input circuit 502 supplies the clock signal CK4 to the circuits 504 when the level of the enable signal EN2 becomes high.

As described above, the clock signal CK1 has an extremely high frequency in the range of 50 MHz to 200 MHz, and has the T-LVTTL level described above having the extremely small logic amplitude. In addition, in order to prevent an erroneous operation due to noise, the clock input circuit 502 has a margin of 0.2 V, for example, with respect to the high level and the low level of the input signal. Hence, the transistor characteristics are determined so that the high level is detected for the input signal which is 1.5+0.2 V and the low level is detected for the input signal which is 1.5−0.2 V.

On the other hand, the clock input circuit 502, the buffer circuit 503 and the circuits 504 operate with the voltage of 3.3 V, for example, that is, a voltage between the power supply line Vii and the ground line Vss. In the circuits 504, signal used have a high level of approximately 3 V and a low level of approximately 0 V.

Figure 57:
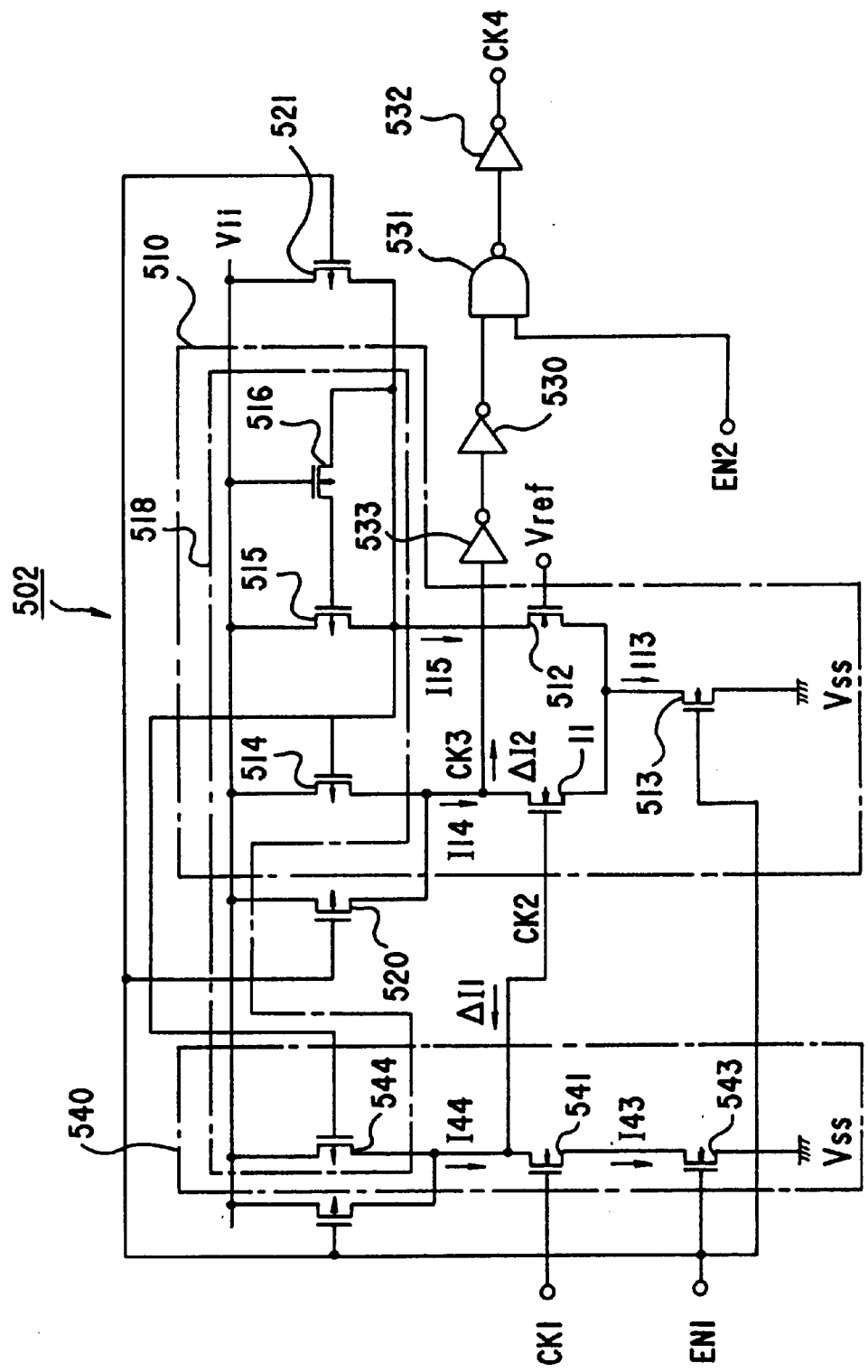
FIG. 57 is a circuit diagram showing a part of a tenth embodiment of the semiconductor device according to the present invention.

FIG. 57 shows the construction of a part of the tenth embodiment. More particularly, FIG. 57 shows the construction of the clock input circuit 502. In FIG. 57, those parts which are the same as those corresponding parts in FIG. 54 are designated by the same reference numerals, and a description thereof will be omitted.

This embodiment is provided with an input stage circuit 540 at a stage prior to the circuit shown in FIG. 54. In addition, an inverter 533 is provided between the differential amplifier circuit 510 and the inverter 530 because the input stage circuit 540 carries out an inversion and amplification.

The input stage circuit 540 includes nMIS transistors 541 and 543, and pMIS transistors 544 and 550 which are connected as shown in FIG. 57.

In the differential amplifier circuit 510, the sources of the nMIS transistors 511 and 512 are connected to the ground line Vss via the nMIS transistor 513. The drains of the nMIS transistors 511 and 512 are respectively connected to the power supply line Vii via the pMIS transistors 514 and 515. The nMIS transistors 511 and 512 have the same characteristic, and the pMIS transistors 514 and 515 have the same characteristic. The gate of the pMIS transistor 514 is connected to the drain of the pMIS transistor 515. The nMIS transistor 516 is connected between the gate and the drain of the pMIS transistor 515. The gate of the nMIS transistor 516 is connected to the power supply line Vii, and functions as a load FET. The pMIS transistors 520 and 521 are respectively connected in parallel to the pMIS transistors 514 and 515.

On the other hand, in the input stage circuit 540, the source of the nMIS transistor 541 is connected to the ground line Vss via the nMIS transistor 543. The drain of the nMIS transistor 541 is connected to the power supply line Vii via the pMIS transistor 544. The pMIS transistor 550 is connected in parallel to the pMIS transistor 544. The gate of the pMIS transistor 544 is connected to the gate of the pMIS transistor 514. The nMIS transistors 541 and 543 and the pMIS transistors 544 and 550 respectively correspond to the nMIS transistors 511 and 513 and the pMIS transistors 514 and 520, and for example, the corresponding constituent elements have the same characteristic.

The pMIS transistors 514 and 515, the nMIS transistor 516 and the pMIS transistor 544 form a current mirror circuit 518. Currents I14, I15 and I44 respectively flowing through the pMIS transistors 514, 515 and 544 are respectively controlled by the drain potential of the pMIS transistor 515 so that they become the same.

The gates of the nMIS transistors 513 and 543 and the pMIS transistors 520, 521 and 550 are connected in common, and are supplied with the enable signal EN1.

The gate and the drain of the nMIS transistor 541 respectively form the input and the output of the input stage circuit 540, and the clock signal CK1 is supplied to the input of the input stage circuit 540. The gate and the drain of the nMIS transistor 411 respectively form the input and the output of the differential amplifier circuit 510. The input of the differential amplifier circuit 510 is connected to the output of the input stage circuit 540, and the clock signal CK2 from the input stage circuit 540 is supplied to the input of the differential amplifier circuit 510. The reference potential Vref having a predetermined voltage is applied to the gate of the nMIS transistor 512 which forms a pair with the nMIS transistor 511.

The output of the differential amplifier circuit 510 is connected to one input of the NAND circuit 531 via the inverters 533 and 530. The enable signal EN2 is supplied to the other input of the NAND circuit 531. The output of the NAND circuit 531 is connected to the input of the inverter 532, and the clock CK4 is output from the inverter 532.

Next, a description will be given of the operation of this embodiment.

When the enable signal EN1 has the low level, the nMIS transistors 513 and 543 turn OFF, the pMIS transistors 520, 521 and 550 turn ON, and the differential amplifier circuit 510 and the input stage circuit 540 are put into an inactive state. In addition, the drain potentials of the nMIS transistors 511, 512 and 541 become Vii.

When the enable signal EN1 undergoes a transition to the high level, the nMIS transistors 513 and 543 turn ON, the pMIS transistors 520, 521 and 550 turn OFF, and the differential amplifier circuit 510 and the input stage circuit 540 are put into an active state. During this transition, the differential amplifier circuit 510 and the input stage circuit 540 immediately become active because the drain potentials of the nMIS transistors 511, 512 and 541 are already Vii.

Next, a description will be given for the case where the enable signal EN1 has the high level.

The potential of the high-level enable signal EN1 is constant, and the nMIS transistors 513 and 543 function as constant current sources. Currents I13 and I43 respectively flowing through the nMIS transistors 513 and 543 are I43=I13/2=constant, for example. In the steady state, $\Delta$I1=$\Delta$I2=0, where $\Delta$I1 denotes a current extracted from the gate of the nMIS transistor 511 and $\Delta$I2 denotes a current injected to the gate of the CMOS forming the inverter 533.

Figure 58:
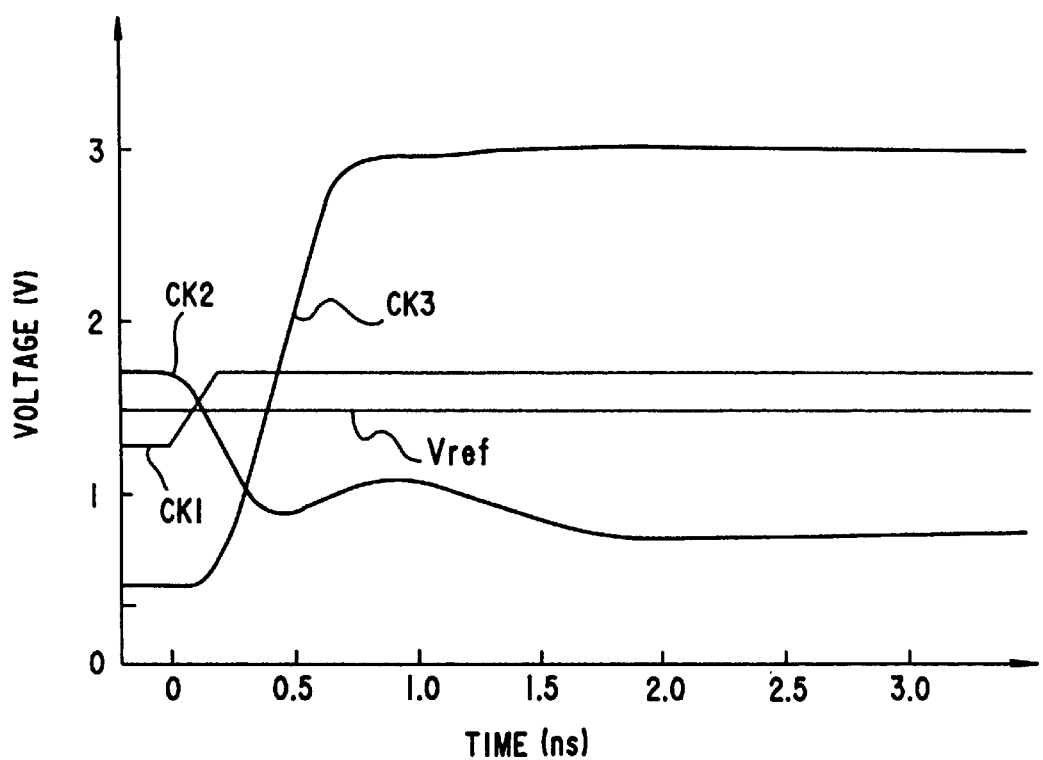
FIG. 58 is a diagram showing simulation results obtained for the tenth embodiment.

FIG. 58 shows simulation results obtained for this embodiment shown in FIG. 57. Initially, it is assumed that t<0 in FIG. 58. In other words, it is assumed that, initially, the level of the clock signal CK1 is low, the level of the clock signal CK2 is high, and the level of the clock signal CK3 is low.

(1) A case where the clock signal CK1 undergoes a transition from the low level to the high level:

In this case, when the clock signal CK1 undergoes the transition to the high level, the drain potential of the nMIS transistor 541, that is, the potential of the clock signal CK2, becomes lower than the reference potential Vref, thereby satisfying $\Delta$I1>0. Hence, I14<I15 is satisfied, and the drain potential of the nMIS transistor 511, that is, the potential of the clock signal CK3, rises ($\Delta$I2>0) and the drain potential of the nMIS transistor 512 falls. Since I44=I14, I44 also decreases due to I14<I15, while $\Delta$I1 increases because I43 is constant. By such a positive feedback, the potential fall of the clock signal CK2 and the potential rise of the clock signal CK3 are accelerated. If the potential of the clock signal CK2 becomes too low, the gate potential of the pMIS transistor 544 falls and I44 increases because of the fall of the drain potential of the nMIS transistor 512, thereby satisfying $\Delta$I1<0.

Accordingly, the clock signals CK2 and CK3 change as shown in FIG. 58 with respect to the clock signal CK1. In order to facilitate the comparison of FIG. 58 and FIG. 55, the circuit characteristics of the constituent elements in FIG. 57 are made the same as those in FIG. 54, and in addition, the circuit characteristic of the inverter 533 is made the same as that of the inverter 530. In this case, Vii is 3.3 V, Vss is 0 V, and Vref is 1.5 V.

The time it takes for the clock signal CK3 to start rising from the low level after the clock signal CK1 starts rising from the low level in FIG. 58 is slightly longer than that in FIG. 55. However, the signal propagation delay time from the time when the clock signal CK1 becomes 1.5 V to the time when the clock signal CK3 becomes 1.5 V is 0.3 ns in FIG. 58, which is only 58% of the propagation delay time of 0.52 ns in FIG. 55. In addition, the slope of the clock signal CK3 in FIG. 58 is steeper than that in FIG. 55.

Therefore, according to this tenth embodiment, it is possible to reduce the signal propagation delay time to 58% of the signal propagation delay time required in the conceivable circuit shown in FIG. 54, by merely adding 4 FETs to the conceivable circuit shown in FIG. 54.

(2) A case where the clock signal CK1 undergoes a transition from the high level to the low level:

When the clock signal CK1 makes the transition to the low level, the drain potential of the nMIS transistor 541, that is, the potential of the clock signal CK2, rises, thereby satisfying ΔI1<0. Hence, I14>I15 is satisfied, and the drain potential of the nMIS transistor 511, that is, the potential of the clock signal CK3, falls (ΔI2<0) and the drain potential of the nMIS transistor 512 rises. Since I44=I14, I44 increases due to I14>I15, and −ΔI1 increases because I43 is constant. By such a positive feedback, the potential rise of the clock signal CK2 and the potential fall of the clock signal CK3 are accelerated. If the potential of the clock CK2 becomes too high, the gate potential of the pMIS transistor 544 rises and I44 decreases, thereby satisfying ΔI1>0.

Accordingly, the signal propagation delay time is reduced similarly to the case (1) described above also when the clock signal CK1 undergoes the transition from the high level to the low level.

Of course, the inverters 533 and 530 may be omitted.

Figure 59:
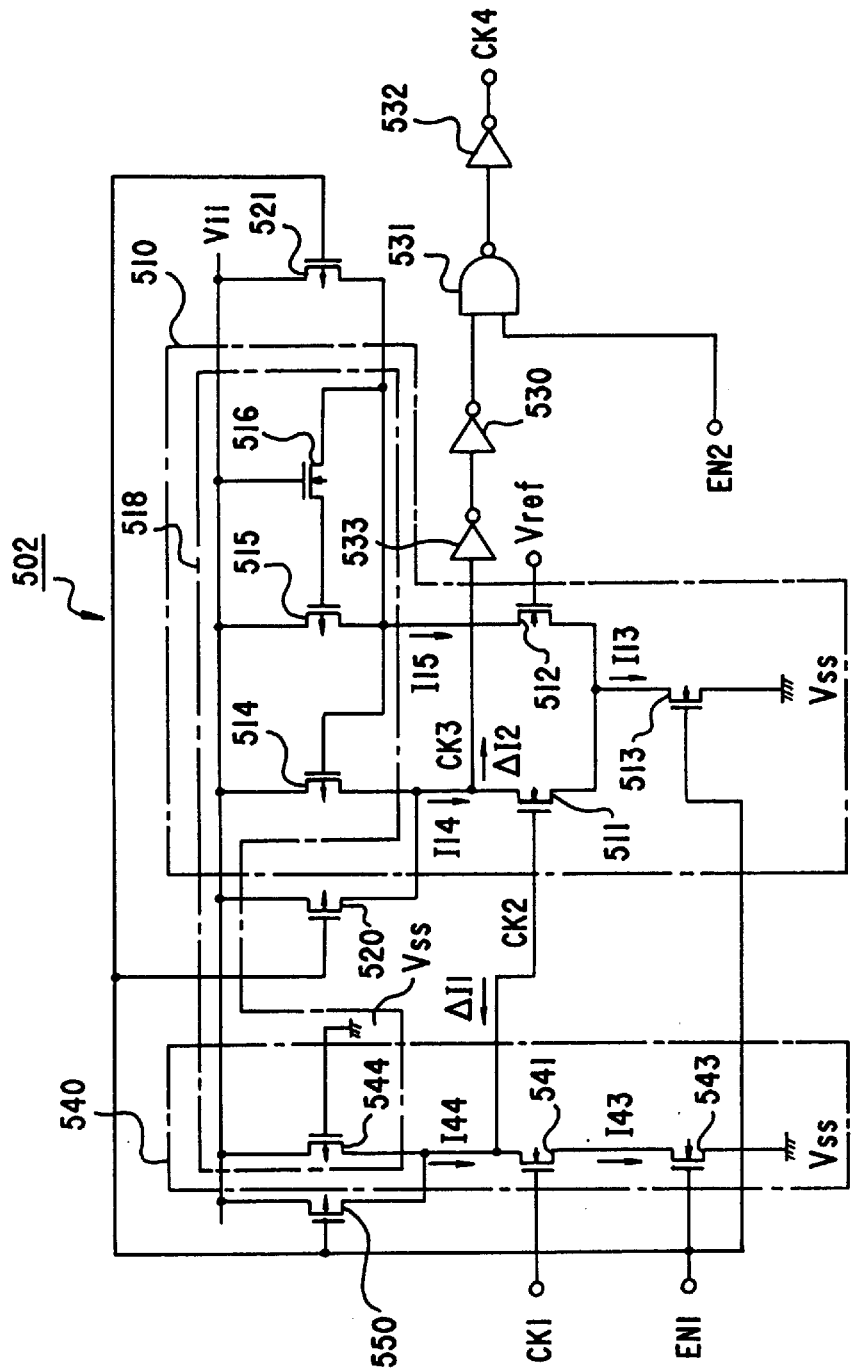
FIG. 59 is a circuit diagram showing a part of an eleventh embodiment of the semiconductor device according to the present invention.

FIG. 59 shows the construction of a part of the eleventh embodiment. In FIG. 59, those parts which are the same as those corresponding parts in FIG. 57 are designated by the same reference numerals, and a description thereof will be omitted.

In this embodiment, the gate of the pMIS transistor 544 is not connected to the gate of the pMIS transistor 514. Instead, the gate of the pMIS transistor 544 is grounded. The pMIS transistor 544 functions as a load FET. In this case, it was also confirmed from simulation results that the signal propagation delay time is reduced by the amplifying function of the input stage circuit 540 when compared to the conceivable circuit shown in FIG. 54.

Figure 60:
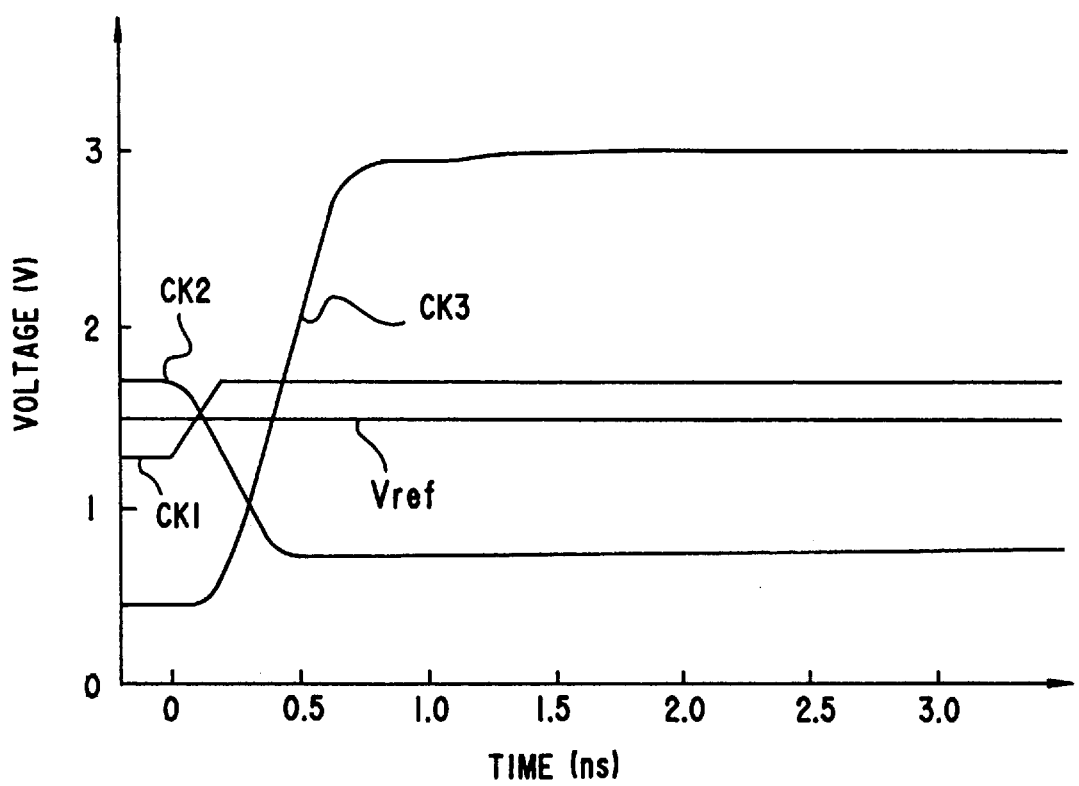
FIG. 60 is a diagram showing simulation results obtained for the twelfth embodiment.

FIG. 60 shows simulation results obtained for this embodiment shown in FIG. 59. Compared to FIG. 58, it may be seen from FIG. 60 that the instability of the clock signal CK2 immediately after the fall is eliminated by this eleventh embodiment.

In addition, the resistance of the pMIS transistor 544 is small compared to that of the tenth embodiment, because the gate of the pMIS transistor 544 is grounded. For this reason, it is possible to reduce the size of the pMIS transistor 544.

As a modification of this eleventh embodiment, it is also possible to connect the gate of the pMIS transistor 544 to the drain of the pMIS transistor 544. The effects obtained by this modification is basically the same as that obtainable in the eleventh embodiment.

Figure 61:
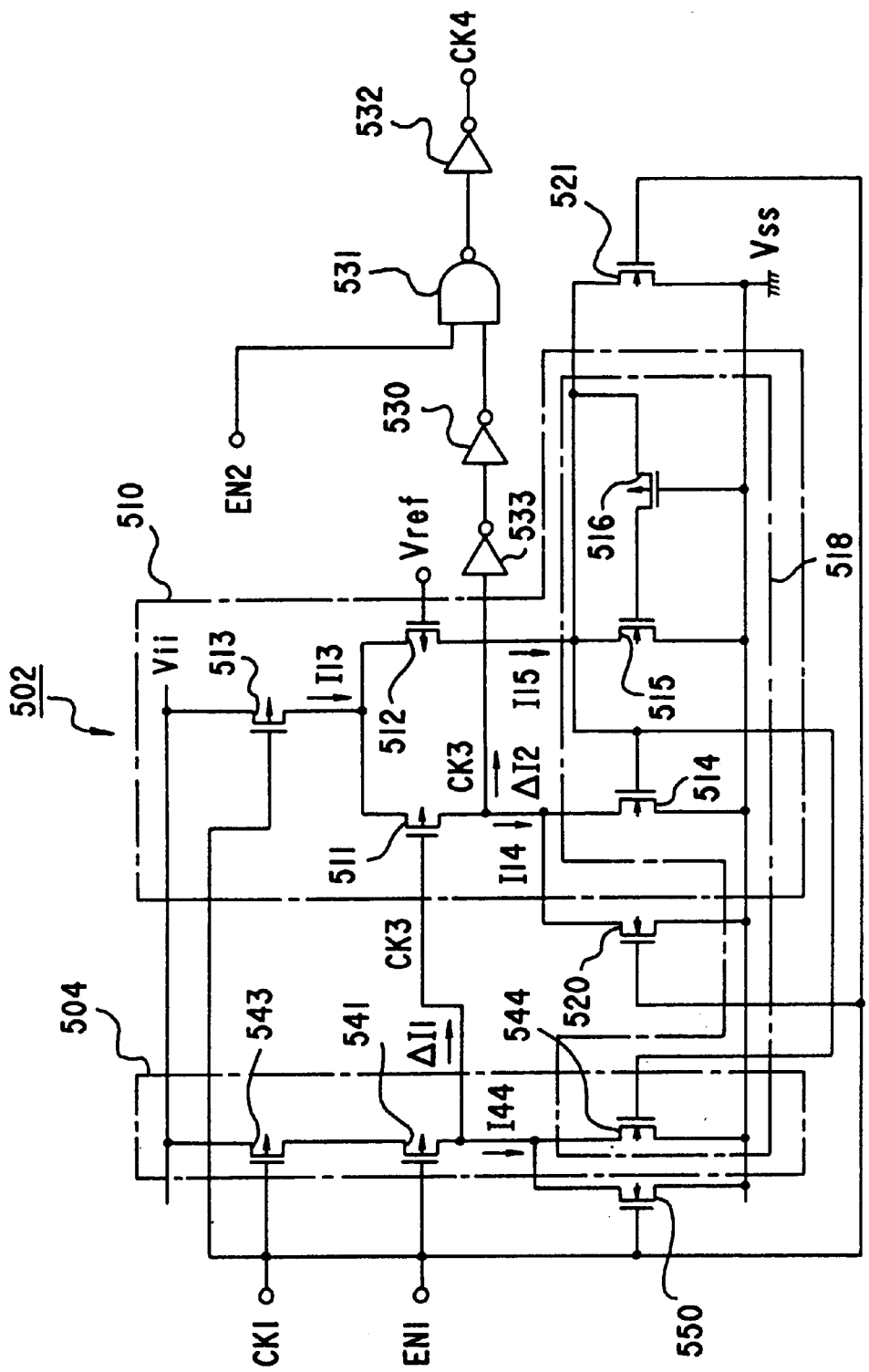
FIG. 61 is a circuit diagram showing a part of a twelfth embodiment of the semiconductor device according to the present invention.

FIG. 51 shows a part of the twelfth embodiment. In FIG. 61, those parts which are the same as those corresponding parts in FIG. 57 are designated by the same reference numerals, and a description thereof will be omitted.

In this embodiment, the nMIS transistors and pMIS transistors within the differential amplifier circuit 410 and the input stage circuit 540 shown in FIG. 57 are interchanged as shown in FIG. 61. In addition, the power supply line Vii and the ground line Vss shown in FIG. 57 are interchanged as shown in FIG. 61. The operation of this embodiment is basically the same as that of the tenth embodiment shown in FIG. 57, and a description thereof will be omitted.

As a modification of this twelfth embodiment, it is also possible to connect the gate of the nMIS transistor 544 to the drain of the nMIS transistor 544 or to the power supply line Vii, instead of connecting the gate of the nMIS transistor 544 to the gate of he nMIS transistor 514. In this case, the nMIS transistor 544 functions as a load FET. When the gate of the nMIS transistor 544 is connected to the power supply line Vii, the resistance of the nMIS transistor 544 is reduced, and it is possible to reduce the size of the nMIS transistor 544.

In the tenth through twelfth embodiments, it is possible to omit the nMIS or pMIS transistor 516 of the current mirror circuit 510 and short-circuit this part instead. In addition, it is possible to use current mirror circuits having other known circuit constructions. Moreover, the transistors may be any type of FET, including MES transistors.

Further, the present invention is not limited to these embodiments, but various variations and modifications may be made without departing from the scope of the present invention.

What is claimed is:

1. A synchronous semiconductor memory device which inputs an address signal and control signals in synchronism with a clock signal, said synchronous semiconductor memory device comprising:

a plurality of input circuits respectively having a differential amplifier circuit so that differential amplifier circuits of said input circuits are respectively provided with respect to the control signals other than a chip select and to each of bits of the address signal, each of said differential amplifier circuits being controlled to one of active and inactive states in response to an activation signal; and an activation circuits coupled to said input circuits, outputting to said differential amplifier circuits the activation signal that undergoes a level change depending on a level change of said chip select signal and makes a transition to an active level when said chip select signal undergoes a transition to an active level.

2. The synchronous semiconductor memory device as claimed in claim 1, wherein said activation circuit comprises an inverter circuit inverting a signal output from one of said input circuits provided with respect to said chip select signal.

3. A synchronous semiconductor memory device which inputs an address signal and control signals in synchronism with a clock signal, said synchronous semiconductor memory device comprising:

a plurality of input circuits respectively having a differential amplifier circuit so that differential amplifier circuits of said input circuits are respectively provided with respect to the control signals other than a chip select and to each of bits of the address signal, each of said differential amplifier circuits being controlled to one of active and inactive states in response to an activation signal; and an activation circuit, coupled to said input circuits, outputting to said differential amplifier circuits the activation signal that undergoes a level change depending on a level change of said chip select signal and makes a transition to an active level when said chip select signal undergoes a transition to an active level or, outputting to said differential amplifier circuits the activation signal that has the active level.

4. The synchronous semiconductor memory device as claimed in claim 3, wherein said activation circuit comprises:

an inverter circuit inverting a signal output from one of said input circuits provided with respect to said chip select signal;

a storage circuit having an output level thereof fixed to one of high and low levels in response to a predetermined command; and a logic circuit obtaining a logical sum of outputs of said inverter circuit and said storage circuit, and outputting said activation signal.

5. The synchronous semiconductor memory device as claimed in claim 3, wherein said activation circuit comprises:

an inverter circuit inverting a signal output from one of said input circuits provided with respect to said chip select signal;

a storage circuit having an output level thereof fixed to one of high and low levels; and a logic circuit obtaining a logical sum of outputs of said inverter circuit and said storage circuit, and outputting said activation signal.

6. A synchronous semiconductor memory device which inputs an address signal and control signals in synchronism with a clock signal, said synchronous semiconductor memory device comprising:

a plurality of input circuits respectively having a differential amplifier circuit so that differential amplifier circuits of said input circuits are respectively provided with respect to the control signals other than a chip select and to each of bits of the address signal, each of said differential amplifier circuits being controlled to one of active and inactive states in response to an activation signal; and an activation circuit, coupled to said input circuits, outputting to said differential amplifier circuits the activation signal that undergoes a level change depending on a level change of said chip select signal and makes a transition to an active level when said chip select signal undergoes a transition to an active level until an active command instructing activation of a memory cell region is input, said activation signal outputting to said differential amplifier circuits the activation signal having the active level until a precharge command instructing precharge of the memory region is input after said active command is input.

7. The synchronous semiconductor memory device as claimed in claim 6, wherein said activation circuit comprises:

an inverter circuit inverting a signal output from one of said input circuits provided with respect to said chip select signal;

a storage circuit outputting a high-level signal until said precharge command is input after said active command is input and outputting a low-level signal until said active command is input after said precharge command is input; and a logic circuit obtaining a logical sum of outputs of said inverter circuit and said storage circuit, and outputting said activation signal.

8. The synchronous semiconductor memory device as claimed in claim 6, wherein said activation circuit outputs the activation signal that makes a level change depending on a level change of said chip select signal when an operation of the synchronous semiconductor memory automatically changes to a precharge operation, and changes to the active level when said chip select signal changes to the active level.

9. The synchronous semiconductor memory device as claimed in claim 8, wherein said activation circuit comprises:

an inverter circuit inverting a signal output from one of said input circuits provided with respect to said chip select signal;

a storage circuit outputting a high-level signal until said precharge command is input or until the operation of the synchronous semiconductor memory device automatically changes to the precharge operation after said active command is input, and outputting a low-level signal until said active command is input after said precharge command is input or after the operation automatically changes to the precharge operation; and a logic circuit obtaining a logical sum of outputs of said inverter circuit and said storage circuit, and outputting said activation signal.

* * * * *

UNITED STATES PATENT AND TRADEMARK OFFICE
CERTIFICATE OF CORRECTION

PATENT NO.: 6,009,039
DATED : December 28, 1999
INVENTOR(S): TAKEMAE

It is certified that error appears in the above-identified patent and that said Letters Patent is hereby corrected as shown below:

On the cover page:

Item [75], change "Yoshihiro Takemae; Masao Taguchi; Yukinori Kodama; Makoto Yanagisawa; Takaaki Suzuki; Junji Ogawa; Atsushi Hatakeyama; Hirohiko Mochizuki; Hideaki Kawai, all of Kawasaki, Japan" to --Yoshihiro Takemae, of Kawasaki-shi, Japan --.

Item [73], change "Kawasaki, Japan" to --Kawasaki-shi, Japan --.

Signed and Sealed this

Third Day of April, 2001

*Attest:*

NICHOLAS P. GODICI

*Attesting Officer*  *Acting Director of the United States Patent and Trademark Office*